US008173276B2

(12) United States Patent  
Heun et al.

(10) Patent No.: US 8,173,276 B2  
(45) Date of Patent: May 8, 2012

(54) MATERIALS FOR ELECTROLUMINESCENCE AND THE UTILIZATION THEREOF

(75) Inventors: Susanne Heun, Bad Soden (DE); René Scheurich, Groβ-Zimmern (DE); Arne Büsing, Frankfurt (DE); Aurelie Falcou, Frankfurt (DE); Anja Gerhard, Veitschöchheim (DE); Philipp Stössel, Frankfurt (DE); Horst Vestweber, Gilserberg (DE)

(73) Assignee: Merck Patent GmbH (DE)

( * ) Notice: Subject to any disclaimer, the term of this patent is extended or adjusted under 35 U.S.C. 154(b) by 31 days.

(21) Appl. No.: 12/639,591

(22) Filed: Dec. 16, 2009

(65) Prior Publication Data

US 2010/0102305 A1 Apr. 29, 2010

Related U.S. Application Data

(62) Division of application No. 10/576,920, filed as application No. PCT/EP2004/011888 on Oct. 21, 2004, now Pat. No. 7,659,540.

(30) Foreign Application Priority Data

Oct. 22, 2003 (DE) .................................. 103 49 033  
Jan. 20, 2004 (DE) .......................... 10 2004 003 008

(51) Int. Cl.  
*B32B 9/00* (2006.01)  
*B32B 19/00* (2006.01)

(52) U.S. Cl. .................. 428/690; 257/40; 257/E51.001

(58) Field of Classification Search .................... 257/40, 257/E51.001; 428/690  
See application file for complete search history.

(56) References Cited

U.S. PATENT DOCUMENTS

| | | | |
|---|---|---|---|
| 3,022,908 | A | 2/1962 | Arnold |
| 3,224,208 | A | 12/1965 | Schlumberger et al. |
| 6,956,095 | B2 | 10/2005 | Treacher et al. |
| 2002/0028347 | A1 | 3/2002 | Marrocco, III et al. |
| 2003/0022908 | A1 | 1/2003 | Guthner et al. |
| 2003/0224208 | A1 | 12/2003 | Kamatani et al. |
| 2004/0133004 | A1 | 7/2004 | Stossel et al. |
| 2004/0135131 | A1 | 7/2004 | Treacher et al. |
| 2004/0138455 | A1 | 7/2004 | Stossel et al. |
| 2005/0038223 | A1 | 2/2005 | Becker et al. |
| 2006/0058494 | A1 | 3/2006 | Busing et al. |
| 2006/0058524 | A1 | 3/2006 | Falcou et al. |
| 2006/0065890 | A1 | 3/2006 | Stossel et al. |

FOREIGN PATENT DOCUMENTS

| | | |
|---|---|---|
| DE | 103 17 556 | 11/2004 |
| DE | 103 28 627 | 2/2005 |
| DE | 103 30 761 | 2/2005 |
| DE | 103 37 346 | 3/2005 |
| DE | 103 43 606 | 4/2005 |
| DE | 103 50 606 | 6/2005 |
| EP | 1 239 526 | 9/2002 |
| JP | 2002/260863 A | 9/2002 |
| JP | 2003-317965 A | 11/2003 |
| JP | 2004-051962 A | 2/2004 |
| JP | 2004/168999 A | 6/2004 |
| JP | 2004/253298 A | 9/2004 |
| WO | WO-90/13148 | 11/1990 |
| WO | WO-99/21935 | 5/1999 |
| WO | WO-01/59030 | 8/2001 |
| WO | WO-01/96454 A1 | 12/2001 |
| WO | WO-02/066552 | 8/2002 |
| WO | WO-02/068435 | 9/2002 |
| WO | WO-02/072661 A1 | 9/2002 |
| WO | WO-02/077060 | 10/2002 |
| WO | WO-02/077060 A1 | 10/2002 |
| WO | WO-02/081488 | 10/2002 |
| WO | WO-03/020790 | 3/2003 |
| WO | WO-03/020790 A2 | 3/2003 |
| WO | WO-03/048224 | 6/2003 |
| WO | WO-03/048225 | 6/2003 |
| WO | WO-03/080687 A1 | 10/2003 |
| WO | WO-03/099901 | 12/2003 |
| WO | WO-2004/022626 | 3/2004 |
| WO | WO-2004/026886 | 4/2004 |
| WO | WO-2004/037887 | 5/2004 |
| WO | WO-2004/070772 | 8/2004 |

OTHER PUBLICATIONS

Cleave et al., "Harvesting singlet and triplet energy in polymer LEDs" Adv. Mater., vol. 11, No. 4, 1999, pp. 285-288.  
Translation of Japanese Office Action dated May 10, 2011 in corresponding foreign application.

*Primary Examiner* — Anthony Ho  
(74) *Attorney, Agent, or Firm* — Connolly Bove Lodge & Hutz LLP

(57) ABSTRACT

The present invention relates to organic semiconductors which contain structural units L=X and in addition structural units which emit light from the triplet state. The materials according to the invention are more soluble and easier to synthesise and are therefore more suitable for use in organic light-emitting diodes than comparative materials in accordance with the prior art.

27 Claims, No Drawings

MATERIALS FOR ELECTROLUMINESCENCE AND THE UTILIZATION THEREOF

CROSS REFERENCE TO RELATED PATENT APPLICATION

This application is a divisional of U.S. patent application Ser. No. 10/576,920, filed Sep. 14, 2006, which is incorporated by reference in its entirety. U.S. patent application Ser. No. 10/576,920 is a national stage application (under 35 U.S.C. §371) of PCT/EP2004/011888, filed Oct. 21, 2004 and claims the right of priority under 35 U.S.C. §119 (a)-(d) German Patent Application No. DE 10 2004 003 008.1, filed Jan. 20, 2004; and German Patent Application No. DE 103 49 033.7, filed Oct. 22, 2003.

The present invention describes novel materials and material mixtures for use in organic electronic components and the use thereof in displays based thereon.

For about 12 years, broadly based research has been under way on the commercialisation of display and illumination elements based on polymeric (organic) light-emitting diodes (PLEDs). This development was initiated by the fundamental developments disclosed in WO 90/13148. A first product in the form of a relatively small display (in a shaver from PHILIPS N.V.) has recently also been available on the market. However, significant improvements are still necessary in order to make these displays a real competitor for the liquid-crystal displays (LCDs) which currently dominate the market or to surpass them.

A development which emerged a few years ago, especially in the area of "small molecule" displays, is the use of materials which are able to emit light from the triplet state and thus exhibit phosphorescence instead of fluorescence (M. A. Baldo et al., *Appl. Phys. Lett.* 1999. 75, 4-6). Theoretical considerations mean that an up to four-fold increase in energy and power efficiency is possible using triplet emitters of this type. However, whether this development will succeed is highly dependent on whether it is possible to find corresponding device compositions which are also able to implement these advantages in OLEDs. Essential conditions for practical applicability which may be mentioned here are, in particular, efficient energy transfer to the triplet emitter (and consequently efficient light emission), a long operating lifetime and a low use and operating voltage. In order to achieve this, the properties of the matrix material are also of crucial importance in addition to the properties of the triplet emitter. While carbazole compounds in particular were considered for this purpose for a long time and showed initial good results, excellent results both with respect to the efficiency and also to the lifetime of the devices have recently been achieved with novel matrix materials based on keto and imine compounds (unpublished application DE 10317556.3) or on phosphine oxides, sulfones and sulfoxides (unpublished application DE 10330761.3).

Efforts have increasingly been made recently to utilise the above-mentioned advantages of vapour-depositable triplet emitters for polymer applications too. Thus, so-called hybrid device structures are being considered which combine the advantages of small molecule OLEDs with those of polymer OLEDs (=PLEDs) and are formed by mixing the triplet emitter into the polymer. On the other hand, the triplet emitter can also be covalently bonded to the polymer. Both methods have the advantage that the compounds can be processed from solution and that an expensive and complex vapour-deposition process as is necessary for devices based on low-molecular-weight compounds is not necessary. Application from solution (for example with the aid of high-resolution printing processes) will have significant advantages in the long term over the vacuum evaporation process which is common today, in particular with respect to scalability, structurability, coating efficiency and economy. Here too, a suitable matrix material is necessary which enables efficient energy transfer to the triplet emitter and which, in combination therewith, has good lives with low operating voltages.

WO 04/070772 describes blends and copolymers of triplet emitters with certain carbazole-containing conjugated polymers which result in efficient emission and reduced operating voltage. A further improvement has been achieved by the introduction of certain bridged carbazole units, as described in the unpublished application DE 10328627.6.

In spite of the advances cited in the above-mentioned publications and applications, however, there is still considerable potential for improvement of corresponding materials in the area of triplet emitters which can be processed from solution. A significant need for improvement is furthermore regarded as being, inter alia, in the following fields:

(1) The efficiency of the electroluminescent elements must be significantly increased further compared with the prior art in order to bring them to the level of the devices obtained by vapour deposition.

(2) The lifetime of the electroluminescent elements should be significantly increased compared with the prior art.

(3) The solubility of the polymers and blends containing the bridged carbazole units described above, which represent the closest prior art, is still unsatisfactory. Thus, it is not possible, for example, to copolymerise a high proportion of the bridged carbazole units described therein, since this results in insoluble polymers. However, soluble polymers are necessary for application.

(4) Although the carbazole units described above already exhibit quite good results in the application, a further disadvantage of these units, apart from the restricted solubility, is, however, the in some cases very complex chemical access to these compounds. It would be desirable here to have available compounds and monomers whose device properties are comparable or better, but which are easier to synthesis.

(5) The polymers and mixtures in accordance with the prior art exhibit high oxygen sensitivity. Thus, they can only be processed with careful exclusion of oxygen. Less sensitive substances would clearly be of advantage here.

It is thus clear that there continues to be a great demand for improvement here.

Surprisingly, it has been found that polymers and mixtures which contain certain structural units give, in combination with triplet emitters, significant improvements here compared with mixtures or polymers in accordance with the prior art. These polymers and mixtures are readily accessible chemically by standard reactions or are in some cases even commercially available and generally result in readily soluble polymers. In addition, they exhibit relatively low oxygen sensitivity, which significantly simplifies their preparation and processing. They are therefore a subject-matter of the present application.

WO 03/099901 contains a chance disclosure of a copolymer which is per se in accordance with the invention, comprising a polymer skeleton containing ester groups (or alternatively carbonyl, sulfone, sulfoxide or phosphine oxide groups) and copolymerised iridium and platinum complexes. The combination of polymer skeletons of this type with triplet emitters are accordingly excluded from the invention.

U.S. Ser. No. 03/022,908 and U.S. Ser. No. 03/224,208 contain chance disclosures of a blend, which is per se in accordance with the invention, of a polymer containing covalently bonded triplet emitters and a charge-transport polymer, where two of the charge-transport polymers mentioned (based on triarylamines) additionally carry keto or sulfone groups. Particular advantages of this combination are not mentioned. These blends are excluded from the invention.

The invention relates to organic semiconductors comprising (A) at least one polymer,
(B) at least one structural unit L=X, where the following applies to the symbols used:

L is on each occurrence, identically or differently, $(R^1)(R^2)C$, $(R^1)P$, $(R^1)As$, $(R^1)Sb$, $(R^1)Bi$, $(R^1)(R^2)(R^3)P$, $(R^1)(R^2)(R^3)As$, $(R^1)(R^2)(R^3)Sb$, $(R^1)(R^2)(R^3)Bi$, $(R^1)(R^2)S$, $(R^1)(R^2)Se$, $(R^1)(R^2)Te$, $(R^1)(R^2)S(=O)$, $(R^1)(R^2)Se(=O)$ or $(R^1)(R^2)Te(=O)$;

X is on each occurrence, identically or differently, O, S, Se or N—$R^4$, with the proviso that X is not S or Se if L stands for S, Se or Te;

$R^1$, $R^2$, $R^3$ is on each occurrence, identically or differently, H, F, CN, $N(R^4)_2$, a straight-chain, branched or cyclic alkyl, alkoxy or thioalkoxy group having 1 to 40 C atoms, which may be substituted by $R^5$ or may also be unsubstituted, where one or more non-adjacent $CH_2$ groups may be replaced by —$R^6C=CR^6$—, —C≡C—, $Si(R^6)_2$, $Ge(R^6)_2$, $Sn(R^6)_2$, C=O, C=S, C=Se, C=$NR^6$, —O—, —S—, —$NR^6$— or —$CONR^6$— and where one or more H atoms may be replaced by F, Cl, Br, I, CN or $NO_2$, or an aromatic or heteroaromatic ring system having 1 to 40 C atoms, which may be substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6C=CR^6$, —C≡C—, $Si(R^6)_2$, $Ge(R^6)_2$, $Sn(R^6)_2$, —$NR^6$—, —O—, —S—, —CO—O—, —O—CO—O—, where, in addition, one or more H atoms may be replaced by fluorine, an aryl, heteroaryl or aryloxy group having 1 to 40 C atoms, which may also be substituted by one or more radicals $R^6$, or OH or $N(R^5)_2$;

$R^5$ is on each occurrence, identically or differently, $R^4$ or CN, $B(R^6)_2$ or $Si(R^6)_3$, $R^6$ is on each occurrence, identically or differently, H or an aliphatic or aromatic hydrocarbon radical having 1 to 20 C atoms; and (C) at least one triplet emitter;

with the proviso that mixtures of two polymers in which the first polymer contains covalently bonded triplet emitters and the other is a copolymer comprising tetraphenyldiaminobiphenyl units and diphenyl sulfone ether or diphenyl ketone ether units are excluded; and furthermore with the proviso that polymers containing on the one hand covalently bonded triplet emitters and on the other hand units of the formula (a) are excluded from the invention:

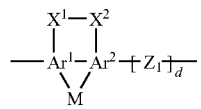

formula (a)

in which $Ar^1$ and $Ar^2$ each independently denote a tetravalent aromatic hydrocarbon group or a tetravalent heterocyclic group;

one of the units $X^1$ and $X^2$ denotes C(=O) or $C(R^1)(R^2)$ and the other denotes O, S, C(=O), S(=O), $SO_2$, $Si(R^3)(R^4)$, $N(R^5)$, $B(R^6)$, $P(R^7)$ or $P(=O)(R^8)$; where the radicals $R^1$, $R^2$, $R^3$, $R^4$, $R^5$, $R^7$, and $R^8$ in the formula (a) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an acyloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group, M denotes a group which is represented by formula (b), formula (c) or formula (d)

$$—Y^1—Y^2—\quad\text{formula (b)}$$

in which $Y^1$ and $Y^2$ each independently denote O, S, C(=O), S(=O), $SO_2$, $C(R^9)(R^{10})$, $Si(R^{11})(R^{12})$, $N(R^{13})$, $B(R^{14})$, $P(R^{15})$ or $P(=O)(R^{16})$, where the radicals $R^9$, $R^{10}$, $R^{11}$, $R^{12}$, $R^{13}$, $R^{14}$, $R^{15}$ and $R^{16}$ in the formula (b) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an acyloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group, where $Y^1$ and $Y^2$ are not identical if $Y^1$ is not $C(R^9)(R^{10})$ or $Si(R^{11})(R^{12})$.]

$$—Y^3=Y^4—\quad\text{formula (c)}$$

in which $Y^3$ and $Y^4$ each independently denote N, B, P, $C(R^{17})$ or $Si(R^{18})$; the radicals $R^{17}$ and $R^{18}$ in the formula (c) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an acyloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group;

$$—Y^5—\quad\text{formula (d)}$$

in which $Y^5$ denotes O, S, C(=O), S(=O), $SO_2$, $C(R^{19})(R^{20})$, $Si(R^{21})(R^{22})$, $N(R^{23})$, $B(R^{24})$, $P(R^{25})$ or $P(=O)(R^{26})$;

where the radicals $R^{19}$, $R^{20}$, $R^{21}$, $R^{22}$, $R^{23}$, $R^{24}$, $R^{25}$ and $R^{26}$ in the formula (d) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an acyloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group;

$Z_1$ denotes —$CR^{36}=CR^{37}$— or —C≡C—; $R^{36}$ and $R^{37}$ each independently denote a hydrogen atom, an alkyl group, an aryl group, a monovalent heterocyclic group or a cyano group; d denotes 0 or 1.

The symbol "═" used above and below stands for a double bond in the sense of the Lewis notation.

Preferred structural units L═X, as described above, are thus selected from the formulae (1) to (5)

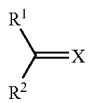

formula (1)

formula (2)

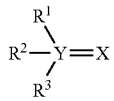

formula (3)

formula (4)

formula (5)

where the symbols used have the following meaning:

X is on each occurrence, identically or differently, O, S, Se or N—$R^4$, with the proviso that X cannot be S or Se for formulae (4) and (5);

Y is on each occurrence, identically or differently, P, As, Sb or Bi;

Z is on each occurrence, identically or differently, S, Se or Te;

$R^1$ to $R^6$ have the same meaning as described above.

The organic semiconductors according to the invention are preferably in the form of amorphous compounds or amorphous mixtures.

For the purposes of this invention, an aromatic or heteroaromatic ring system is taken to mean a system which does not necessarily contain only aromatic or heteroaromatic groups, but in which a plurality of aromatic or heteroaromatic groups may also be interrupted by a short, non-aromatic unit (<10% of the atoms other than H, preferably <5% of the atoms other than H), such as, for example, an $sp^3$-hybridised C, N or O atom. Thus, for example, systems such as 9,9'-spirobifluorene, 9,9-diarylfluorene, triarylamine, etc., should thus also be taken to mean aromatic ring systems for the purposes of this application.

For the purposes of this application, organic semiconductors are low-molecular-weight, oligomeric, dendritic or polymeric, organic or organometallic compounds which, as solid or as layer, have semiconducting properties, i.e. in which the energy gap between conduction and valence band is between 1.0 and 3.5 eV. The term organic semiconductor is applied here either to a pure component or a mixture of two or more components, at least one of which must have semiconducting properties. In the case of the use of mixtures, however, it is not necessary for each of the components to have semiconducting properties. For example, electronically inert compounds, such as, for example, polystyrene, can also be used together with semiconducting compounds.

In a preferred embodiment of the invention, the organic semiconductor is in the form of a mixture. In a further preferred embodiment of the invention, the organic semiconductor is in the form of a copolymer.

For the purposes of the invention, a triplet emitter is taken to mean a compound which emits light from the triplet state, i.e. exhibits phosphorescence instead of fluorescence in the electroluminescence, preferably an organometallic triplet emitter. This compound may in principle be of low molecular weight, oligomeric, dendritic or polymeric. Without wishing to be tied to a specific theory, all emitting compounds which contain the elements Ru, Os, Rh, Ir, Pd, Pt are referred to as triplet emitters for the purposes of this application.

In the case of the organic semiconductors according to the invention, there are various embodiments in which the units L═X or units of the formula (1) to (5) and/or the triplet emitter are either mixed into or covalently bonded to the polymer.

One embodiment of the invention relates to mixtures BLEND1 comprising (A) 5-99.9% by weight of at least one polymer POLY1; POLY1 comprises 1-100 mol %, preferably 5-80 mol %, particularly preferably 10-50 mol %, of one or more recurring units MONO1, where MONO1 contains at least one structural unit L═X or a structural unit of the formula (1) to (5), and in addition (B) 0.1-95% by weight, preferably 0.5-80% by weight, particularly preferably 1-50% by weight, in particular 2-25% by weight, of one or more triplet emitters (TRIP1).

Although evident from the description, it should expressly be pointed out here that the recurring unit MONO1 which contains structural units L═X or the structural units of the formula (1) to (5) may also contain more than one such unit.

In the embodiment BLEND1, the triplet emitter (TRIP1) is non-covalently mixed with the polymer POLY1. The recurring units MONO1 containing structural elements L═X or units of the formula (1) to (5) are covalently bonded to the polymer. The bonding here can in principle take place in any desired position, i.e. these units can be incorporated into formula (1) to (5) via one or more positions at $R^1$ to $R^3$ or optionally via $R^4$, $R^5$ and/or $R^6$. Depending on the linking, these structural units are then incorporated into the main or side chain of the polymer.

A further embodiment of the invention relates to mixtures BLEND2 comprising (A) 0.5-99% by weight of at least one polymer POLY2; POLY2 comprises 0.5-100 mol % of one or more triplet emitters (TRIP2) covalently bonded, and in addition (B) 1-99.5% by weight of at least one compound COMP1 which contains at least one structural unit L═X or at least one structural unit of the formula (1) to (5) and which is capable of forming glass-like layers, preferably having a glass transition temperature of above 70° C., at room temperature.

Although evident from the description of BLEND2, it should expressly be pointed out here that the compound COMP1 which contains structural units L═X or structural units of the formula (1) to (5) may also contain more than one of these units.

The triplet emitter TRIP2 here may be incorporated into the main chain and/or into the side chain of the polymer POLY2.

A further aspect of this invention relates to mixtures BLEND3 comprising (A) 0.5-98.9% by weight of at least one polymer POLY3;

(B) 1-99% by weight of at least one compound COMP1 which contains at least one structural unit L═X or at least one structural unit of the formula (1) to (5) and is capable of forming glass-like layers, preferably having a glass transition temperature of above 70° C., at room temperature; and in addition (C) 0.1-95% by weight, preferably 0.5-80% by weight, particularly, preferably 1-50% by weight, in particular 2-25% by weight, of one or more triplet emitters (TRIP1).

A further aspect of this invention relates to mixtures BLEND4 comprising (A) 0.5-99% by weight of at least one polymer POLY3; and in addition.

(B) 1-99.5% by weight of a compound TRIP3; TRIP3 contains at least one structural unit L=X or contains units of the formula (1) to (5) covalently bonded to one or more triplet emitters, where at least one group X is in free form, i.e. not coordinated to a metal atom; this does not exclude further structural units L=X or structural units of the formula (1) to (5) whose atom X is coordinated to a metal atom (for example acetylacetonate ligands, etc.) being present.

The invention furthermore relates to polymers POLY4 comprising (A) 1-99.9 mol %, preferably 5-80 mol %, particularly preferably 10-50 mol %, of one or more recurring units MONO1 containing at least one structural unit L=X, where the symbols L, X, $R^1$, $R^2$, $R^3$, $R^4$, $R^5$ and $R^6$ have the same meaning as described above; and (B) 0.1-95 mol %, preferably 0.5-50 mol %, particularly preferably 1-25 mol %, of one or more triplet emitters TRIP2.

The proportion of triplet emitters in BLEND1 to BLEND4 and POLY4 may also be significantly lower than indicated above. A lower proportion of triplet emitters may be preferred, in particular for the production of white emission, as described in the unpublished application DE 10343606.5.

The polymers POLY1 to POLY4 may be conjugated, partially conjugated, cross-conjugated or non-conjugated.

For the purposes of this invention, conjugated polymers are polymers whose main chain contains principally $sp^2$-hybridised (or also sp-hybridised) carbon atoms, which may also be replaced by corresponding hetero atoms and whose units are conjugated with one another. In the simplest case, this means the alternating presence of double and single bonds in the main chain. It principally means that defects occurring naturally (without further assistance) which result in conjugation interruptions do not devalue the term "conjugated polymer". Furthermore, conjugated in this application text likewise denotes the case when arylamine units, arylphosphine units and/or certain heterocycles (i.e. conjugation via N, O, S or P atoms) and/or organometallic complexes, such as, for example, units as defined for TRIP2 (conjugation via the metal atom) are located in the main chain For the purposes of this invention, partially conjugated polymers are polymers which either contain relatively long conjugated sections interrupted by non-conjugated sections in the main chain or which contain relatively long conjugated sections in the side chains of a non-conjugated polymer in the main chain.

For the purposes of this invention, cross-conjugated polymers are polymers in which two conjugated sections are not conjugated with one another, but each individual one of these sections is conjugated with a third unit. This is the case, for example, if two conjugated sections are linked directly via a keto group, a sulfoxide group, a sulfone group or a phosphine oxide group, but, for example, also in the case of geminal linking of two conjugated sections via a substituted or unsubstituted alkene group or in the case of linking of two conjugated sections via, for example, a metaphenylene group.

By contrast, units, such as, for example, simple alkylene chains, (thio)ether bridges, ester, amide or imide links, would clearly be defined as non-conjugated segments.

The polymers are preferably conjugated, partially conjugated or cross-conjugated.

In addition to the units MONO1 (in POLY1 and POLY4) and the triplet emitter TRIP2 (in POLY2 and POLY4), the polymers POLY1 to POLY4 may contain various further structural elements. These may be, for example, structural units which are able to form the polymer skeleton or structural units which influence the charge-injection or charge-transport properties.

Such units are described in detail, for example, in WO 03/020790 and in the unpublished application DE 10337346.2. The descriptions given therein represent part of the present application by quote.

A suitable class of compound for cross-conjugated polymers POLY1 and POLY4 are aromatic polyketones and aromatic polysulfones, each of which may be substituted for better solubility. An overview of these classes of compound is given by P. A. Staniland in "Comprehensive Polymer Science", Ed. G. Allen, Volume 5, Chapter 29, 483-497, and F. Parodi, ibid., Chapter 33, 561-591. Aromatic polyphosphine oxides are likewise suitable.

If the polymers POLY1 to POLY4 are non-conjugated polymers, in principle any desired classes of compound are suitable for this purpose so long as the polymers, when processed as a blend, have sufficient solubility in a solvent or solvent mixture in which the other blend constituents are also soluble, so that all components can be processed jointly from solution. Examples of non-conjugated polymers POLY1 and POLY4 which contain units L=X or units of the formula (1) to (5) covalently bonded are polycarboxylic acid derivatives in the broadest sense, such as, for example, main-chain polyesters, side-chain polyesters, poly(glycolic acids), polylactic acids), poly(ε-caprolactones), polyacrylates, poly(hydroxybenzoic acids), poly(alkylene terephthalates), polycarboxylic anhydrides, polyamides, poly-(ε-caprolactams), polypeptides, polyaramids, polybenzamides, polyimides, poly (amide-imides), poly(ester-imides), poly(ether-imides), etc., but also polymers such as, for example, polycarbonates, poly (ester-co-carbonates), poly(isocyanurates), polyurethanes or polyester-polyurethanes. Preference is given here to polymers which have at least one aromatic group, particularly preferably two aromatic groups, bonded to the carbonyl group. Examples of main-chain polyesters which may be mentioned are, for example, poly(terephthalates). Examples of side-chain polyesters which may be mentioned here are, for example, poly(acrylates), in particular poly(phenyl acrylates), poly(cyanoacrylates), poly(vinyl esters) or poly(vinyl acetates). Further non-conjugated polymers which contain units L=X covalently bonded are, for example, side-chain polyphosphine oxides, polyether ketones (PEK), polyether sulfones, polysulfonamides, polysulfonimides, etc. Furthermore, for example, substituted or unsubstituted poly(vinyl ketones) are suitable, preferably aromatic polyvinyl ketones, or also substituted or unsubstituted poly(vinylbenzophenones) or other polystyrene-analogous ketones, such as poly (4-benzoyl-α-methylstyrene). Polycarbazenes, such as polynitriles or polyisonitriles, are also suitable.

Examples of suitable non-conjugated polymers POLY3 which contain neither units L=X nor triplet emitters covalently bonded are, for example, polymers which are derived in the broadest sense from polyethylene or polystyrene, but also electronically active, non-conjugated polymers, such as, for example, PVK (polyvinylcarbazole) or derivatives thereof.

The polymers POLY1, POLY2 and POLY3 may be homopolymers, i.e. they then contain only one single monomer structure, but are generally copolymers. The polymer POLY4 is always a copolymer. The copolymers can have random, alternating or also block-like structures or alternatively have a plurality of these structures alternating. The polymers may likewise have a linear or dendritic structure. The use of a plurality of different structural elements enables properties, such as, for example, solubility, solid-phase morphology, etc., to be adjusted.

The polymers POLY1 to POLY4 are prepared by polymerisation of one or more monomers. In particular for the synthesis of conjugated or cross-conjugated polymers, some types which result in C—C links (SUZUKI coupling, YAMAMOTO coupling, STILLE coupling) or in C—N links (HARTWIG-BUCHWALD coupling) have proven successful here. The way in which the polymerisation can be carried out by these methods and the way in which the polymers can be separated off from the reaction medium and purified is described, for example, in WO 03/048225 and WO 04/022626.

The synthesis of partially conjugated or non-conjugated polymers can also be carried out by these methods by using corresponding monomers which are not conjugated throughout. For partially conjugated or non-conjugated polymers, however, other synthetic methods, as are generally familiar from polymer chemistry, such as, for example, polycondensations, which result, for example, in ester or amide links, or cationic, anionic or free-radical polymerisations, which proceed, for example, via the reaction of alkenes and result in the broadest sense in polyethylene derivatives which contain the chromophores bonded in the side chains, are also suitable.

The following applies to preferred structural units of the formula (1) to (5):
X stands for O, S or N—$R^4$;
Y stands for P or As;
Z stands for S or Se;
$R^1$ to $R^6$ are as defined above, where at least one of the substituents $R^1$ to $R^3$ on each structural unit of the formula (1) to (5) represents an aromatic or heteroaromatic ring system having 1 to 40 C atoms, which may be substituted by one or more substituents $R^4$ or unsubstituted.

The following applies to particularly preferred structures of the formula (1) to (5):
X stands for O or N—$R^4$; X very particularly preferably stands for O;
Y stands for P;
Z stands for S;
$R^1$ to $R^6$ are as defined above, where all substituents $R^1$ to $R^3$ on each structural unit of the formula (1) to (5) represent an aromatic or heteroaromatic ring system having 1 to 40 C atoms, which may be substituted by one or more substituents $R^4$ or unsubstituted.

The substituents $R^1$ to $R^3$ very particularly preferably contain aromatic or heteroaromatic ring systems in which at least one biphenyl-like structure is bonded directly to the units of the formula (1) to (5), where, for example, fluorenes or spirobifluorenes are also intended to count as such structures.

Structural units that have proven to be preferred structural units of the formula (1) to (5) are those whose radicals $R^1$ to $R^3$ do not have a planar structure. This is the case, in particular, if at least one of the substituents $R^1$ to $R^3$ contains an sp³-hybridised carbon atom (or correspondingly also silicon, germanium, nitrogen, etc.) which consequently has approximately tetrahedral (or in the case of nitrogen pyramidal) geometry.

Preferred structural units are therefore units of the formula (1) to formula (5) in which at least one of the substituents $R^1$ to $R^3$ contains at least one sp³-hybridised carbon atom.

In order to achieve clearer deviation from planarity, it is preferred for this sp³-hybridised carbon atom to be a secondary, tertiary or quaternary carbon atom, particular preference is given to a tertiary or quaternary carbon atom, very particular preference is given to a quaternary carbon atom. A secondary, tertiary or quaternary carbon atom is taken to mean a carbon atom having two, three or four non-hydrogen substituents respectively.

Particular preference is given to structural units of the formula (1) to formula (5) which contain a 9,9'-spirobifluorene derivative, a 9,9-disubstituted fluorene derivative, a 6,6- and/or 12,12-di- or tetra-substituted indeno-fluorene derivative, a triptycene derivative (preferably linked via position 9 and/or 10) or a tetraarylmethane derivative in at least one of the radicals $R^1$ to $R^3$. Very particular preference is given to structural units of the formula (1) to (5) which contain a 9,9'-spirobifluorene derivative in at least one of the radicals $R^1$ to $R^3$.

Polymers containing 9,9'-spirobifluorene derivatives and at the same time structural units of one or more of the formulae (1) to (5) are novel and are therefore likewise a subject-matter of the present invention.

Examples of particularly preferred recurring units MONO1 or compounds COMP1 which contain structural units of the formulae (1) to (5) are substituted or unsubstituted structures of the formulae (6) to (148) shown, where the dashed single bonds denote a possible link in the polymer (MONO1) or links for molecular extension (COMP1); Ph stands for a substituted or unsubstituted phenyl group and alkyl stands for a straight-chain, branched or cyclic alkyl chain, which may be substituted or unsubstituted and in which one or more H atoms may be replaced by fluorine. These structural elements of the formulae (6) to (148) are also preferably a constituent of the compounds TRIP3, which represent a combination of triplet emitters and units of the formula (1) to (5). Potential substituents $R^4$ are generally not shown owing to better clarity:

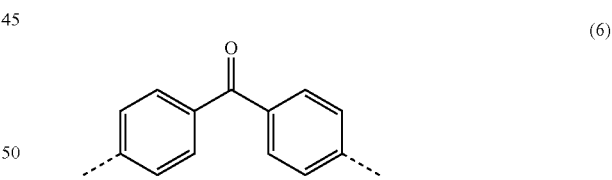

(6)

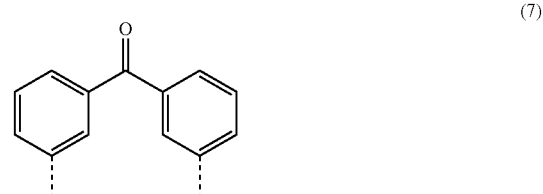

(7)

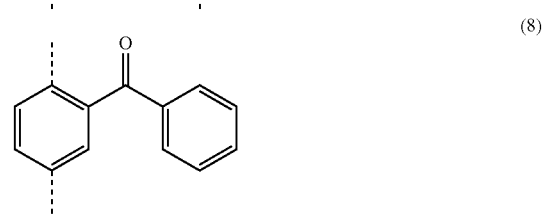

(8)

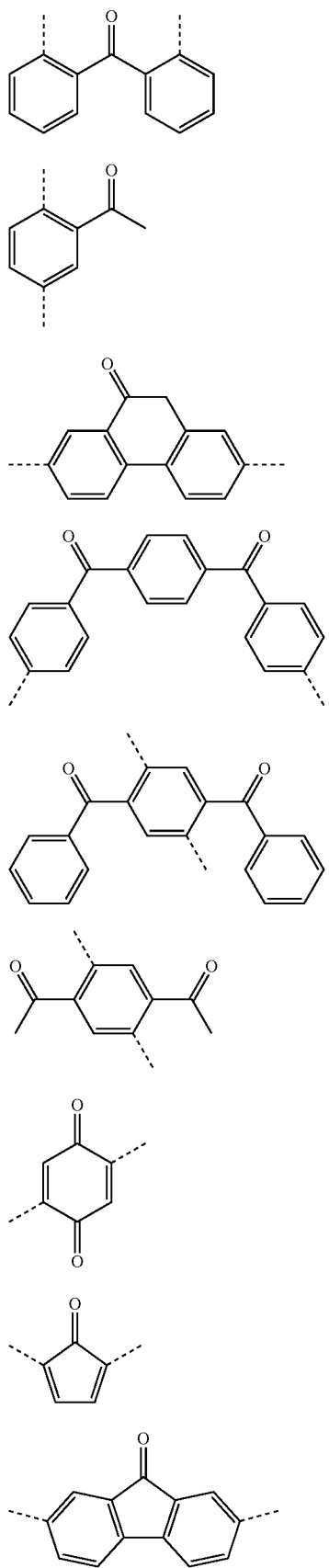
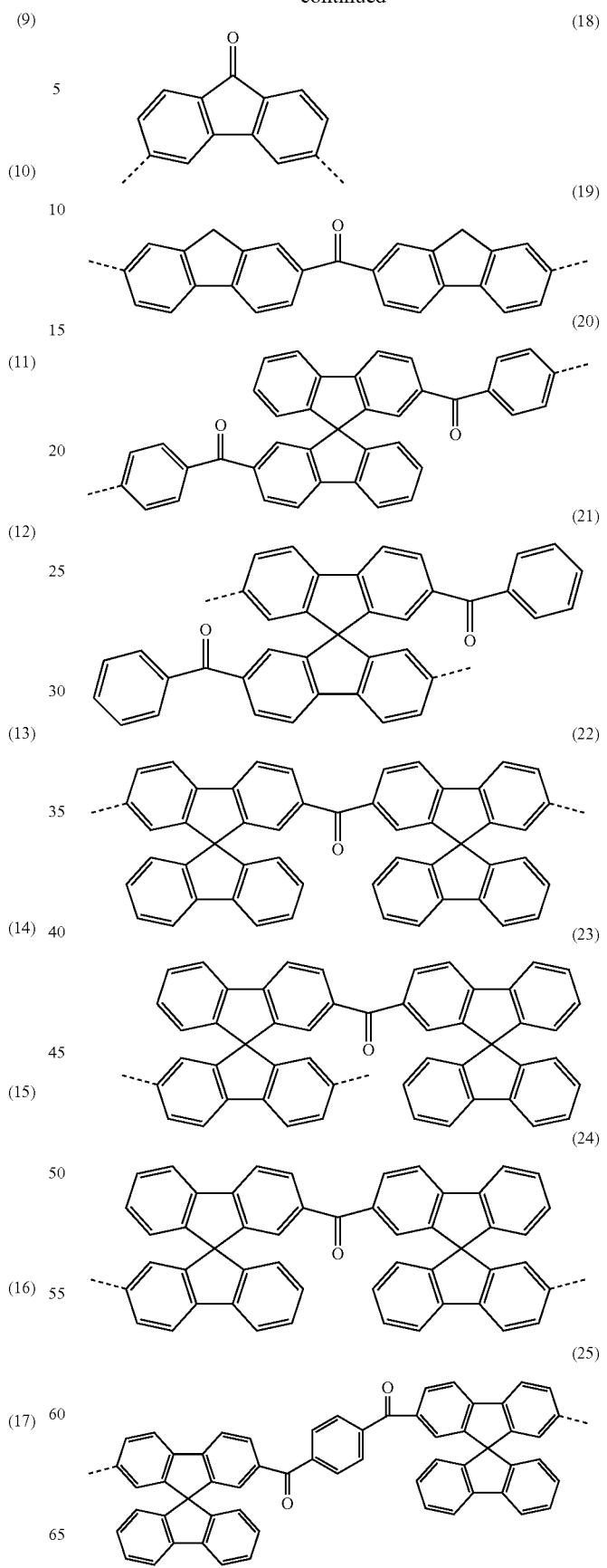

(26)
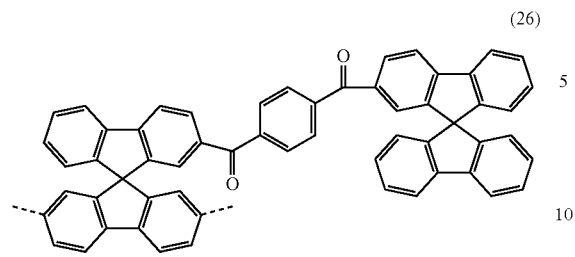
(27)
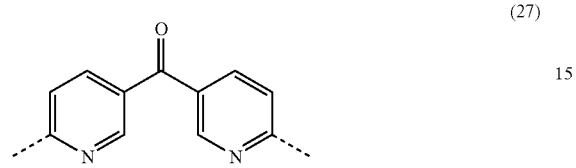
(28)
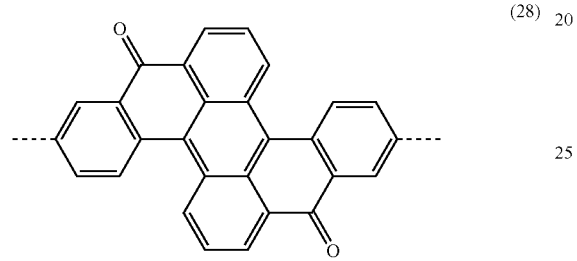
(29)
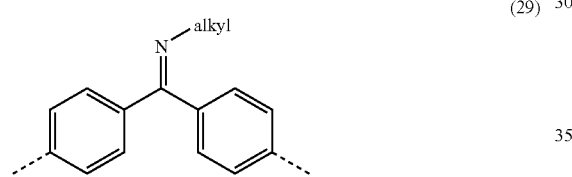
(30)
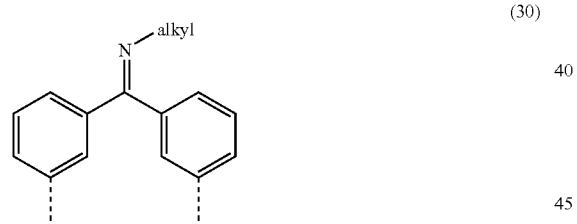
(31)
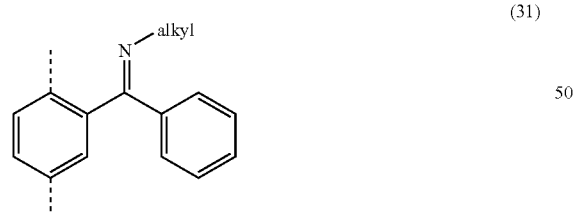
(32)
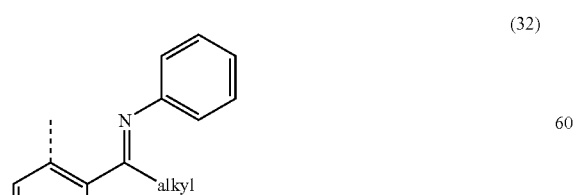
(33)
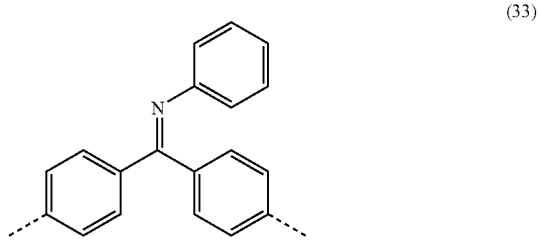
(34)
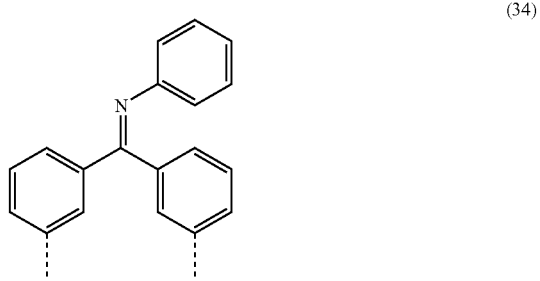
(35)
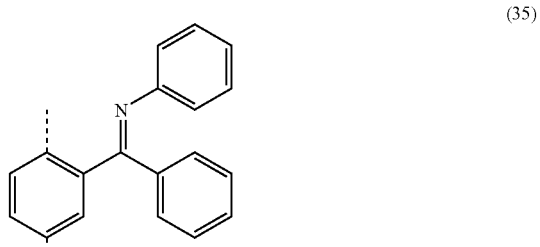
(36)
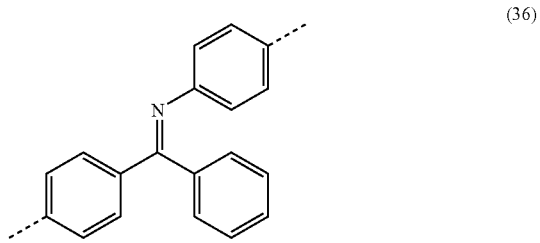
(37)
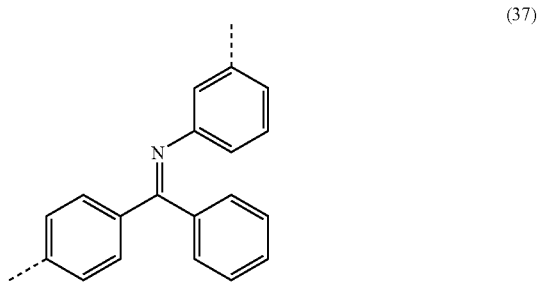
(38)
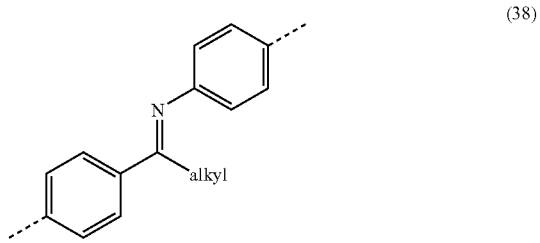

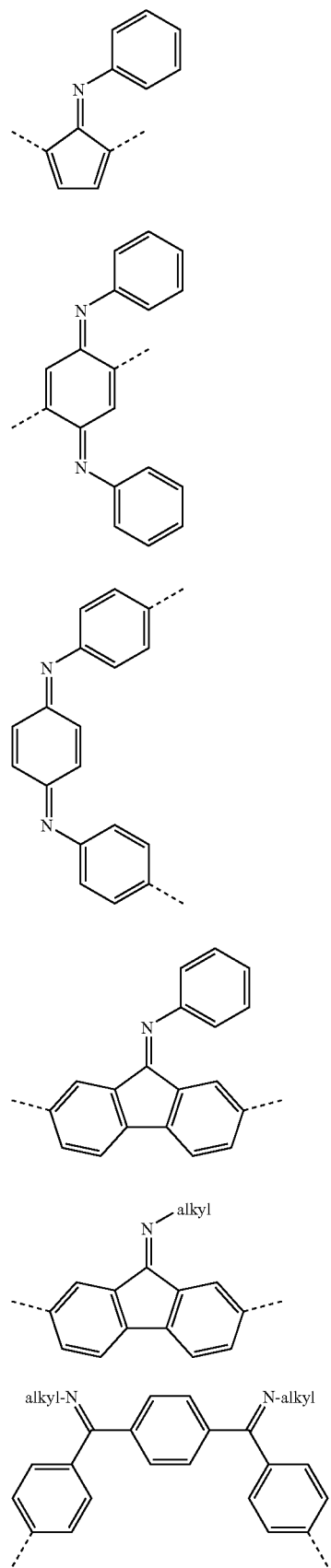
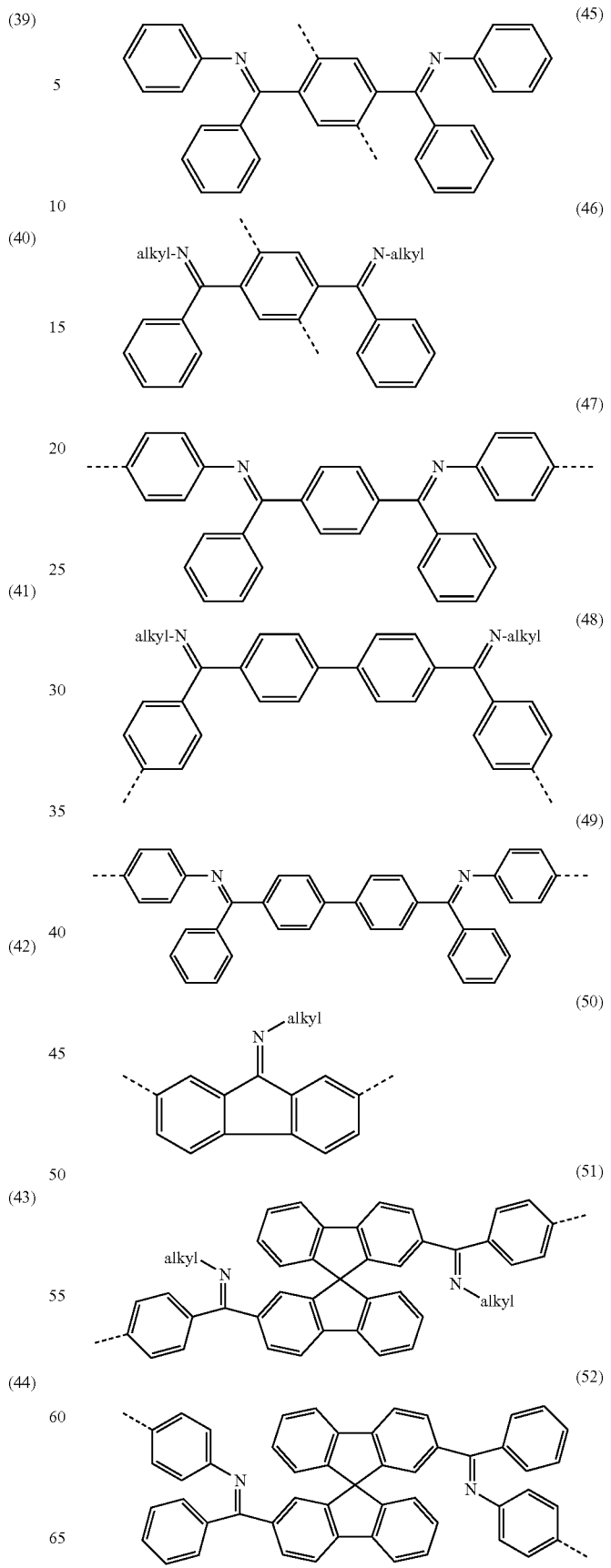

(53)
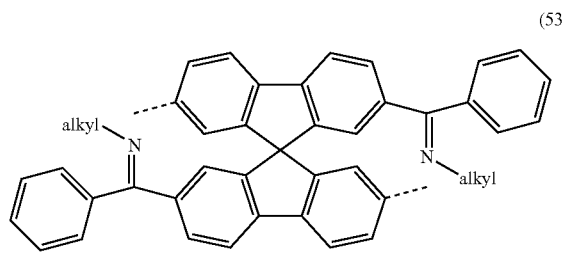
(54)
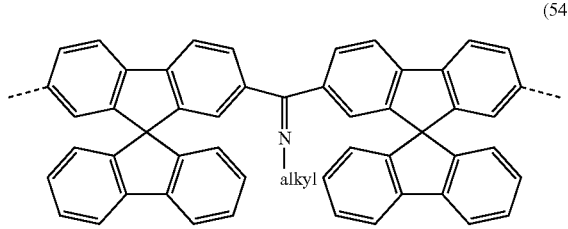
(55)
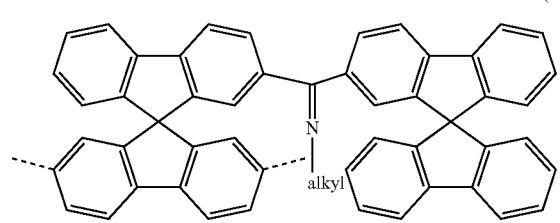
(56)
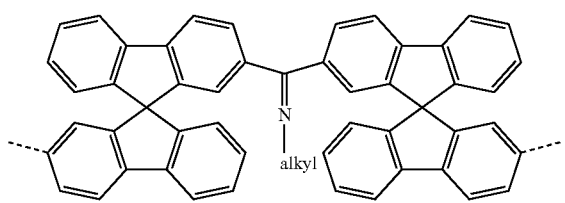
(57)
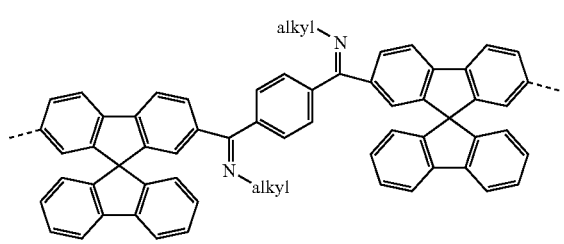
(58)
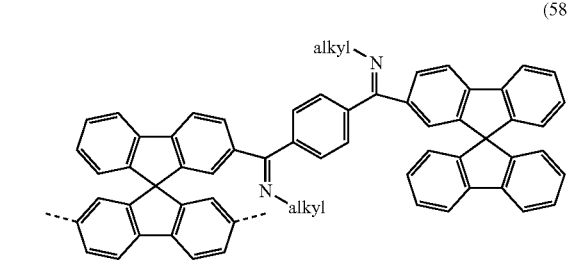
(59)
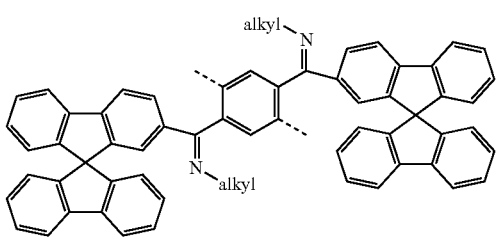
(60)
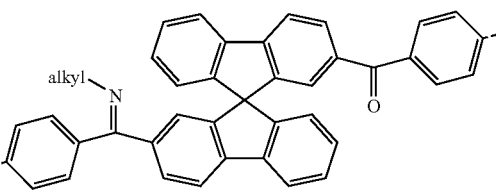
(61)
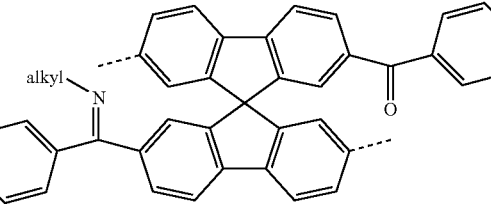
(62)
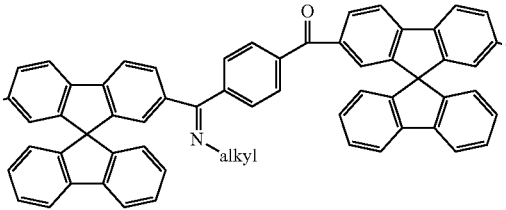
(63)
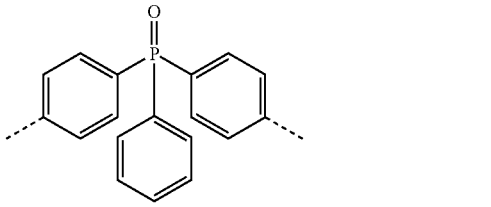
(64)
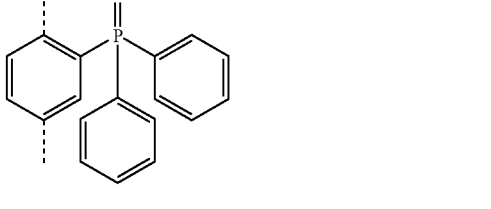
(65)
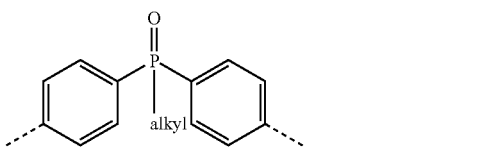

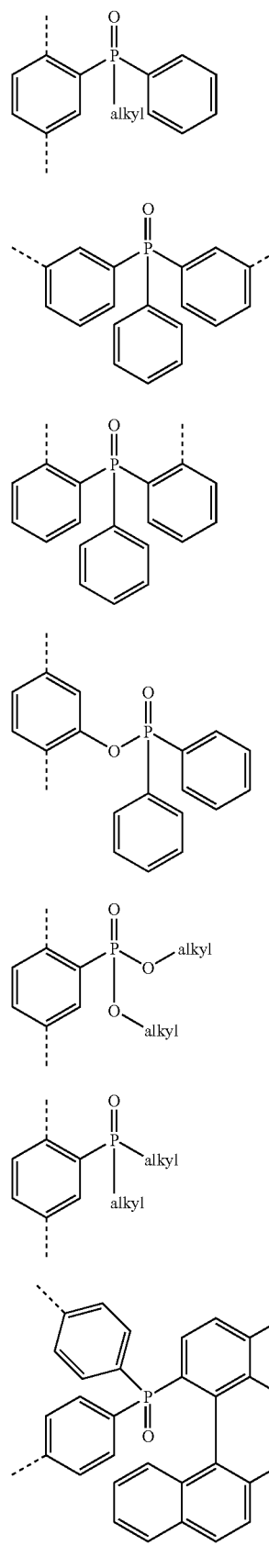
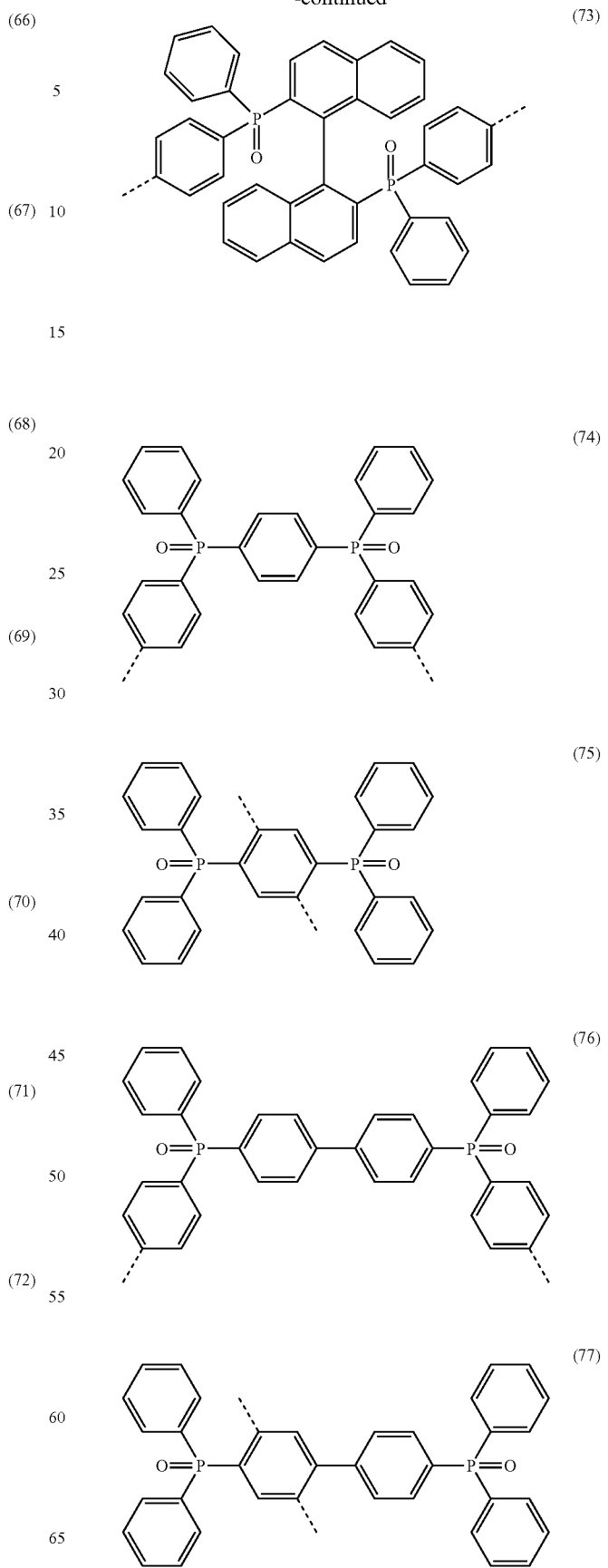

-continued
(78)
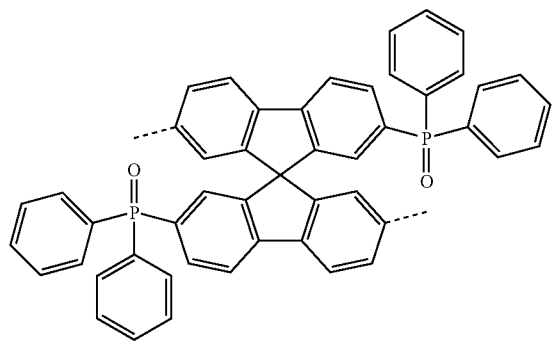
(79)
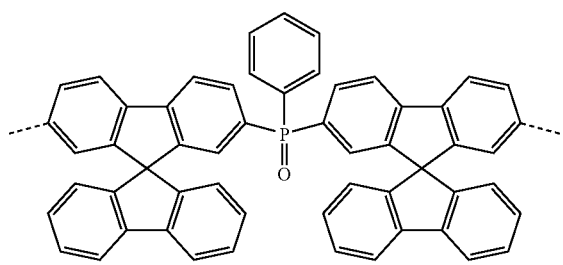
(80)
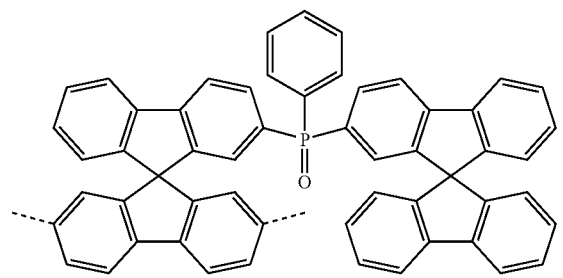
(81)
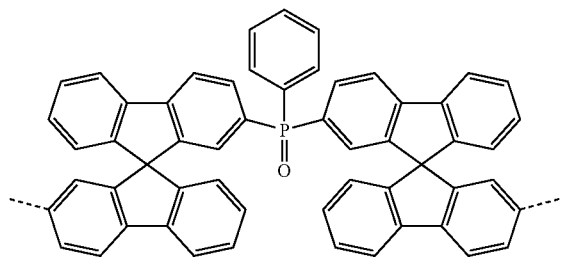
(82)
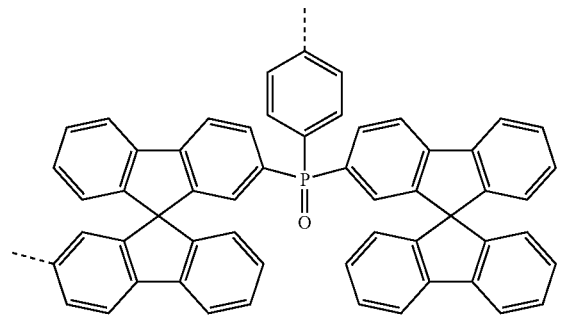
-continued
(83)
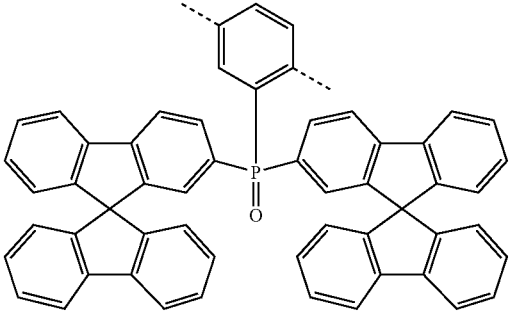
(84)
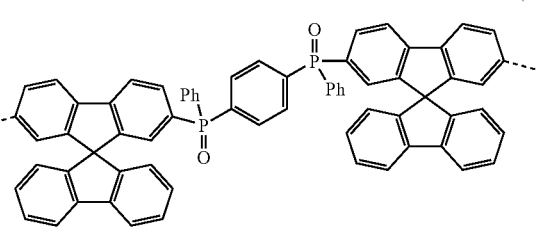
(85)
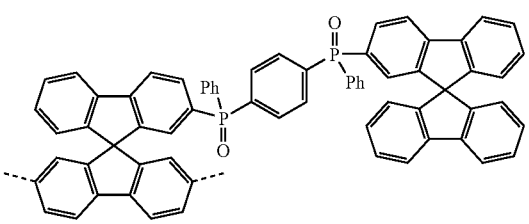
(86)
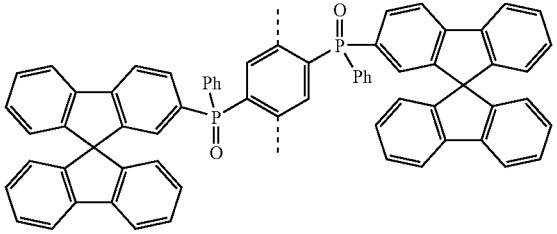
(87)
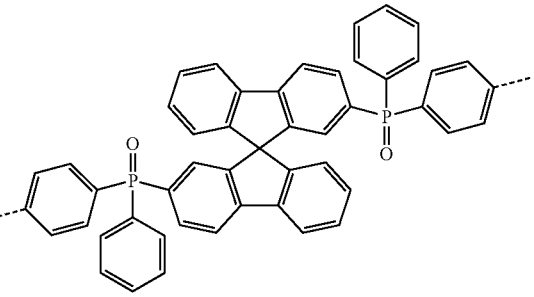

-continued
(88)
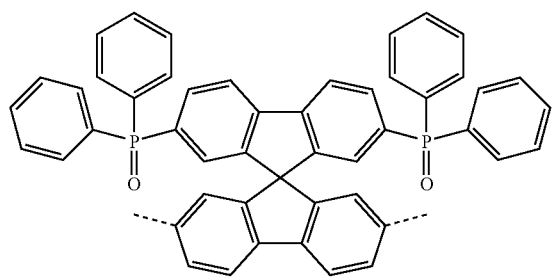
(89)
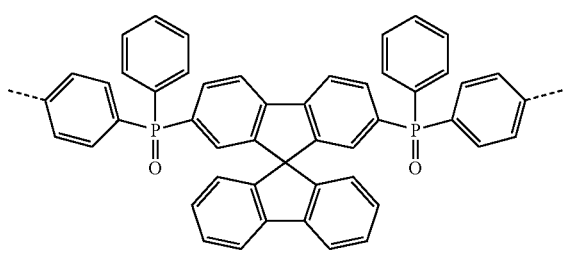
(90)
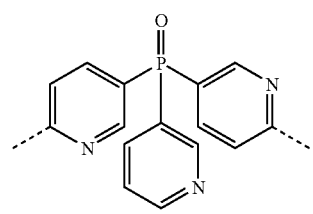
(91)
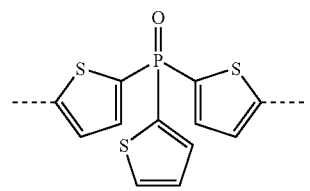
(92)
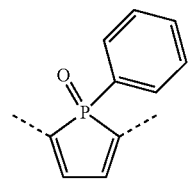
(93)
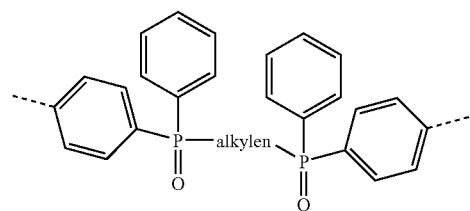
(94)
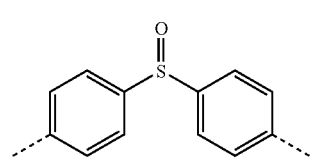
-continued
(95)
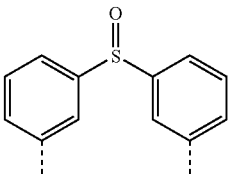
(96)
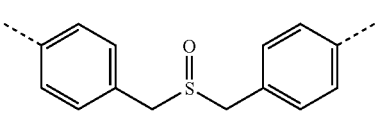
(97)
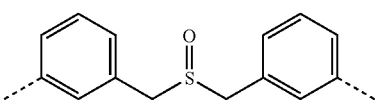
(98)
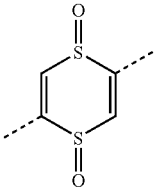
(99)
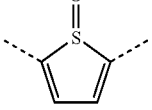
(100)
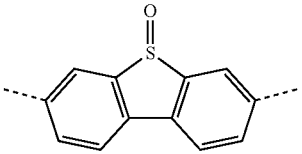
(101)
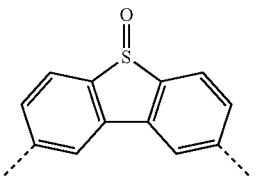
(102)
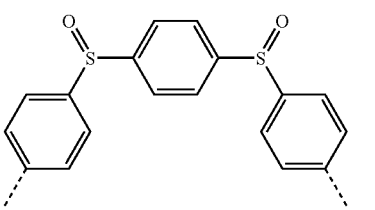
(103)
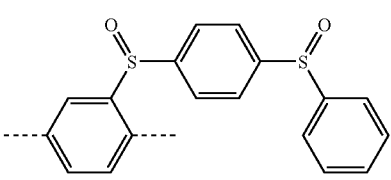

(104) 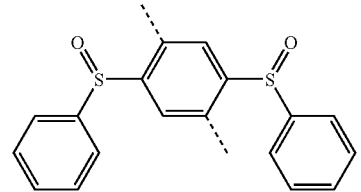
(105) 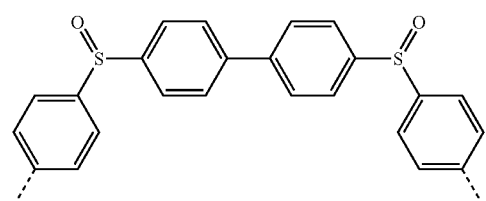
(106) 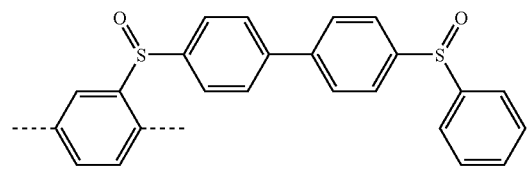
(107) 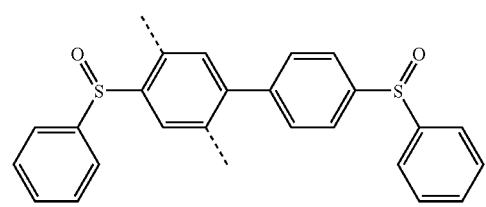
(108) 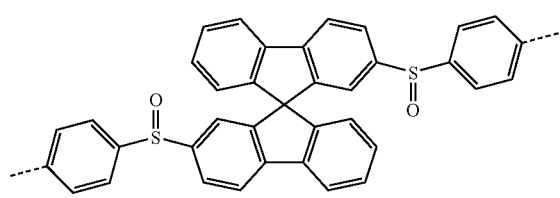
(109) 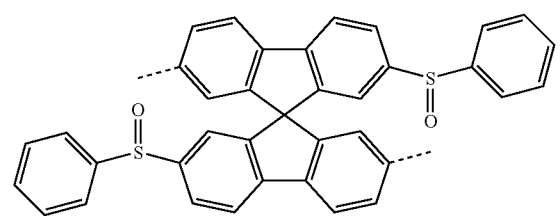
(110) 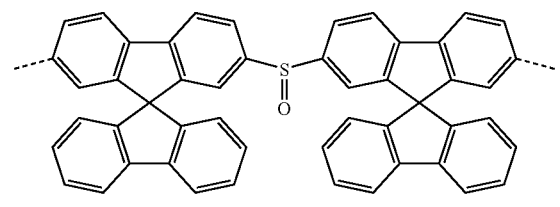
(111) 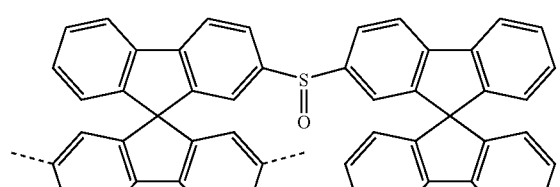
(112) 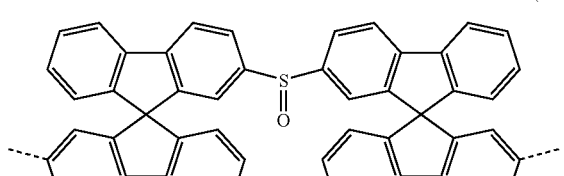
(113) 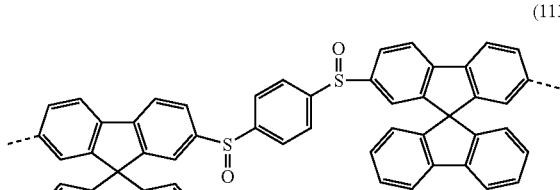
(114) 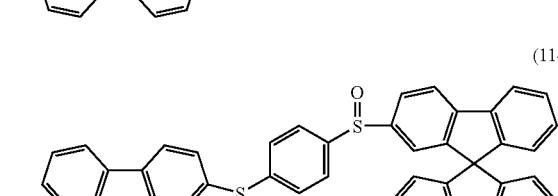
(115) 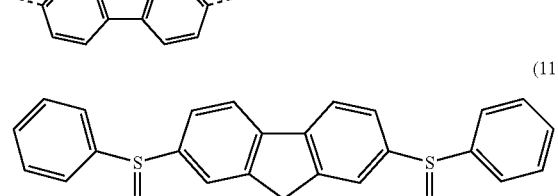
(116) 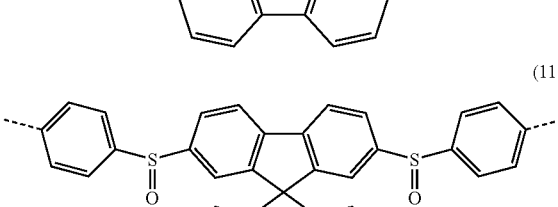
(117) 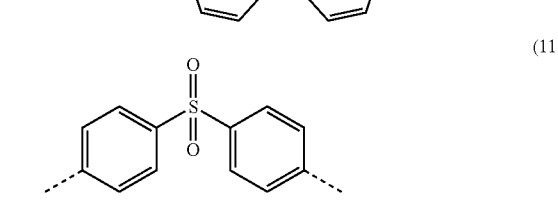

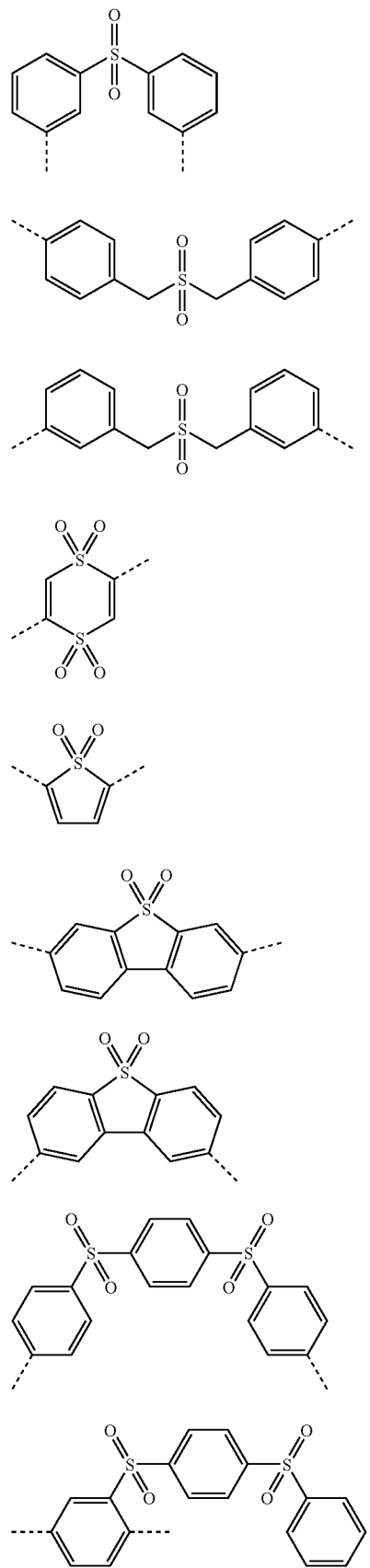
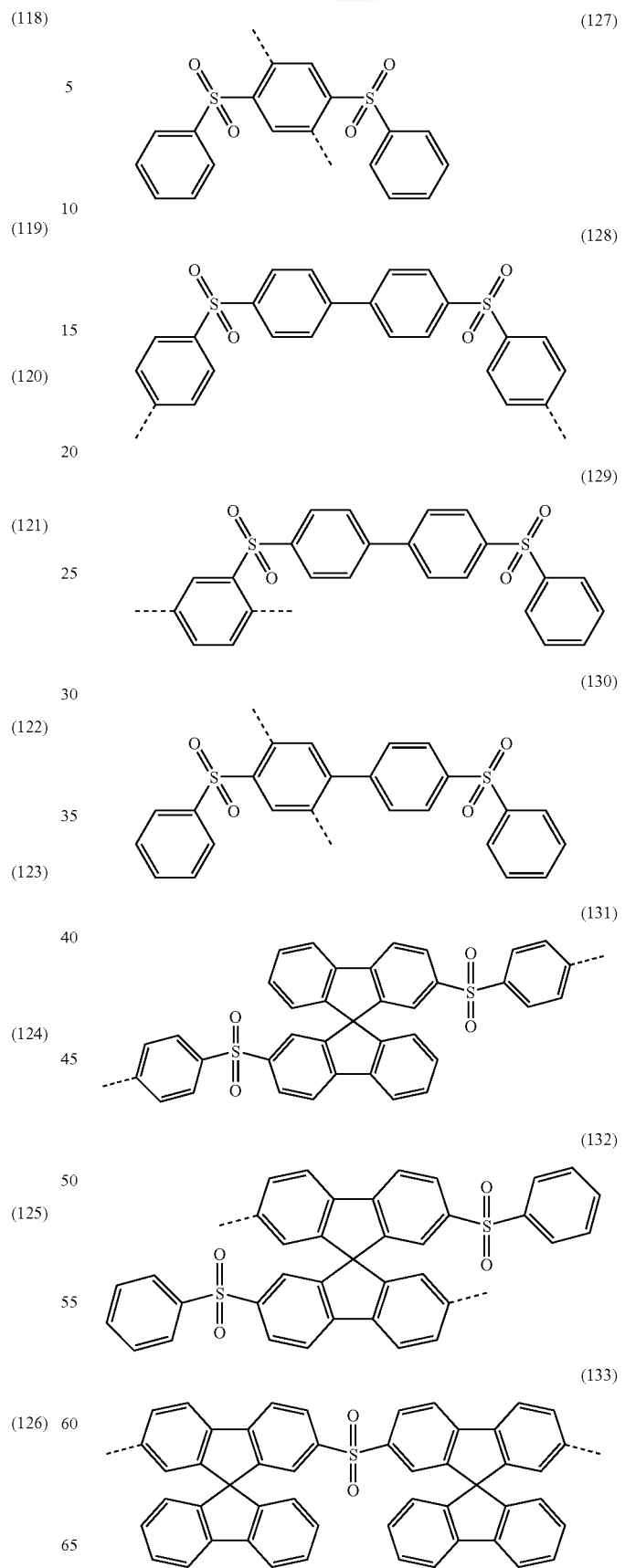

-continued
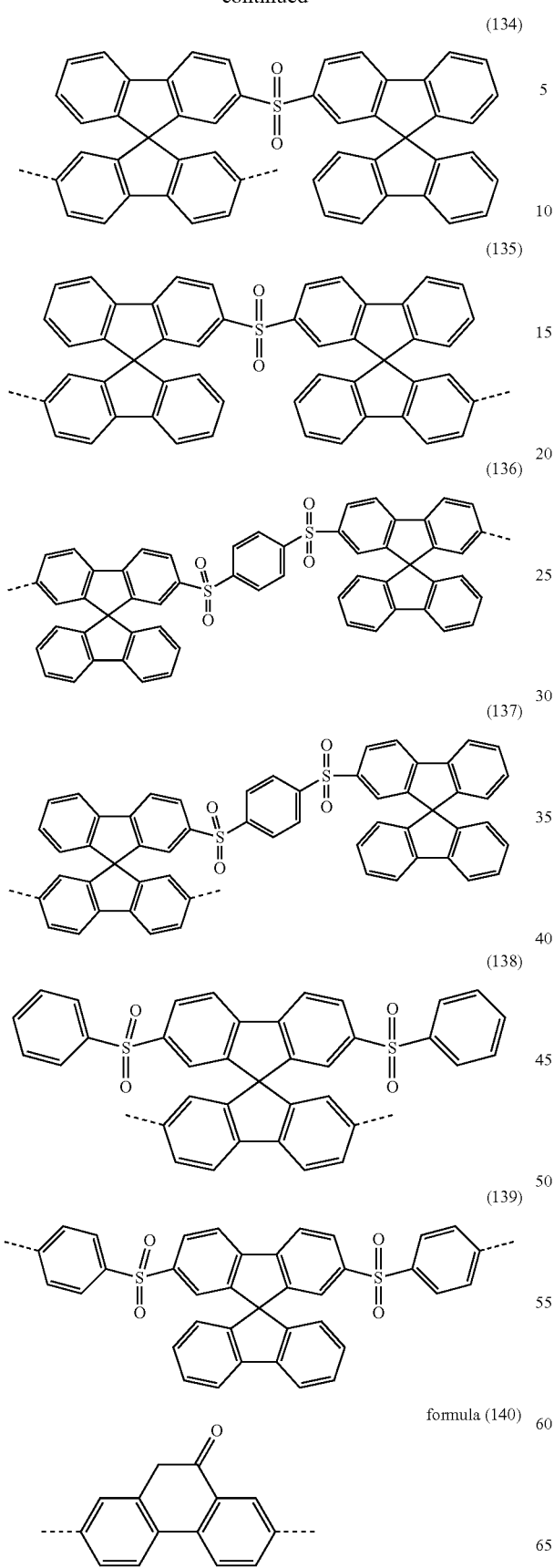
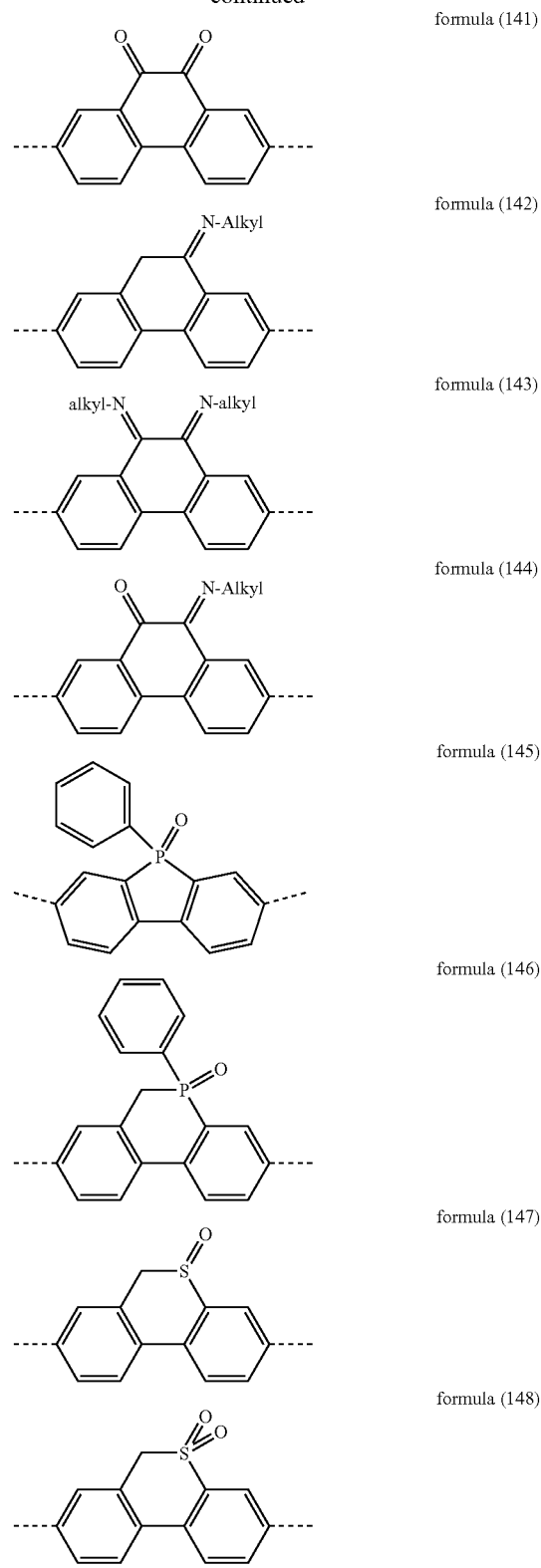
Although evident from the description, it should again explicitly be pointed out here that the structural units of the formulae (6) to (148) may also be asymmetrically substituted, i.e. that different substituents $R^4$ may be present on a unit, or they may also be bonded in different positions.

The recurring units MONO1 are covalent constituent of POLY1 and POLY4. It has been found that a proportion of these recurring units in the range 5-100 mol % (based on all recurring units in the polymer) achieves good results here. A proportion of 5-100 mol % of recurring units MONO1 is preferred for POLY1. A proportion of 10-80 mol % of recurring units MONO1 is particularly preferred, a proportion of 10-50 mol % of recurring units MONO1 is very particularly preferred.

Compounds COMP1 are mixture constituent of BLEND2 and BLEND3. It has been found that a proportion of these compounds in the mixture in the range 5-99% by weight achieves good results here. A proportion of 5-99% by weight of compounds COMP1 is thus preferred for BLEND2 and BLEND3. A proportion of 10-80% by weight of COMP1 is particularly preferred, a proportion of 10-50% by weight of COMP1 is very particularly preferred.

A further preferred embodiment is the mixture BLEND5, which is formed by mixing compounds COMP1 into BLEND1, so that structural units L=X or units of the formula (1) to (5) here are both covalently bonded to the polymer and also mixed in. It has been found here that a total proportion of 5-99 mol % of structural units of these formulae achieves good results, irrespective of whether these units are covalently bonded to the polymer or are mixed in. A total proportion of 5-99 mol % of structural units L=X or units of the formulae (1) to (5) is thus preferred here. A total proportion of 10-80 mol % of structural units L=X or units of the formulae (1) to (5) is particularly preferred, a total proportion of 10-50 mol % of structural units of the formulae (1) to (5) is very particularly preferred.

A further preferred embodiment is the mixture BLEND6, which is formed by mixing compounds COMP1 into BLEND4, so that structural units L=X or units of the formula (1) to (5) here are both covalently bonded to the triplet emitter and also mixed in. Here too, it has been found that a total proportion of 5-99 mol % of these structural units achieves good results, irrespective of whether these units are covalently bonded to the triplet emitter or are mixed in. A total proportion of 5-99 mol % of structural units L=X or units of the formulae (1) to (5) is thus preferred here. A total proportion of 10-80 mol % of structural units L=X or units of the formulae (1) to (5) is particularly preferred, a total proportion of 10-50 mol % of structural units L=X or units of the formulae (1) to (5) is very particularly preferred.

A further preferred embodiment is the mixture BLEND7, which is formed by mixing compounds COMP1 and/or triplet emitters TRIP1 into POLY4.

The triplet emitters TRIP1 mixed into BLEND1 and BLEND3, or the triplet emitters TRIP2 copolymerised into POLY2 (=BLEND2), or the triplet emitters TRIP3 mixed into BLEND4 can be selected from any desired organic, organometallic or inorganic classes of substance which are able to emit light from the triplet state at room temperature, i.e. exhibit phosphorescence instead of fluorescence: these are firstly, in particular, compounds which contain heavy atoms, i.e. atoms from the Periodic Table of the Elements having an atomic number of greater than 36. Particularly suitable for this purpose are compounds which contain d and f transition metals which satisfy the above-mentioned condition. Very particular preference is given here to corresponding structural units which contain elements from group 8 to 10 (i.e. Ru, Os, Rh, Ir, Pd, Pt). Particular preference is given to triplet emitters based on tris-ortho-metallated metal complexes.

The triplet emitters TRIP1 and TRIP3 can be low-molecular-weight, oligomeric, dendritic or polymeric compounds. Since they are in some cases processed as mixture constituent (BLEND1, BLEND3 or BLEND4), adequate solubility in suitable solvents (for example toluene, xylene, anisole, THF, methylanisole, methylnaphthalene or mixtures of these solvents) must exist in order that processing from solution is possible. Suitable low-molecular-weight structural units here are various complexes which are described, for example, in the application specifications WO 02/068435, WO 02/081488, EP 1239526 and WO 04/026886. In particular, the halogenated complexes described in WO 02/068435 are also suitable as starting compound for TRIP3, since the halogen functionality allows easy derivatisation of the complexes with structural units of the formula (1) to (5). Suitable dendrimer structures for TRIP1 and TRIP3 are complexes as described, for example, in WO 99/21935, WO 01/059030 and WO 02/066552.

The triplet emitter TRIP2 is incorporated covalently into the polymer chain of POLY2 (BLEND2), In order to facilitate the incorporation of TRIP2 into POLY2, functional polymerisable groups must be present on TRIP2. Examples of corresponding brominated complexes which can be employed as monomers in polymerisation reactions, for example in accordance with Suzuki or in accordance with Yamamoto, are described in WO 02/068435 and in the unpublished application DE 10350606.3.

The mixture BLEND1 according to the invention is obtained by admixing a triplet emitter TRIP1 with the polymer POLY1.

The mixture BLEND2 according to the invention is obtained by admixing compound COMP1 containing structural units L=X or structural units of the formula (1) to (5) with the polymer POLY2.

The mixture BLEND3 according to the invention is obtained by admixing compound COMP1 containing structural units L=X or structural units of the formula (1) to (5) and a triplet emitter TRIP1 with the polymer POLY3. The mixture BLEND4 according to the invention is obtained by admixing units TRIP3 with the polymer POLY3.

It may additionally be preferred also to mix further conjugated, partially conjugated, cross-conjugated or non-conjugated polymers, oligomers, dendrimers or further low-molecular-weight compounds into BLEND1 to BLEND7. The addition of further components may prove appropriate for some applications: for example, addition of an electronically active substance enables the hole or electron injection, the hole or electron transport or the charge equilibrium in the corresponding blend to be regulated. The added component may also make singlet-triplet transfer easier. However, the addition of electronically inert compounds may also be helpful in order, for example, to control the viscosity of a solution or the morphology of the film formed. The invention likewise relates to the blends obtained in this way.

BLEND1 to BLEND7 are prepared as follows: the individual constituents of the blend are combined in a suitable mixing ratio and dissolved in a suitable solvent. Suitable solvents are, for example, toluene, anisole, xylenes, methylanisole, methylnaphthalene, chlorobenzene, cyclic ethers (for example dioxane, THF, methyldioxane), amides (for example NMP, DMF) or mixtures of these solvents. Alternatively, the constituents of the blend may also be dissolved individually. In this case, the solution of the blend is obtained by combining the individual solutions in a suitable mixing ratio. The dissolution process here is preferably carried out in an inert atmosphere and optionally at elevated temperature. The blend is usually not isolated as a solid (by re-precipitation), but instead is processed further directly from solution; however, the invention also relates to blends which have been precipitated once again.

A suitable ratio of the individual components is, for example, a mixture which comprises a total of 1-99.5 mol %, preferably 5-99 mol %, particularly preferably 10-80 mol %, in particular 10-50 mol %, of units L=X or units of the formula (1) to (5) (MONO1 in POLY1 or COMP1) and 0.1-95 mol %, preferably 0.5-80 mol %, particularly preferably 1-50 mol %, in particular 2-25 mol %; of TRIP1, TRIP2 and TRIP3, where the data are based on all the units present (blend constituents or recurring units in the polymer). This is independent of whether the components are covalently bonded to a polymer or mixed in.

The organic semiconductors according to the invention, i.e. the mixtures BLEND1 to BLEND7 and polymers POLY4 according to the invention, have, inter alia, the following surprising advantages over the above-mentioned prior art:

The solubility in organic solvents is generally better than the solubility of the polymers and mixtures in accordance with the prior art. The better solubility offers an advantage, for example over bridged carbazole units, which are mentioned as closest prior art, since the maximum carbazole proportion therein is frequently determined by the poor solubility, but in some cases a higher carbazole proportion would be desirable for further improvement of the device properties.

The chemical accessibility of the units of the formula (1) to (5), both as blend constituent and also as monomer, is not problematic. In some cases, these blend constituents and monomers are also commercially available. This is a crucial advantage over, for example, the bridged carbazole units (DE 10328627.6), the synthesis and purification of which are considerably more complex.

The mixtures and polymers according to the invention exhibit higher oxygen stability than mixtures and polymers in accordance with the prior art. This simplifies the preparation of these compounds and mixtures and also their processing, which represents a considerable practical advantage.

The efficiency of light emission of the triplet emitter is better in the organic semiconductors according to the invention compared with polymers and mixtures in accordance with the prior art.

The lifetime of the devices according to the invention is better than in devices in accordance with the prior art.

The organic semiconductors according to the invention, i.e. the mixtures BLEND1 to BLEND7 or the polymers POLY4, can be used in PLEDs, in particular as electroluminescent materials (emitting materials). PLEDs are generally constructed using a general process which is correspondingly to be adapted to the individual case. A process of this type has been described in detail, for example, in WO 04/037887.

The invention therefore also relates to the use of an organic semiconductor according to the invention, i.e. a mixture BLEND1 to BLEND7 according to the invention or a polymer POLY4 according to the invention, in a PLED as electroluminescent material.

The invention thus likewise relates to a PLED having one or more layers, where at least one of these layers comprises one or more organic semiconductors according to the invention, i.e. one or more mixtures BLEND1 to BLEND7 according to the invention or polymers POLY4 according to the invention.

The present application text and the following examples are directed to the use of organic semiconductors according to the invention, i.e. mixtures BLEND1 to BLEND7 or polymers POLY4 according to the invention, in relation to PLEDs and the corresponding displays. In spite of this restriction of the description, it is readily possible for the person skilled in the art, without inventive step, also to use the polymers or blends according to the invention for further uses in other electronic devices, for example for organic solar cells (O-SCs), non-linear optics or also organic laser diodes (O-lasers), to mention but a few applications. The present invention also relates to these.

The invention is explained in greater detail by the following examples without wishing to be restricted thereby.

EXAMPLES

Example 1

Synthesis of the Comonomers for the Polymers

The synthesis of the comonomers used for conjugated polymers is described in detail in WO 02/077060 and the literature cited therein, and in the unpublished application DE 10337346.2. The monomers M1 to M5 and M8 used below will be shown again here for reasons of clarity:

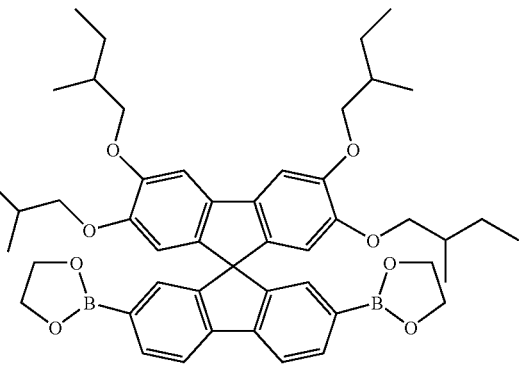

M1

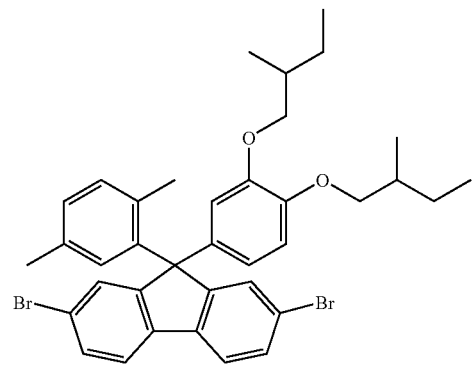

M2

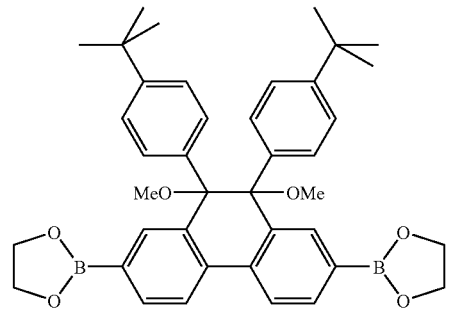

M3

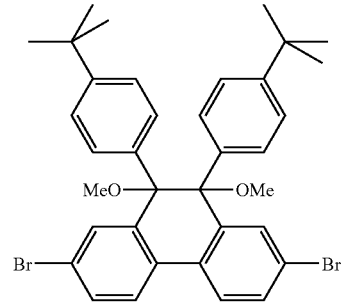

M4

-continued

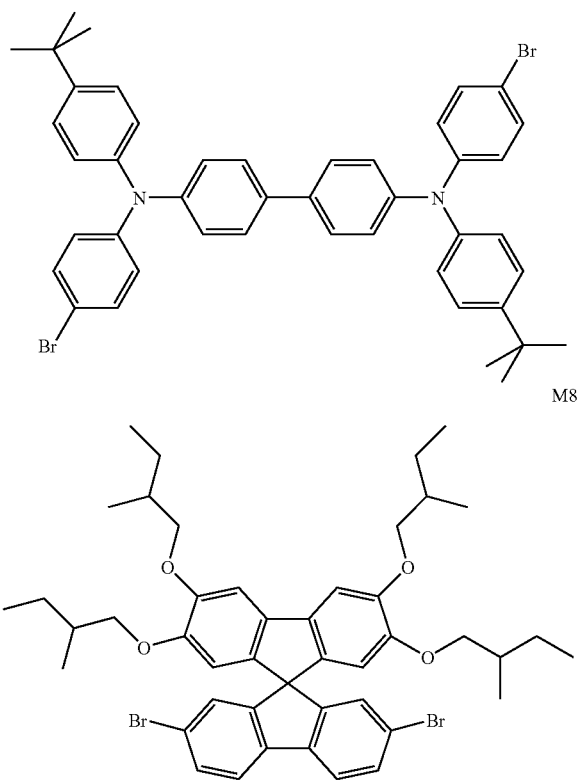

M5

M8

Example 2

4,4'-Dibromobenzophenone (monomer M6 of the Formula (1))

4,4'-Dibromobenzophenone was obtained from Fluka in a purity of 98% and purified by further recrystallisation from ethanol to a purity of 99.7% (according to HPLC).

Example 3

Synthesis of bis(4-bromophenyl)phenylphosphine oxide (monomer M7 of the formula (3))

a) Synthesis of bis(4-bromophenyl)phenylphosphine

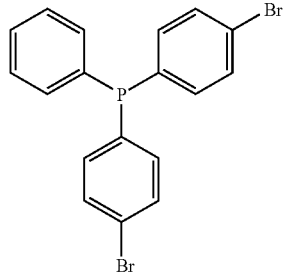

33.9 g (144 mmol) of dibromobenzene were dissolved in 300 ml of dry THF in a dry 1000 ml four-necked flask with internal thermometer, stirrer bar, argon blanket and 2 dropping funnels and cooled to −70° C. 90 ml (144 mmol) of n-butyllithium (1.6 M in hexane) were added dropwise over the course of 30 min., and the mixture was stirred at this temperature for a further 1 h. 12.9 g (9.75 ml, 72 mmol) of dichlorophenylphosphine in 60 ml of dry THF were then added dropwise at this temperature. The mixture was allowed to come to room temperature overnight. 20 ml of methanol were added, and the batch was evaporated to dryness. The residue was taken up in dichloromethane, filtered, and the solvent was removed under reduced pressure. The compound was employed for the following reaction without further purification.

b) Synthesis of bis(4-bromophenyl)phenylphosphine oxide (monomer M7)

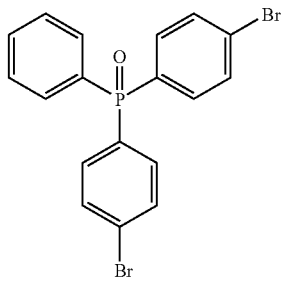

10.05 g (24 mmol) of bis(4-bromophenyl)phenylphosphine were dissolved in 200 ml of ethyl acetate in a 500 ml four-necked flask with internal thermometer, mechanical stirrer, reflux condenser and dropping funnel and cooled to an internal temperature of 5° C. A solution of 2.25 ml (26.4 mmol) of $H_2O_2$ (35%) in 17.5 ml of water was added dropwise over the course of 30 min., and the mixture was stirred at room temperature for a further 12 h. 25 ml of saturated sodium sulfite solution were subsequently added, the organic phase was separated off, washed twice with saturated sodium sulfite solution and dried over sodium sulfate. The solvent was removed under reduced pressure. The purification was carried out firstly by column chromatography on silica using a solvent mixture of initially hexane:ethyl acetate 2:1 to hexane:ethyl acetate 1:1. Further purification was carried out by recrystallisation from heptane/toluene, giving 6.5 g of product in a purity of 99.7% (according to HPLC). $^1$H-NMR (500 MHz, $CDCl_3$): [ppm] 7.46-7.66 (m). $^{31}$P-NMR ($CDCl_3$): [ppm] 28.40.

Example 4

Synthesis of 2,7-dibromo-9-keto-10-(2-ethylhexyl)-10-methoxydihydrophenanthrene (monomer M9 of the formula (1))

a) Synthesis of 2,7-dibromo-9-keto-10-(2-ethylhexyl)-10-hydroxydihydrophenanthrene

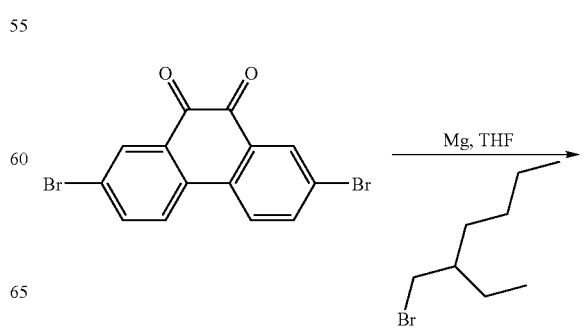

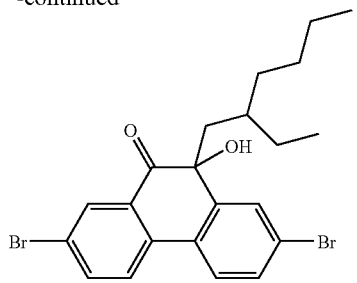

4.6 g (185 mmol) of magnesium were introduced into a 500 ml four-necked flask with reflux condenser, mechanical stirrer, internal thermometer, argon blanket and dropping funnel. The apparatus was dried by heating, a grain of iodine was added, then 37.6 ml (185 mmol) of ethylhexyl bromide in 175 ml of absolute THF were added dropwise. The mixture was heated under reflux until all the magnesium was consumed. After cooling to room temperature, the Grignard solution was transferred into a dropping funnel. 45 g (123 mmol) of dibromophenanthrenequinone were suspended at 0° C. in 300 ml of THF in a 1000 ml four-necked flask with mechanical stirrer, internal thermometer, reflux condenser, dropping funnel and argon blanket. The Grignard solution was added dropwise to this suspension at such a rate that the internal temperature did not exceed 25° C. The mixture was subsequently stirred overnight at room temperature. 200 ml of saturated $NH_4Cl$ soln. were added to the batch. Ethyl acetate was added, the mixture was extracted twice with saturated NaCl soln. and dried over $Na_2SO_4$, and the solvent was removed. The residue was boiled up in 250 ml of hexane, the green solid was filtered off, and the product was crystallised out. The yield was 39.3 g (67% of theory). $^1$H-NMR (CDCl$_3$): [ppm]=8.03 (m, 1H), 7.91 (m, 1H), 7.78 (m, 2H), 7.62 (m, 1H), 7.52 (m, 1H), 3.91. (s, exchangeable with D$_2$O, 1H), 1.72 (m, 2H), 1.33 (m, 1H), 1.10 (m, 8H), 0.81 (m, 3H), 0.65 (m, 3H).

b) Synthesis of 2,7-dibromo-9-keto-10-(2-ethylhexyl)-10-methoxydihydrophenanthrene (monomer M9)

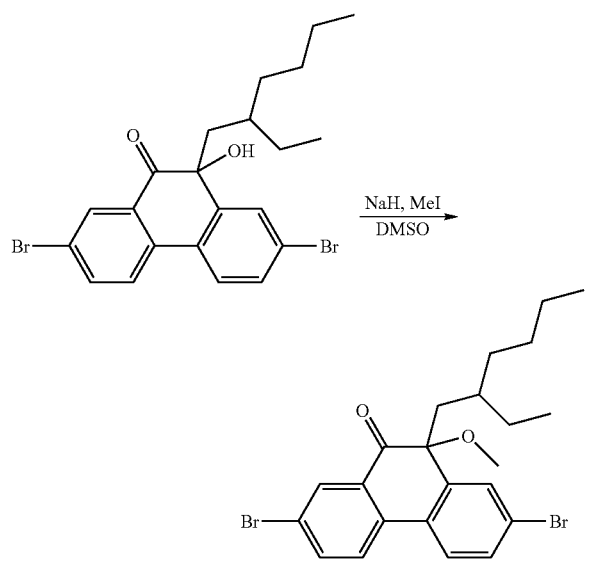

3.3 g (81.5 mmol) of NaH (60% dispersion in mineral oil) in 30 ml of DMSO were introduced into a 500 ml four-necked flask with mechanical stirrer, condenser, thermometer and dropping funnel which had been dried by heating. 21.6 g (54.3 mmol) of 2,7-dibromo-9-keto-10-(2-ethylhexyl)-10-hydroxydihydrophenanthrene in 60 ml of DMSO were slowly added dropwise, and the mixture was stirred at room temperature for 30 min. 5.1 ml (81.5 mmol) of methyl iodide were then added dropwise over the course of 1 h with ice cooling. The mixture was stirred at room temperature for 2-days, then cooled to 5° C., 90 ml of semi-conc. NH$_4$OH were added dropwise, 100 ml of MeOH were added dropwise, the mixture was stirred in an ice bath for 30 min, and the product was filtered off with suction, washed with MeOH and dried at 60° C. in a vacuum drying cabinet. The crude product was recrystallised a number of times from methanol. The total yield was 17.3 g (65% of theory) with a purity of >99.8%. $^1$H-NMR (CDCl$_3$): [ppm]=8.16 (d, $^4J_{HH}$=2.3 Hz, 1H), 7.78 (m, 4H), 7.56 (dd, $^3J_{HH}$=8.7 Hz, $^4J_{HH}$=2.3 Hz, 2H), 3.17 (s, 3H), 1.71 (m, 2H), 1.26 (m, 1H), 1.06 (m, 8H), 0.77 (m, 3H), 0.59 (m, 3H).

Example 5

Synthesis of 2,7-dibromo-9-keto-10,10-bis(4-tert-butylphenyl)dihydrophenanthrene (monomer M10 of the formula (1))

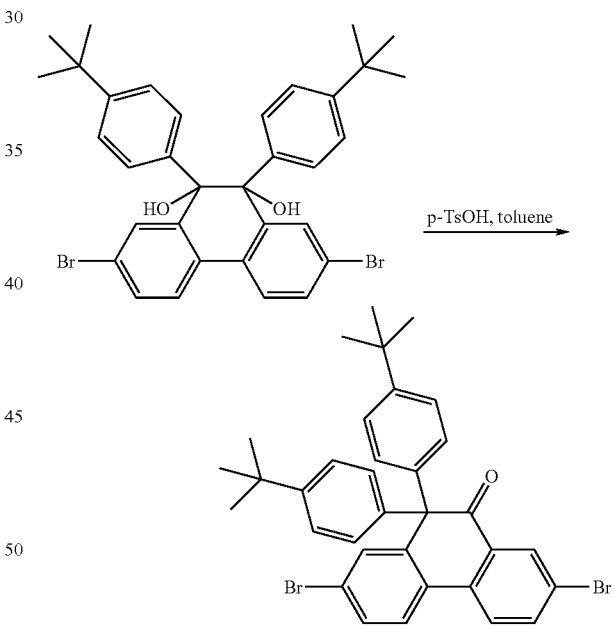

200 mg of para-toluenesulfonic acid and 10 g (15.8 mmol) of 2,7-dibromo-9,10-bis(4-tert-butylphenyl)-9,10-dihydroxydihydrophenanthrene were suspended in 80 ml of toluene in a 250 ml round-bottomed flask with magnetic stirrer and water separator with condenser and boiled on the water separator for 3 h. The precipitate was filtered off with suction, washed with methanol, recrystallised twice from toluene and dried under reduced pressure. The yield was 6.3 g (65% of theory) with a purity of >99.9%. $^1$H-NMR (CDCl$_3$): [ppm]= 8.06 (d, $^4J_{HH}$=2.0 Hz, 1H), 7.80 (d, $^3J_{HH}$=8.7 Hz, 1H), 7.73 (d, $^3J_{HH}$=8.7 Hz, 1H), 7.68 (dd, $^3J_{HH}$=8.4 Hz, $^4J_{HH}$=2.0 Hz, 1H), 7.55 (dd, $^3J_{HH}$=8.3 Hz, $^4J_{HH}$=2.0 Hz, 1H), 7.26 (m, 4H), 6.91 (d, $^4J_{HH}$=2.0 Hz, 1H), 6.83 (m, 4H), 1.26 (s, 18H).

Example 6

Blend Constituents V1 and V2 (COMP1 of the Formula (1))

As blend constituent V1, use was made by way of example of the following ketone, the synthesis of which has already been described in DE 10317556.3:

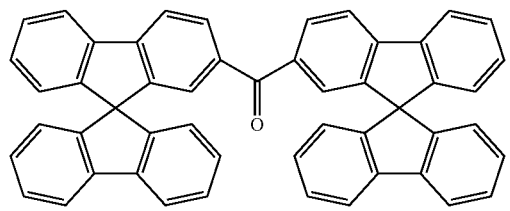

V1

As blend constituent V2, use was made by way of example of the following phosphine oxide, the synthesis of which is described in DE 10330761.3:

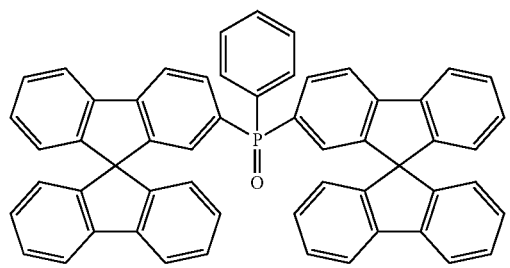

V2

Example 7

Structural Units TRIP1 for Use in Blends

The compounds TRIP1 used here by way of example are derivatives of tris(phenylpyridyl)iridium(III). The synthesis of these compounds has already been described in WO 02/081488 and WO 04/026886. For clarity, the iridium complexes used here are depicted again below:

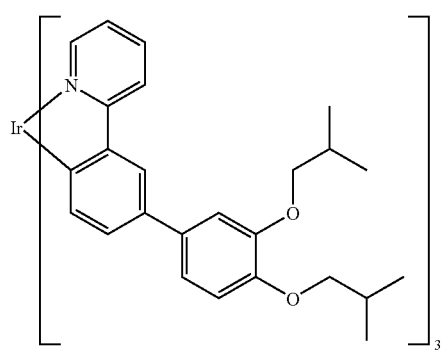

Ir1

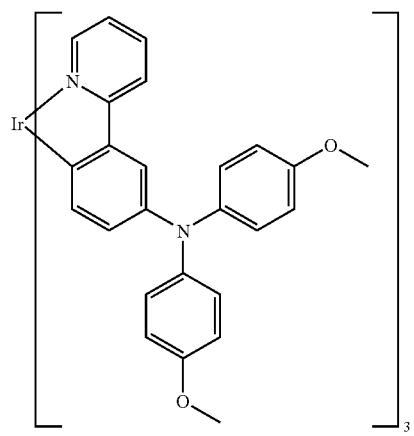

Ir2

Ir3

Example 8

Further Blend Constituents

As further blend constituents, use was made of the spirotriarylamine derivative amine1 and the spirooxadiazole derivative Ox1, the structures of which are shown below:

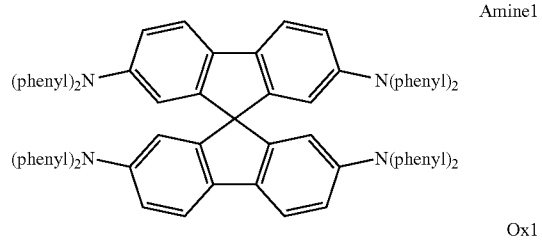

Amine1

Ox1

Example 9

Synthesis of Conjugated Polymers POLY3

The synthesis of conjugated polymers POLY3 which contain no units of the formula (1) to (5) and no compounds TRIP2 has already been described, for example, in the application specifications WO 02/077060, WO 03/020790 and WO 04/070772.

Example 10

Synthesis of Polymer P1

The synthesis was carried out in accordance with the process described in WO 03/048224. The following were employed: 1.6013 g (2 mmol) of monomer M1, 0.8118 g (1.2 mmol) of monomer M2, 0.3035 g (0.4 mmol) of monomer M5, 0.1744 g (0.4 mmol) of monomer M7 and 2.03 g (2.2 equivalents) of potassium phosphate hydrate in 19 ml of dioxane, 6 ml of toluene and 12 ml of $H_2O$. The following were used as catalyst: 0.45 mg of $Pd(OAc)_2$ and 3.65 mg of $P(o\text{-tolyl})_3$. Work-up gave 1.57 g of polymer having a molecular weight $M_n$ of 58,000 g/mol and $M_w$ of 185,000 g/mol (GPC in THF using polystyrene standard).

Example 11

Synthesis of Polymer P2

The synthesis was carried out in accordance with the process described in WO 03/048224. The following were employed: 1.2889 g (2 mmol) of monomer M3, 0.7951 g (1.2 mmol) of monomer M4, 0.3035 g (0.4 mmol) of monomer M5, 0.1360 g (0.4 mmol) of monomer M6 and 2.03 g (2.2 equivalents) of potassium phosphate hydrate in 19 ml of dioxane, 6 ml of toluene and 12 ml of $H_2O$. The following were used as catalyst: 0.45 mg of $Pd(OAc)_2$ and 3.65 mg of $P(o\text{-tolyl})_3$. Work-up gave 1.72 g of polymer having a molecular weight $M_n$ of 87,000 g/mol and $M_w$ of 219,000 g/mol (GPC in THF using polystyrene standard).

Example 12

Non-Conjugated Polymers (POLY1) P6 and P7

Polystyrene P6 having a melt flow index of 7.5 was purchased commercially from Aldrich. The synthesis of poly (vinylbenzophenone) P7 was carried out in accordance with *Helv. Chim. Acta* 1999, 82, 338-346.

Example 13

Preparation of the Blends

The mixtures were prepared by dissolving the blend constituents in the desired ratio and in the desired concentration in toluene. The dissolution process was carried out at 60° C. in an inert atmosphere. The solution was processed directly without isolation of the mixture (re-precipitation of the solid components).

Example 14

Production of the Polymeric Light-Emitting Diodes (PLEDs)

The way in which PLEDs can be produced is described in detail, for example, in WO 04/037887 and the literature cited therein. It has been found here that the polymers and blends according to the invention form more homogeneous films than the polymers and blends in accordance with the prior art. Without wishing to be tied to a particular theory, we assume that this is due to the better solubility of these compounds.

Example 15

Overview of the Polymers Synthesised and Used

Table 1 gives an overview of the composition of some of the polymers synthesised and used in the devices.

TABLE 1

Overview of the composition of some polymers

| Polymer | Monomers | | | |
|---|---|---|---|---|
| P1 | 50% of M1 | 30% of M2 | 10% of M5 | 10% of M7 |
| P2 | 50% of M1 | 30% of M8 | 10% of M5 | 10% of M7 |
| P3 | 50% of M1 | 30% of M2 | 10% of M5 | 10% of M6 |
| P4 | 50% of M1 | 30% of M2 | 10% of M5 | 10% of M9 |
| P5 | 50% of M1 | 50% of M6 | | |
| P6 | 50% of M1 | 50% of M7 | | |
| P7 | polystyrene | | | |

Example 16

Device Examples

Table 2 gives an overview of various blends of polymers and triplet emitters, optionally with further components.

TABLE 2

Some device results with blends according to the invention

| Blend | Polymer[a] | Triplet emitter[b] | Further constituents[a] | Max. eff. | U @ 100 cd/m² | CIE x/y[c] | Lifetime[d] |
|---|---|---|---|---|---|---|---|
| Blend 1 a) | P1 | 20% of Ir2 | | 13.55 cd/A | 5.0 V | 0.62/0.38 | 1000 h |
| Blend 1 b) | P1 | 8% of Ir3 | | 3.69 cd/A | 5.0 V | 0.68/0.32 | 710 h |
| Blend 2 a) | P2 | 20% of Ir2 | | 10.56 cd/A | 4.4 V | 0.62/0.38 | 5900 h |
| Blend 2 b) | P2 | 8% of Ir3 | | 4.13 cd/A | 4.5 V | 0.68/0.32 | 1140 h |
| Blend 3 | P3 | 8% of Ir2 | | 8.79 cd/A | 5.8 V | 0.68/0.32 | 830 h |
| Blend 4 | P4 | 20% of Ir2 | | 5.89 cd/A | 6.5 V | 0.62/0.38 | 2500 h |
| Blend 5 | P5 | 8% of Ir3 | | 3.08 cd/A | 5.7 V | 0.68/0.32 | 480 h |
| Blend 6 a) | P6 | 8% of Ir1 | | 7.49 cd/A | 6.0 V | 0.42/0.56 | 420 h |
| Blend 6 b) | P6 | 20% of Ir1 | | 20.0 cd/A | 4.5 V | 0.40/0.58 | 2000 h |
| Blend 6 c) | P6 | 20% of Ir2 | | 6.51 cd/A | 5.7 V | 0.62/0.38 | >10000 h |

TABLE 2-continued

Some device results with blends according to the invention

| Blend | Polymer[a] | Triplet emitter[b] | Further constituents[a] | Max. eff. | U @ 100 cd/m² | CIE x/y[c] | Lifetime[d] |
|---|---|---|---|---|---|---|---|
| Blend 7 a) | 30% of P7 | 8% of Ir1 | 30% of V1<br>20% of V2<br>20% of amine1 | 26.78 cd/A | 4.7 V | 0.41/0.57 | 2800 h |
| Blend 7 b) | 30% of P7 | 8% of Ir1 | 30% of V1<br>20% of amine1<br>20% of Ox1 | 27.40 cd/A | 4.1 V | 0.38/0.59 | not stated |

[a]The proportion of the polymer or the further blend constituents is based on the total composition of all constituents apart from the triplet emitter.
[b]The proportion of the triplet emitter is based on the matrix, i.e. the polymer or the mixture of the polymer with the other constituents.
[c]CIE coordinates: chromaticity coordinates of the Commission Internationale de l'Eclairage from 1931.
[d]The stated lifetime is based on the so-called LT50 value, i.e. the time which passes until the corresponding PLED only has 50% of the initial brightness; the values were determined with an initial brightness of 100 cd/m².

The invention claimed is:

1. An organic semiconductor comprising
(A) at least one non-conjugated polymer,
(B) at least one structural unit L=X, where the following applies to the symbols used:
L is on each occurrence, identically or differently, $(R^1)(R^2)$C, $(R^1)P$, $(R^1)As$, $(R^1)Sb$, $(R^1)Bi$, $(R^1)(R^2)(R^3)P$, $(R^1)(R^2)(R^3)As$, $(R^1)(R^2)(R^3)Sb$, $(R^1)(R^2)(R^3)Bi$, $(R^1)(R^2)S$, $(R^1)(R^2)Se$, $(R^1)(R^2)Te$, $(R^1)(R^2)S(=O)$, $(R^1)(R^2)Se(=O)$ or $(R^1)(R^2)Te(=O)$;
X is on each occurrence, identically or differently, O, S, Se or N—$R^4$, with the proviso that X is not S or Se if L stands for S, Se or Te;
$R^1$, $R^2$, $R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent $CH_2$ groups may be replaced by —$R^6C=CR^6$—, —C≡C—, $Si(R^6)_2$, $Ge(R^6)_2$, $Sn(R^6)_2$, C=O, C=S, C=Se, C=$NR^6$, —O—, or —S— and where one or more H atoms are optionally replaced by F, Cl, Br, I, CN or $NO_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;
$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6C=CR^6$, —C≡C—, $Si(R^6)_2$, $Ge(R^6)_2$, $Sn(R^6)_2$, —$NR^6$—, —O—, —S—, —CO—O—, —O—CO—O—, where, in addition, one or more H atoms replaced by fluorine, an aryl, heteroaryl or aryloxy group having 1 to 40 C atoms, which is optionally substituted by one or more radicals $R^6$, or OH or $N(R^5)_2$;
$R^5$ is on each occurrence, identically or differently, $R^4$ or CN, $B(R^6)_2$ or $Si(R^6)_3$,
$R^6$ is on each occurrence, identically or differently, H or an aliphatic or aromatic hydrocarbon radical having 1 to 20 C atoms; and
(C) at least one triplet emitter;
with the proviso that mixtures of two polymers in which the first polymer contains covalently bonded triplet emitters and the other is a copolymer comprising TPD units and diphenyl sulfone ether or diphenyl ketone ether units are excluded; and furthermore with the proviso that polymers containing on the one hand covalently bonded triplet emitters and on the other hand units of the formula (a) are excluded from the invention:

formula (a)

in which $Ar^1$ and $Ar^2$ each independently denote a tetravalent aromatic hydrocarbon group or a tetravalent heterocyclic group;
one of the units $X^1$ and $X^2$ denotes C(=O) or $C(R^1)(R^2)$ and the other denotes O, S, C(=O), S(=O), $SO_2$, $Si(R^3)(R^4)$, $N(R^5)$, $B(R^6)$, $P(R^7)$ or $P(=O)(R^8)$; where the radicals $R^1$, $R^2$, $R^3$, $R^4$, $R^5$, $R^6$, $R^7$ and $R^8$ in the formula (a) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an aryloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group,
M denotes a group which is represented by formula (b), formula (c) or formula (d)

formula (b)

in which $Y^1$ and $Y^2$ each independently denote O, S, C(=O), S(=O), $SO_2$, $C(R^9)(R^{10})$, $Si(R^{11})(R^{12})$, $N(R^{13})$, $B(R^{14})$, $P(R^{15})$ or $P(=O)(R^{16})$,
where the radicals $R^9$, $R^{10}$, $R^{11}$, $R^{12}$, $R^{13}$, $R^{14}$, $R^{15}$ and $R^{16}$, in the formula (b) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an acyloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group, where $Y^1$ and $Y^2$ are not identical if $Y^1$ is not $C(R^9)(R^{10})$ or $Si(R^{11})(R^{12})$.]

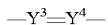      formula (c)

in which $Y^3$ and $Y^4$ each independently denote N, B, P, $C(R^{17})$ or $Si(R^{18})$;

the radicals $R^{17}$ and $R^{18}$ in the formula (c) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an acyloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group;

      formula (d)

in which $Y^5$ denotes O, S, C(=O), S(=O), $SO_2$, $C(R^{19})(R^{20})$, $Si(R^{21})(R^{22})$, $N(R^{23})$, $B(R^{24})$, $P(R^{25})$ or P(=O)(R);

where the radicals $R^{19}$, $R^{20}$, $R^{21}$, $R^{22}$, $R^{23}$, $R^{24}$, $R^{25}$ and $R^{26}$ in the formula (d) each independently denote a hydrogen atom, a halogen atom, an alkyl group, an alkoxy group, an alkylthio group, an alkylamino group, an aryl group, an aryloxy group, an arylthio group, an arylamino group, an arylalkyl group, an arylalkoxy group, an arylalkylthio group, an arylalkylamino group, an acyl group, an acyloxy group, an amide group, an imine group, a substituted silyl group, a substituted silyloxy group, a substituted silylthio group, a substituted silylamino group, a monovalent heterocyclic group, an arylalkenyl group, an arylethynyl group or a cyano group;

$Z_1$ denotes $-CR^{36}=CR^{37}-$ or $-C\equiv C-$; $R^{36}$ and $R^{37}$ each independently denote a hydrogen atom, an alkyl group, an aryl group, a monovalent heterocyclic group or a cyano group; d denotes 0 or 1.

2. The organic semiconductor according to claim 1, wherein the structural units L=X are selected from the formulae (1) to (5)

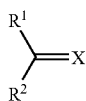      formula (1)

      formula (2)

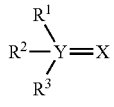      formula (3)

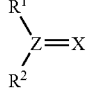      formula (4)

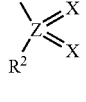      formula (5)

where the symbols used have the following meaning:

X is on each occurrence, identically or differently, O, S, Se or $N-R^4$, with the proviso that X cannot be S or Se for formulae (4) and (5);

Y is on each occurrence, identically or differently, P, As, Sb or Bi;

Z is on each occurrence, identically or differently, S, Se or Te;

$R^1$ $R^6$, have the same meaning as described under claim 1.

3. The organic semiconductor according to claim 2, wherein they comprise at least 0.5% by weight of at least one non-conjugated polymer, at least 1% by weight of at least one structural unit L=X or a structural unit of the formulae (1) to (5) and at least 0.1% by weight of at least one triplet emitter.

4. The organic semiconductor according to claim 2, wherein the at least one polymer is a polymer (POLY1 to POLY4) wherein (POLY1) comprises 1-100 mol % of one or more recurring units (MONO1) containing at least one structural unit L=X or at least one structural unit of the formula (1) to (5);

(POLY2) comprises 0.5-99.5 mol % of one or more triplet emitters (TRIP2) covalently bonded;

(POLY3) is at least one non-conjugated polymer;

(POLY4) comprising (A) 1-99.9 mol % of one or more recurring units MONO1 containing at least one structural unit L=X, where symbols L, X, $R^1$, $R^2$, $R^3$, $R^4$, $R^5$ and $R^6$ have the same meaning as described under claim 1;

(B) 0.1-95 mol % of one or more triplet emitters TRIP2.

5. The organic semiconductor according to claim 4, wherein the polymers POLY1 to POLY4 contain further structural elements of at least group 1 to group 4 group 1: units which significantly increase the hole injection or transport properties of the polymers;

group 2: units which significantly increase the electron injection or transport properties of the polymers;

group 3: units which comprise combinations of individual units of group 1 and group 2;

group 4: units which alter the emission characteristics so that phosphorescence can be obtained instead of fluorescence.

6. The organic semiconductor as claimed in claim 5, wherein group 1 is a compound of the formulae (II)-(XIX)

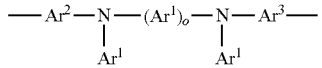      formula (II)

      formula (III)

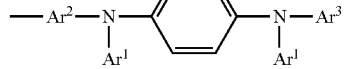      formula (IV)

      formula (V)

-continued

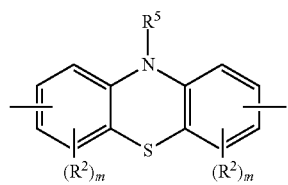
formula (VI)

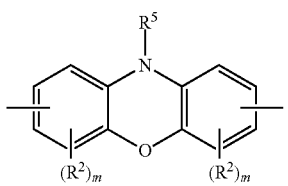
formula (VII)

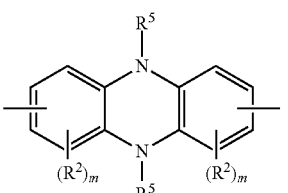
formula (VIII)

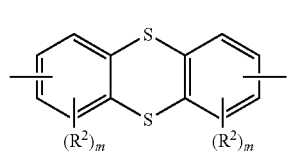
formula (IX)

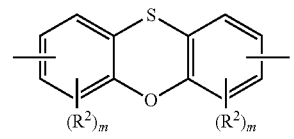
formula (X)

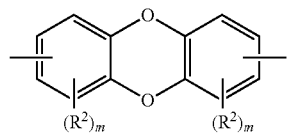
formula (XI)

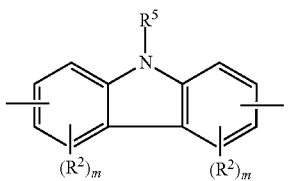
formula (XII)

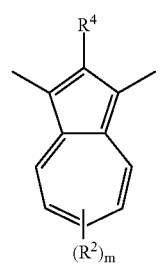
formula (XIII)

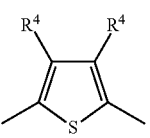
formula (XIV)

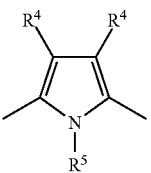
formula (XV)

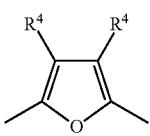
formula (XVI)

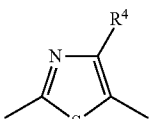
formula (XVII)

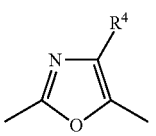
formula (XVIII)

formula (XIX)

wherein $R^1$ is identical or different on each occurrence and is in each case a linear, branched or cyclic alkyl or alkoxy chain which has from 1 to 22 carbon atoms and in which one or more nonadjacent carbon atoms may also be replaced by N—$R^5$, O, S, —CO—O—, O—CO—O, where one or more H atoms may also be replaced by fluorine, or is an aryl or aryloxy group which has from 5 to 40 carbon atoms and in which one or more carbon atoms may also be replaced by O, S or N, which may also be substituted by one or more nonaromatic radicals $R^1$, or is Cl, F, CN, $N(R^5)_2$, $N(R^5)_3^+$, where two or more radicals $R^1$ may also together form a ring system;

$R^2$ is identical or different on each occurrence and is in each case a linear, branched or cyclic alkyl or alkoxy chain which has from 1 to 22 carbon atoms and in which one or more nonadjacent carbon atoms may also be replaced by N—$R^5$, O, S, —CO—O—, O—CO—O, where one or more H atoms may also be replaced by fluorine, or is an aryl or aryloxy group which has from 5 to 40 carbon atoms and in which one or more carbon atoms may also be replaced by O, S or N which may also be substituted by one or more nonaromatic radicals $R^1$, or is CN;

$R^4$ and $R^3$ is identical or different on each occurrence and are each H, a linear, branched or cyclic alkyl chain which has from 1 to 22 carbon atoms and in which one or more nonadjacent carbon atoms may also be replaced by N—$R^5$, O, S, —CO—O—, O—CO—O, where one or more H atoms may also be replaced by fluorine, or are each an aryl group which has from 5 to 40 carbon atoms and in which one or more carbon atoms may also be replaced by O, S or N, which may also be substituted by one or more nonaromatic radicals $R^1$, or are each CN; where a plurality of adjacent radicals $R^3$ and/or $R^4$ may together also form a ring;

R⁵ is identical or different on each occurrence and is in each case H, a linear, branched or cyclic alkyl chain which has from 1 to 22 carbon atoms and in which one or more nonadjacent carbon atoms may also be replaced by O, S, —CO—O—, O—CO—O, where one or more H atoms may also be replaced by fluorine, or is an aryl group which has from 5 to 40 carbon atoms and in which one or more carbon atoms may also be replaced by O, S or N, which may also be substituted by one or more nonaromatic radicals R';

m is identical or different on each occurrence and is in each case 0, 1, 2, or 3;

n is identical or different on each occurrence and is in each case 0, 1, 2, 3 or 4, Ar¹, Ar², Ar³ are identical or different on each occurrence and are aromatic or heteroaromatic hydrocarbons which have from 2 to 40 carbon atoms and may be substituted by one or more nonaromatic radicals R¹;

o is 1, 2 or 3, and group 2 is a compound of the formulae (XX) to (XXX),

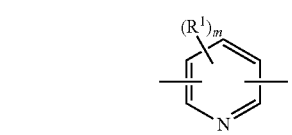
formula (XX)

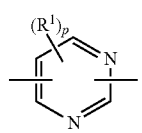
formula (XXI)

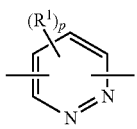
formula (XXII)

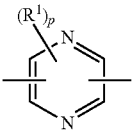
formula (XXIII)

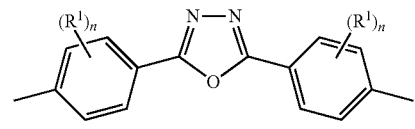
formula (XXIV)

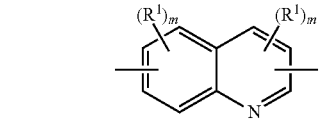
formula (XXV)

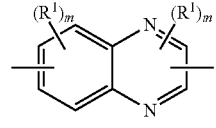
formula (XXVI)

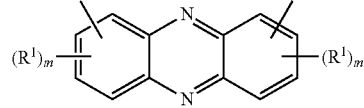
formula (XXVII)

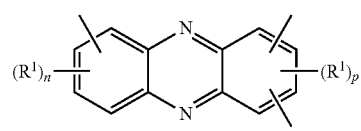
formula (XXVIII)

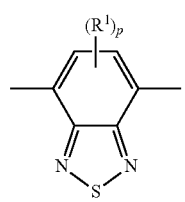
formula (XXIX)

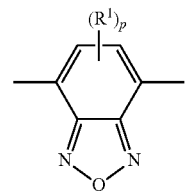
formula (XXX)

where the symbols R¹ and indices m and n are as defined above and p is 0, 1 or 2, and group 3 is a compound of the formulae (XXXI) to (XXXXVI),

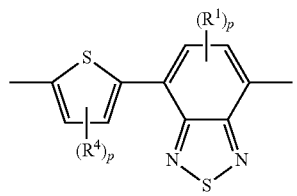
formula (XXXI)

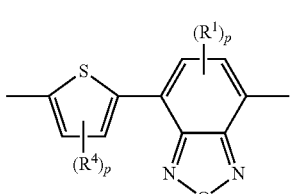
formula (XXXII)

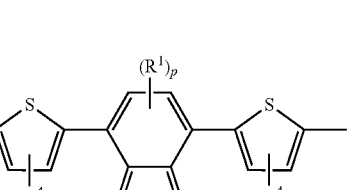
formula (XXXIII)

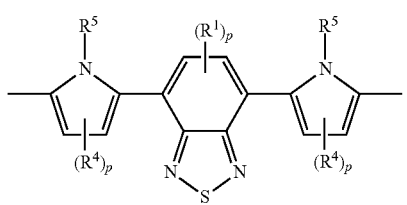
formula (XXXIV)

formula (XXXV)

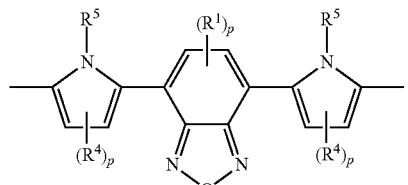

formula (XXXVI)

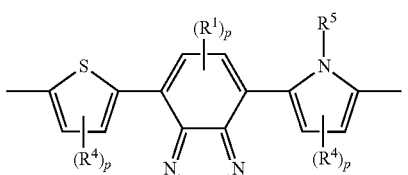

formula (XXXVII)

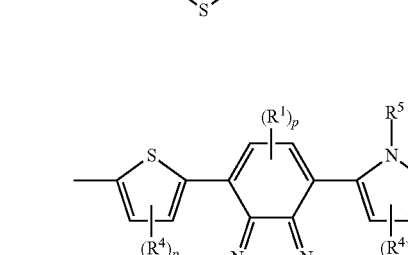

formula (XXXVIII)

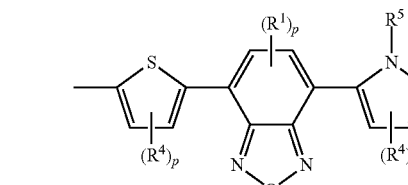

formula (XXXIX)

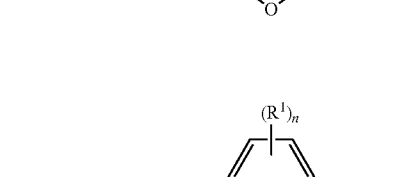

formula (XXXX)

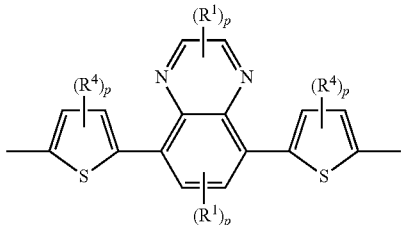

formula XXXXI

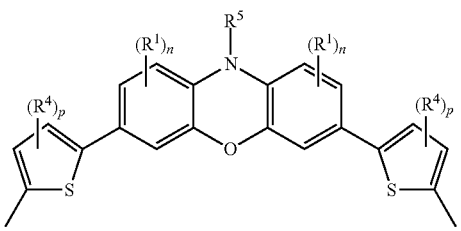

XXXXI

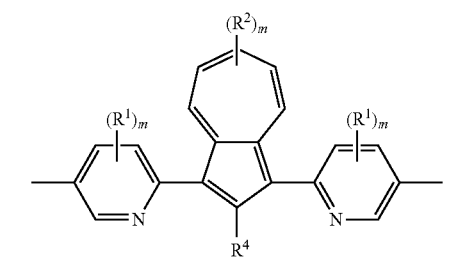

formula (XXXXIII)

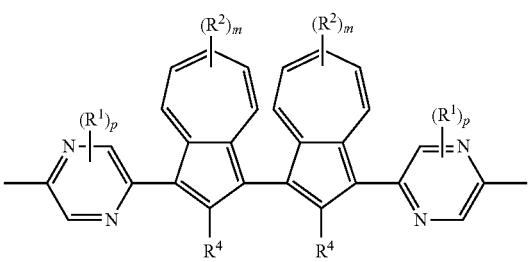

formula (XXXXIV)

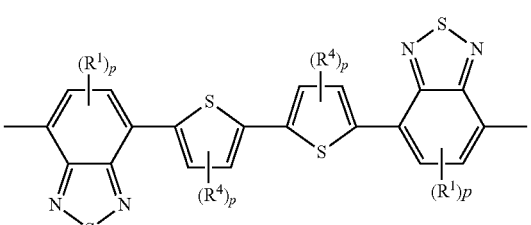

formula (XXXXV)

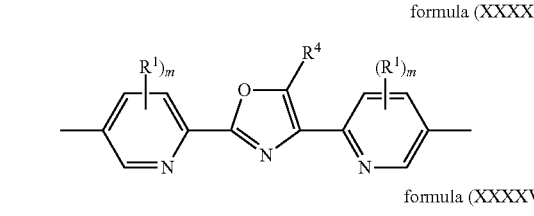

formula (XXXXVI)

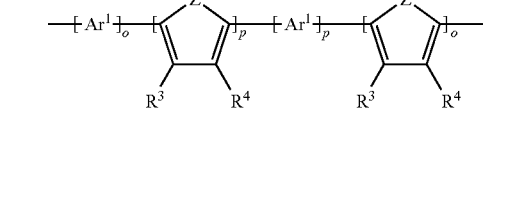

where the symbols $Ar^1$, $R^1$, $R^2$, $R^3$, $R^4$, $R^5$ and the indices m, n, o and p are as defined above and Z is identical or different on each occurrence and is in each case a single chemical bond, a $CR^3R^4$ group, a —$CR^3R^4$—$CR^3R^4$— group, a —$CR^3$=$CR^4$— group, O, S, N—$R^5$, C=O, C=$CR^3R^4$ or $SiR^3R^4$;

and group 4 is a compound of the formulae (XXXXVII) to (XXXXX),

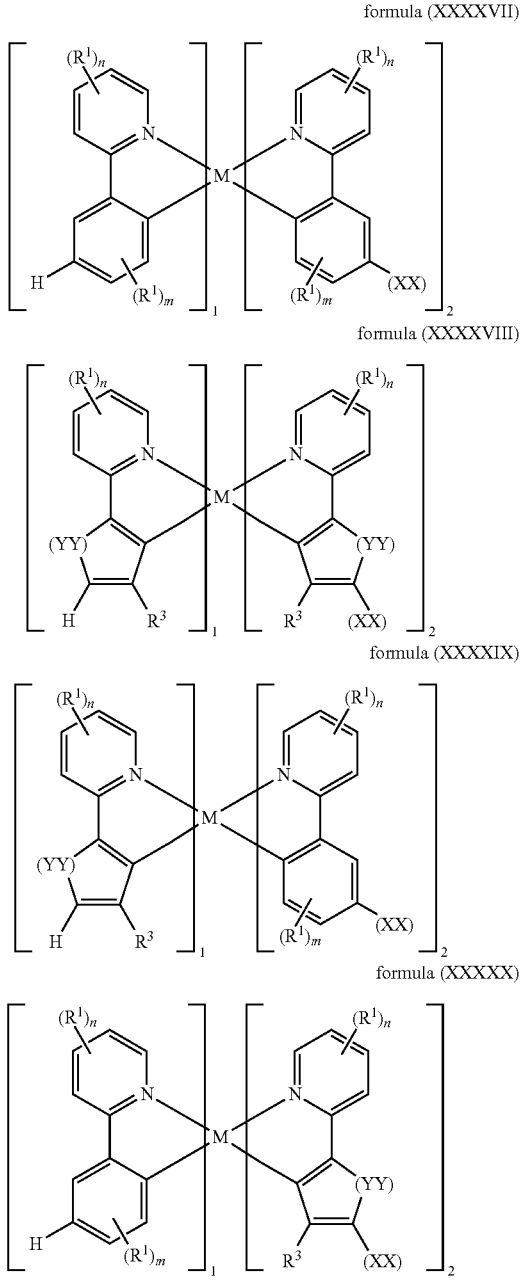

formula (XXXXVII)

formula (XXXXVIII)

formula (XXXXIX)

formula (XXXXX)

where the symbols $R^1$, $R^3$ and the indices m and n are as defined above and
M is Rh or Ir
XX corresponds to the point of linkage in the polymer,
YY is identical or different on each occurrence and is in each case O, S or Se.

7. The organic semiconductor according to claim 2, wherein the following applies to the symbols of the formulae (1) to (5):
X stands for O, S or N—$R^4$;
Y stands for P or As;
Z stands for S or Se;
where at least one of the substituents $R^1$ to $R^3$ on each structural unit of the formula (1) to (5) represents an aromatic or heteroaromatic ring system having 1 to 40 C atoms, which may be substituted by one or more substituents $R^4$ or unsubstituted.

8. The organic semiconductor according to claim 7, wherein applies to the symbols of the formulae (1) to (5):
X stands for O or N—$R^4$;
Y stands for P;
Z stands for S;
where all substituents $R^1$ to $R^3$ on each structural unit of the formula (1) to (5) represent an aromatic or heteroaromatic ring system having 1 to 40 C atoms, which may be substituted by one or more substituents $R^4$ or unsubstituted.

9. The organic semiconductor according to claim 2, wherein the total proportion of structural units of the formula (1) to (5) is 10-50 mol %.

10. The organic semiconductor according to claim 1, wherein at least one of the radicals $R^1$ to $R^3$ contains a 9,9'-spirobifluorene.

11. The organic semiconductor according to claim 1, wherein the polymers are selected from the classes of the aromatic polyketones, aromatic polyphosphine oxides or aromatic polysulfones, each of which may also be substituted for better solubility, the polycarboxylic acid derivatives, main-chain polyesters, side-chain polyesters, poly(glycolic acids), poly(lactic acids), poly(ε-caprolactones), polyacrylates, poly(hydroxybenzoic acids), poly(alkylene terephthalates), polycarboxylic anhydrides, polyamides, poly(ε-caprolactams), polypeptides, polyaramids, polybenzamides, polyimides, poly(amide-imides), poly(ester-imides), poly(ether-imides), polycarbonates, poly (ester-co-carbonates), poly(isocyanurates), polyurethanes, polyester-polyurethanes, poly(terephthalates), poly(acrylates), poly(phenyl acrylates), poly(cyanoacrylates), poly(vinyl esters), poly(vinyl acetates), side-chain polyphosphine oxides, polyether ketones (PEK), polyether sulfones, poly-sulfonamides, polysulfonimides, poly(vinyl ketones), aromatic polyvinyl ketones, substituted or unsubstituted poly(vinylbenzophenones), polystyrene-analogous ketones, polycarbazenes, polynitriles, polyisonitriles, polystyrene, PVK (polyvinylcarbazole) or derivatives thereof.

12. The organic semiconductor according to claim 1, wherein the triplet emitters contain atoms from the Periodic Table of the Elements having an atomic number of greater than 36.

13. The organic semiconductor according to claim 12, wherein the triplet emitters contain d or f transition metals.

14. The organic semiconductor according to claim 13, wherein the triplet emitters contain metals from group 8 to 10.

15. The organic semiconductor according to claim 1, wherein further molecules, which may be of low molecular weight, oligomeric, dendritic or polymeric, are admixed with the organic semiconductors.

16. The organic semiconductor according to claim 15, wherein compounds containing structural units L=X or structural units of the formula (1) to (5) may additionally be admixed with the mixture

formula (1)

formula (2)

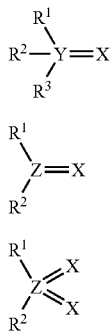

where the symbols used have the following meaning:

X is on each occurrence, identically or differently, O, S, Se or N—$R^4$, with the proviso that X cannot be S or Se for formulae (4) and (5);

Y is on each occurrence, identically or differently, P, As, Sb or Bi;

Z is on each occurrence, identically or differently, S, Se or Te;

$R^1$, $R^2$, $R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent CH$_2$ groups is optionally replaced by —$R^6$C=C$R^6$—, —C≡C—, Si($R^6$)$_2$, Ge($R^6$)$_2$, Sn($R^6$)$_2$, C=O, C=S, C=Se, C=N$R^6$, —O—, or —S—, and where one or more H atoms may be replaced by F, Cl, Br, I, CN or NO$_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6$C=C$R^6$—, —C≡C—, Si($R^6$)$_2$, Ge($R^6$)$_2$, Sn($R^6$)$_2$, —N$R^6$—, —O—, —S—, —CO—O—, —O—CO—O—, where, in addition, one or more H atoms may be replaced by fluorine, an aryl, heteroaryl or aryloxy group having 1 to 40 C atoms, which may also be substituted by one or more radicals $R^6$, or OH or N($R^5$)$_2$;

$R^5$ is on each occurrence, identically or differently, $R^4$ or CN, B($R^6$)$_2$ or Si($R^6$)$_3$, $R^6$ is on each occurrence, identically or differently, H or an aliphatic or aromatic hydrocarbon radical having 1 to 20 C atoms.

17. An electronic component which comprises one or more active layers, where at least one of these active layers comprises one or more organic semiconductors according to claim 1.

18. The electronic component according to claim 17, wherein the component is an organic light-emitting diode, an organic solar cell or an organic laser diode.

19. A mixture (BLEND1), comprising
(A) 5-99.9% by weight of at least one non-conjugated polymer (POLY1) which comprises 1-100 mol % of one or more recurring units (MONO1) containing at least one structural unit L=X or at least one structural unit of the formula (1) to (5), wherein L is on each occurrence, identically or differently, ($R^1$)($R^2$)C, ($R^1$)P, ($R^1$)As, ($R^1$)Sb, ($R^1$)Bi, ($R^1$)($R^2$)($R^3$)P, ($R^1$)($R^2$)($R^3$)As, ($R^1$)($R^2$)($R^3$)Sb, ($R^1$)($R^2$)($R^3$)Bi, ($R^1$)($R^2$)S, ($R^1$)($R^2$)Se, ($R^1$)($R^2$)Te, ($R^1$)($R^2$)S(=O), ($R^1$)($R^2$)Se(=O) or ($R^1$)($R^2$)Te(=O);

X is on each occurrence, identically or differently, O, S, Se or N—$R^4$, with the proviso that X is not S or Se if L stands for S, Se or Te;

$R^1$, $R^2$, $R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent CH$_2$ groups may be replaced by —$R^6$C=C$R^6$—, —C≡C—, Si($R^6$)$_2$, Ge($R^6$)$_2$, Sn($R^6$)$_2$, C=O, C=S, C=Se, C=N$R^6$, —O—, or —S— and where one or more H atoms are optionally replaced by F, Cl, Br, I, CN or NO$_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6$C=C$R^6$—, —C≡C—, Si($R^6$)$_2$, Ge($R^6$)$_2$, Sn($R^6$)$_2$, —N$R^6$—, —O—, —S—, —CO—O—, —O—CO—O—, where, in addition, one or more H atoms replaced by fluorine, an aryl, heteroaryl or aryloxy group having 1 to 40 C atoms, which is optionally substituted by one or more radicals $R^6$, or OH or N($R^5$)$_2$;

$R^5$ is on each occurrence, identically or differently, $R^4$ or CN, B($R^6$)$_2$ or Si($R^6$)$_3$, $R^6$ is on each occurrence, identically or differently, H or an aliphatic or aromatic hydrocarbon radical having 1 to 20 C atoms; and wherein the formulae (1) to (5) are as follows:

$$\overset{R^1}{\underset{R^2}{>}}{=}X \quad \text{formula (1)}$$

$$\overset{R^1}{\underset{}{\diagdown}}Y{=}X \quad \text{formula (2)}$$

$$\overset{R^1}{\underset{R^3}{\diagdown}}R^2{-}Y{=}X \quad \text{formula (3)}$$

$$\overset{R^1}{\underset{R^2}{>}}Z{=}X \quad \text{formula (4)}$$

-continued

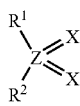
formula (5)

where the symbols used have the following meaning:
X is on each occurrence, identically or differently, O, S, Se or N—$R^4$, with the proviso that X cannot be S or Se for formulae (4) and (5);
Y is on each occurrence, identically or differently, P, As, Sb or Bi;
Z is on each occurrence, identically or differently, S, Se or Te;
$R^1$ to $R^6$ have the same meaning as described above, and
(B) 0.1-95% by weight of one or more triplet emitters (TRIP1).

20. An organic semiconductor which comprises the mixture according to claim 19, wherein the recurring units (MONO1) which contain structural elements L=X or structural elements of the formula (1) to (5) are selected from the formulae (6) to (148), which may be substituted or unsubstituted

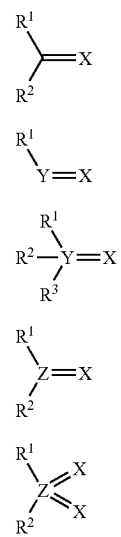

formula (1)

formula (2)

formula (3)

formula (4)

formula (5)

where the symbols used have the following meaning:
X is on each occurrence, identically or differently, O, S, Se or N—$R^4$, with the proviso that X cannot be S or Se for formulae (4) and (5);
Y is on each occurrence, identically or differently, P, As, Sb or Bi;
Z is on each occurrence, identically or differently, S, Se or Te;
$R^1$, $R^2$, $R^3$ is on each occurrence, identically or differently, H, F, CN, a straight-chain, branched or cyclic alkyl, alkoxy or thioalkoxy group having 1 to 40 C atoms, which may be substituted by $R^5$ or may also be unsubstituted, where one or more non-adjacent CH$_2$ groups may be replaced by —$R^6C$=$CR^6$—, —C≡C—, Si$(R^6)_2$, Ge$(R^6)_2$, Sn$(R^6)_2$, C=O, C=S, C=Se, C=N$R^6$, —O—, or —S—, and where one or more H atoms is optionally replaced by F, Cl, Br, I, CN or NO$_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;
$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6C$=$CR^6$—, —C≡C—, Si$(R^6)_2$, Ge$(R^6)_2$, Sn$(R^6)_2$, —N$R^6$—, —O—, —S—, —CO—O—, —O—CO—O—, where, in addition, one or more H atoms is optionally replaced by fluorine, an aryl, heteroaryl or aryloxy group having 1 to 40 C atoms, which may also be substituted by one or more radicals $R^6$, or OH or N$(R^5)_2$;
$R^5$ is on each occurrence, identically or differently, $R^4$ or CN, B$(R^6)_2$ or Si$(R^6)_3$,
$R^6$ is on each occurrence, identically or differently, H or an aliphatic or aromatic hydrocarbon radical having 1 to 20 C atoms,

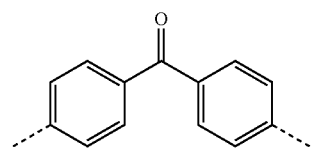
(6)

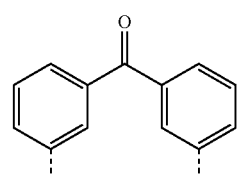
(7)

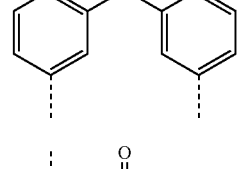
(8)

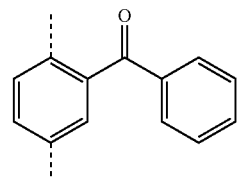
(9)

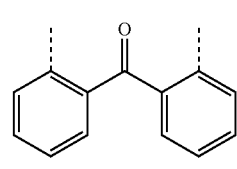
(10)

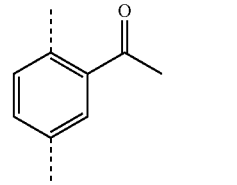
(11)

-continued
(12)
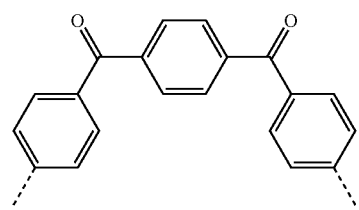
(13)
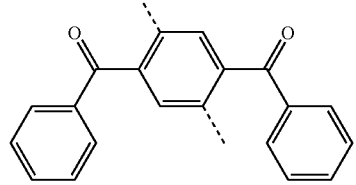
(14)
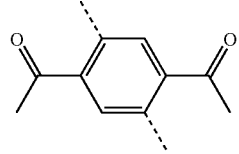
(15)
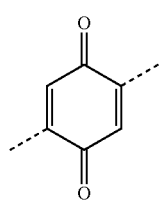
(16)
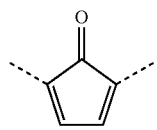
(17)
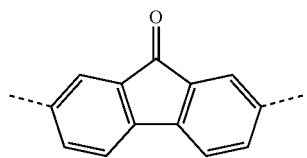
(18)
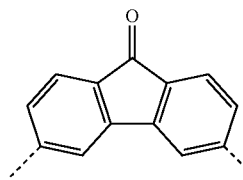
(19)
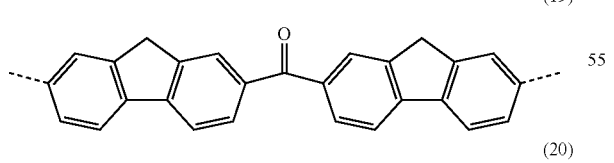
(20)
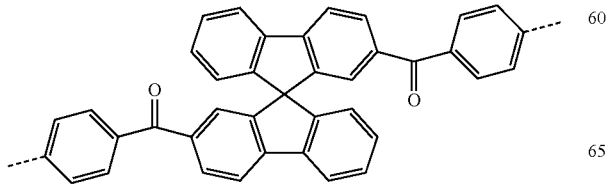
-continued
(21)
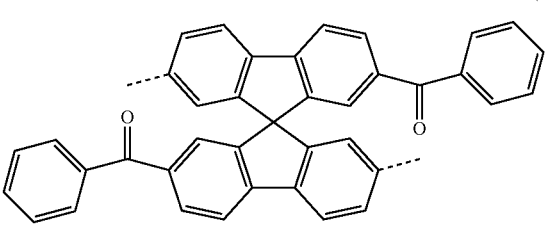
(22)
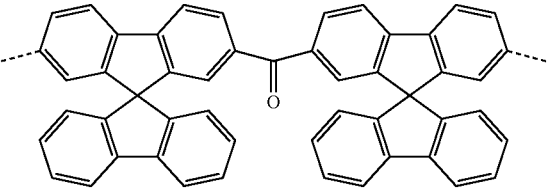
(23)
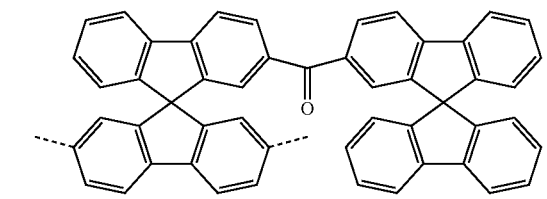
(24)
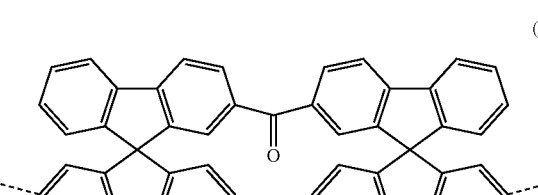
(25)
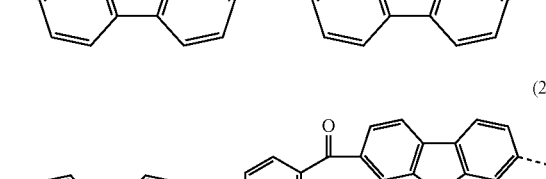
(26)
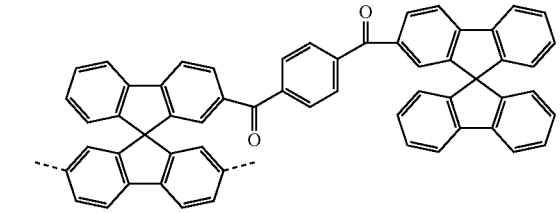
(27)
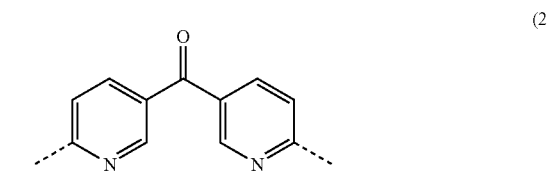

(28)
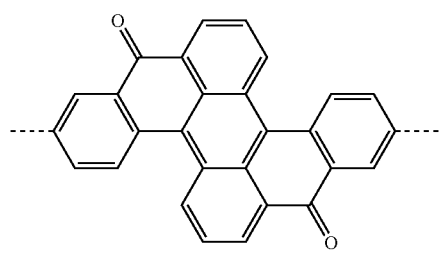
(29)
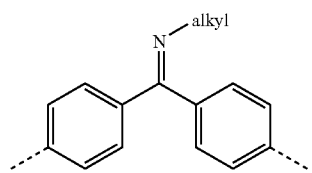
(30)
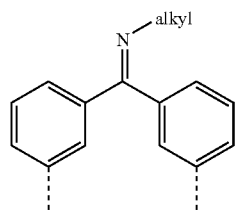
(31)
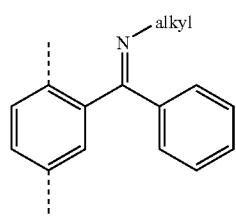
(32)
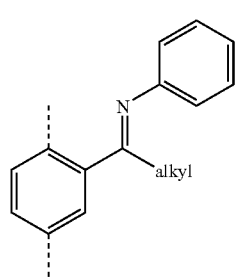
(33)
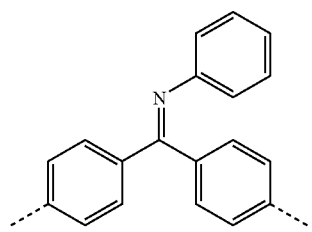
(34)
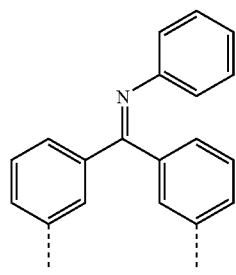
(35)
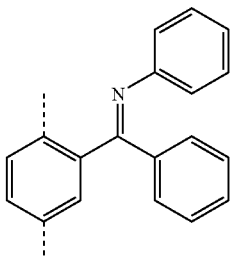
(36)
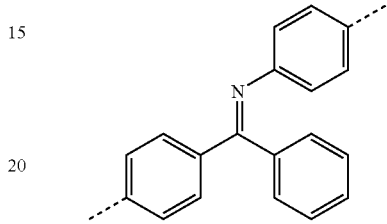
(37)
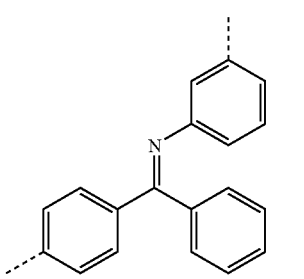
(38)
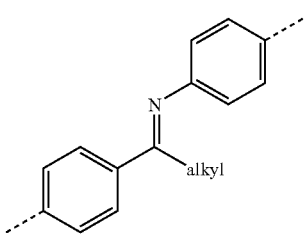
(39)
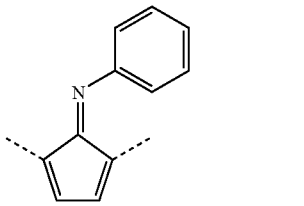
(40)
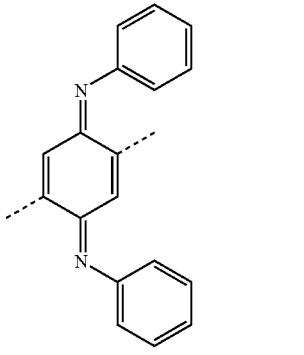

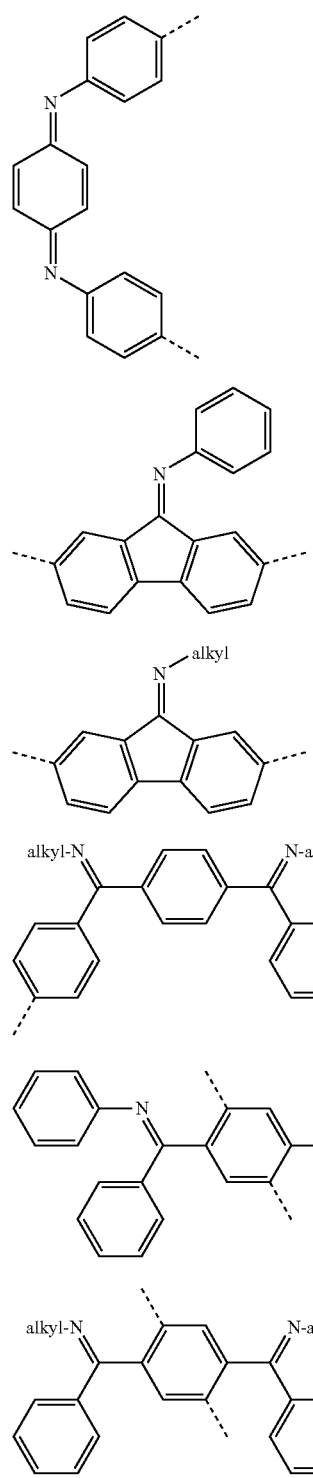
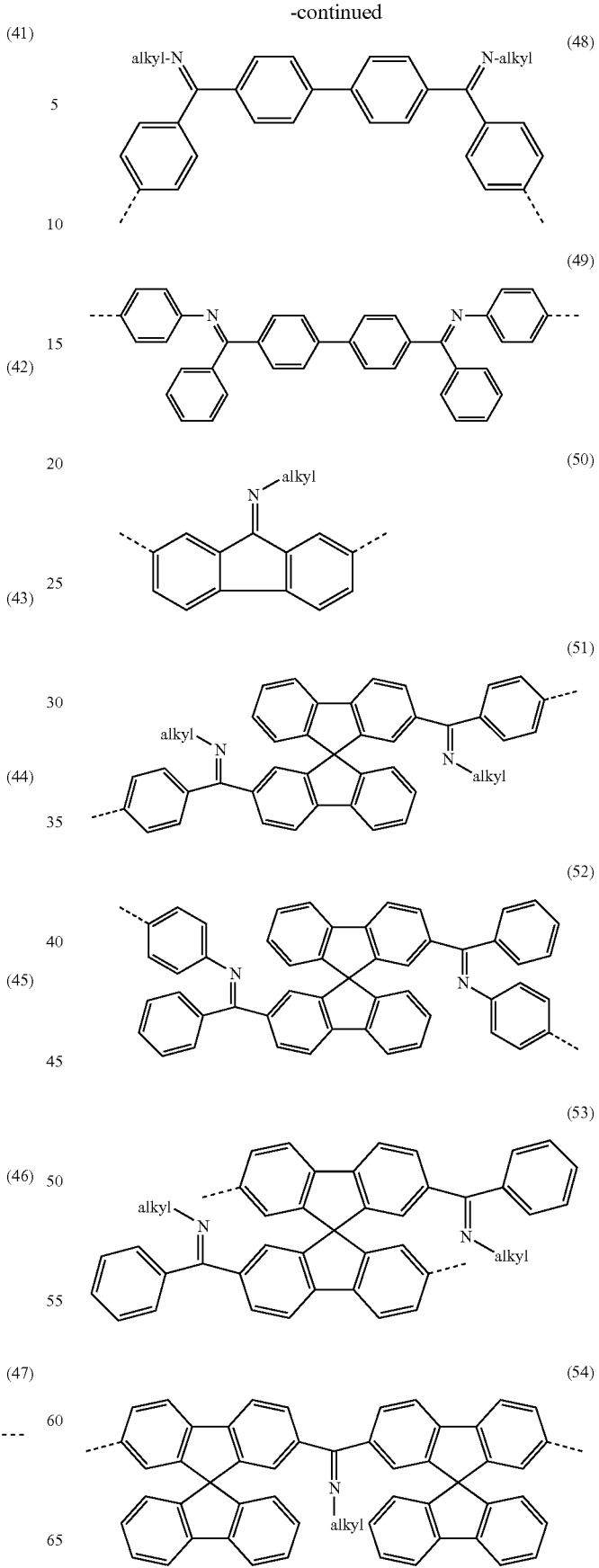

(55)
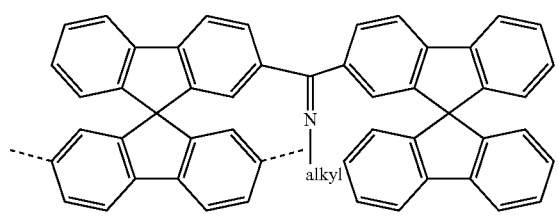
(56)
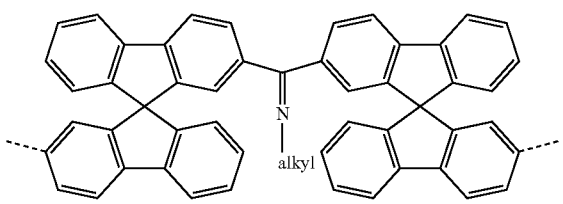
(57)
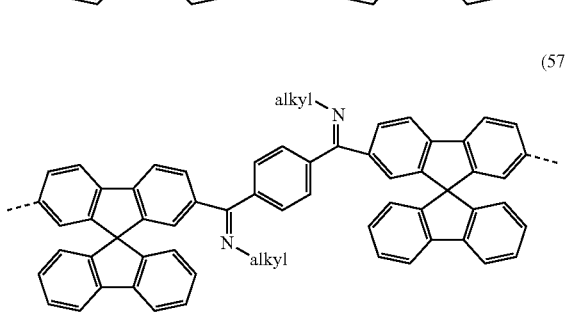
(58)
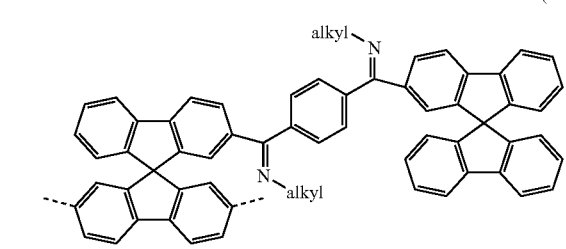
(59)
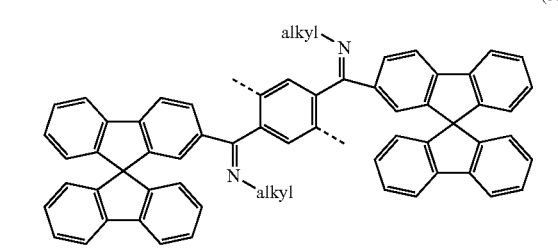
(60)
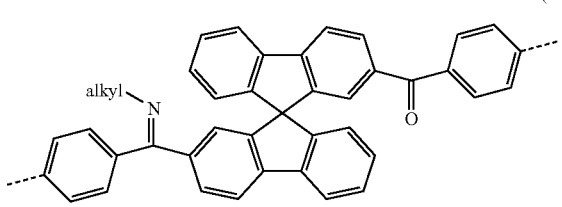
(61)
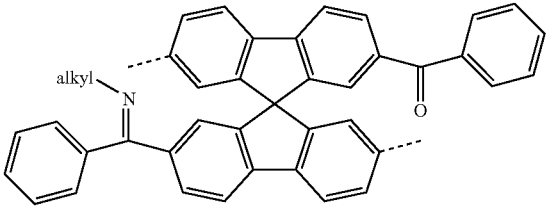
(62)
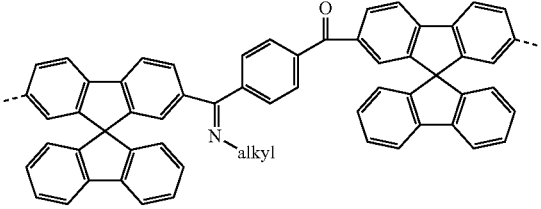
(63)
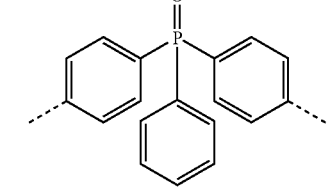
(64)
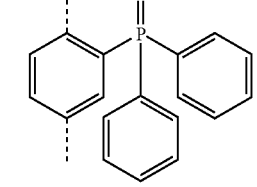
(65)
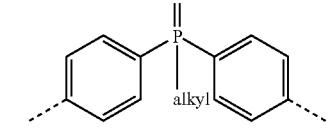
(66)
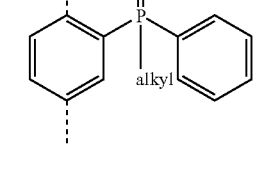
(67)
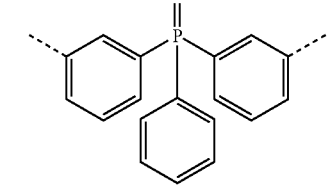

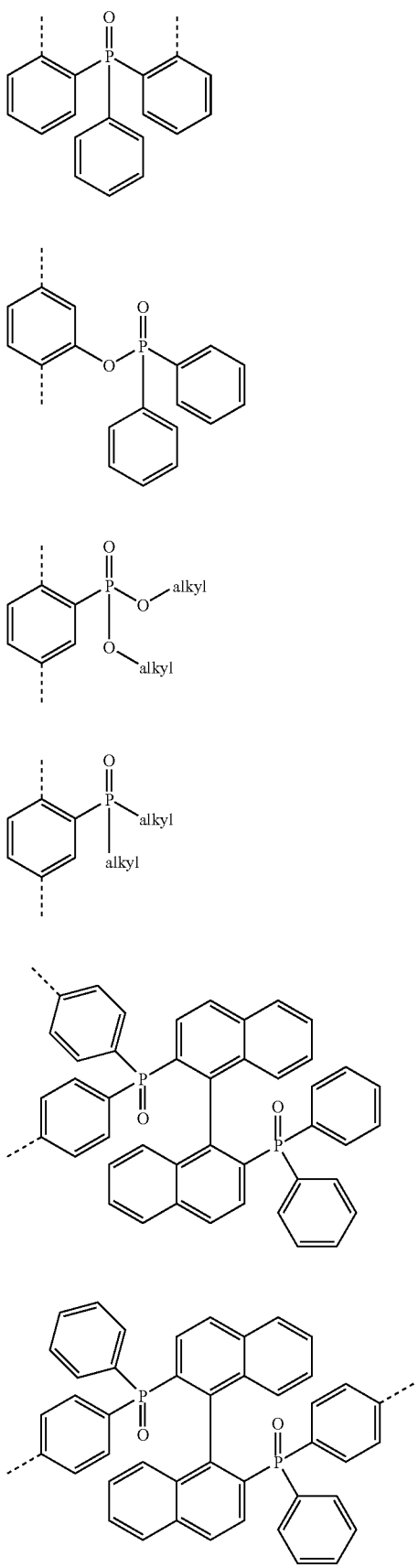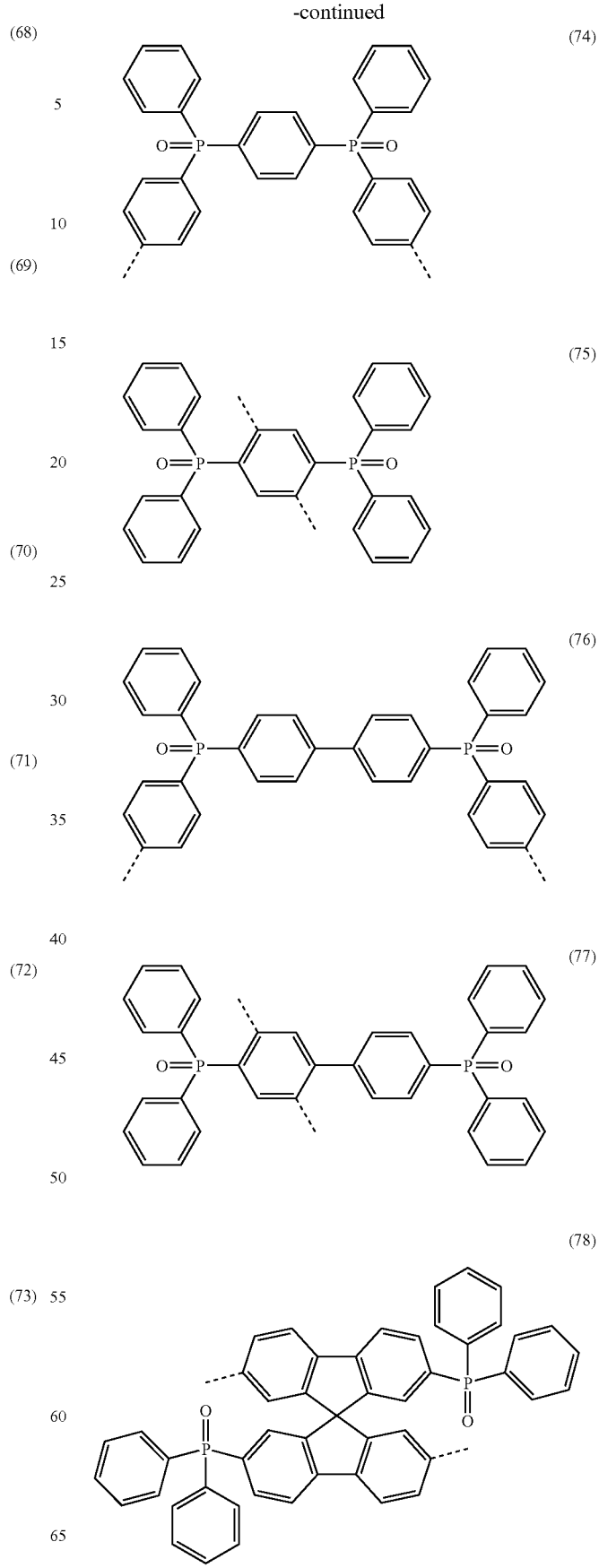

-continued
(79)
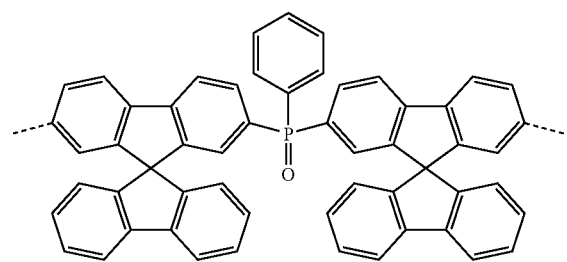
(80)
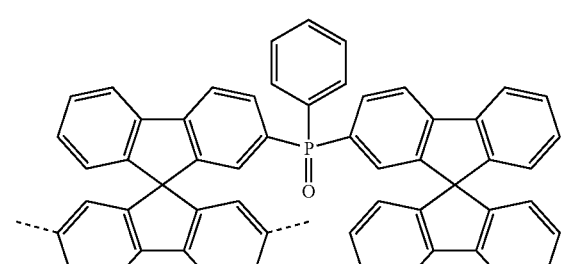
(81)
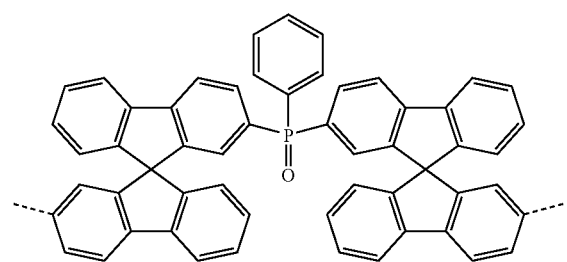
(82)
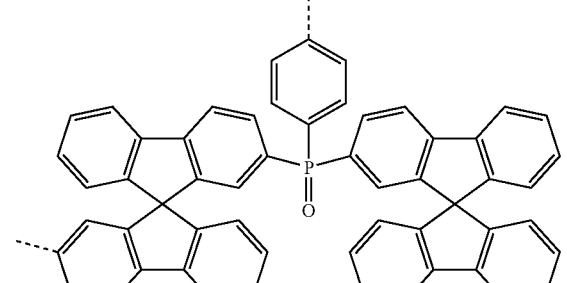
(83)
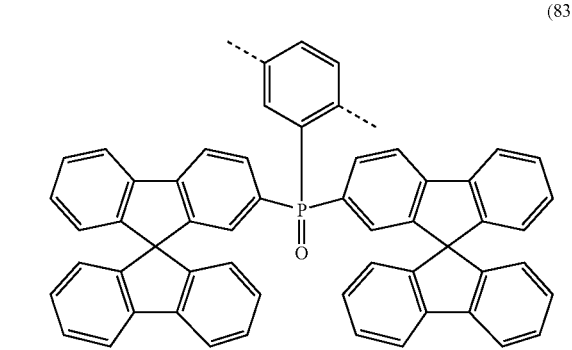
-continued
(84)
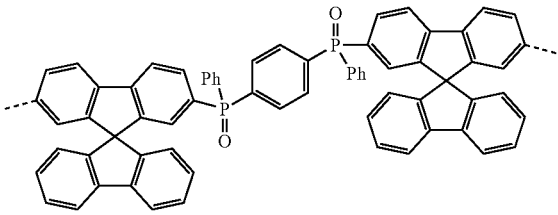
(85)
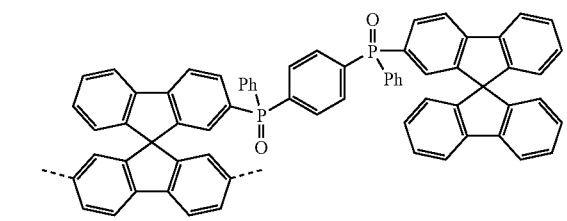
(86)
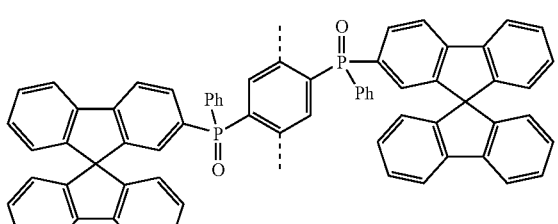
(87)
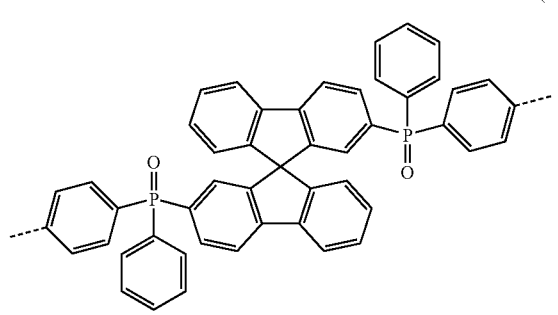
(88)
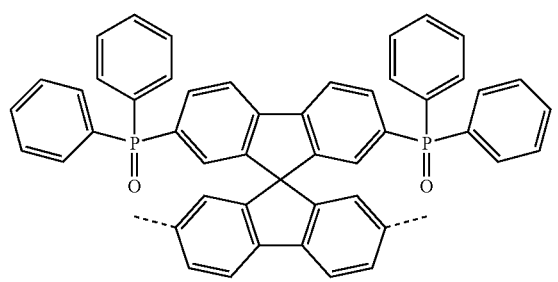
(89)
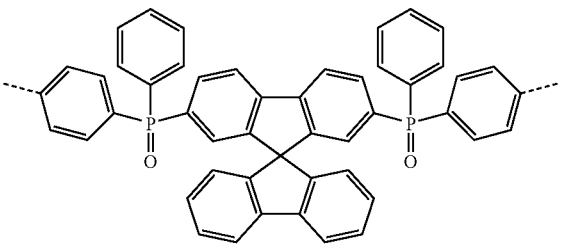

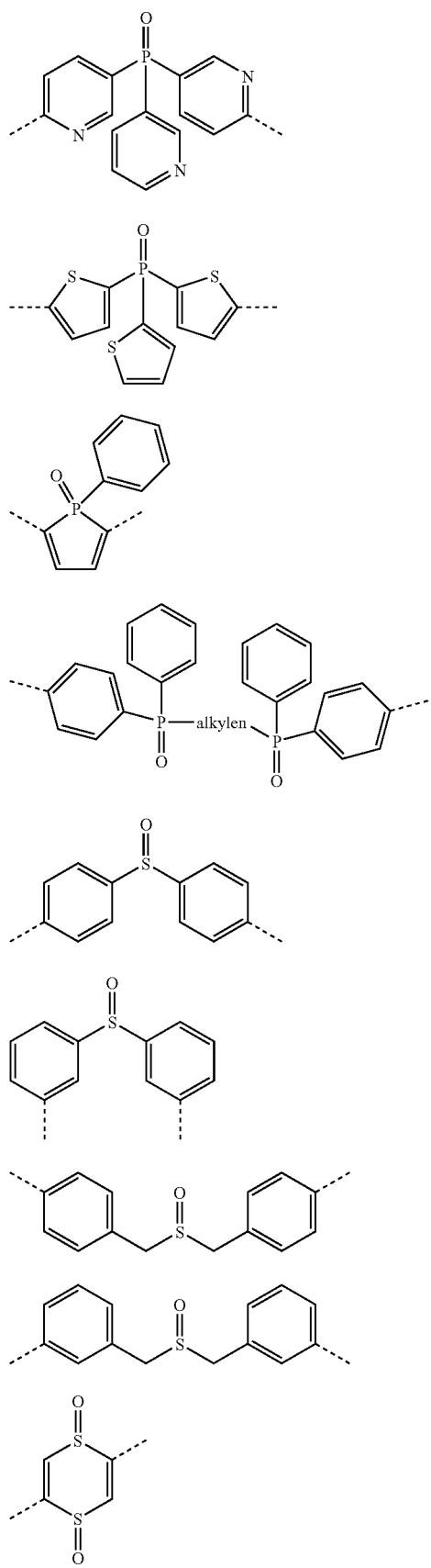

-continued
(107)
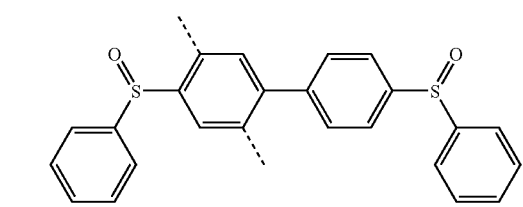
(108)
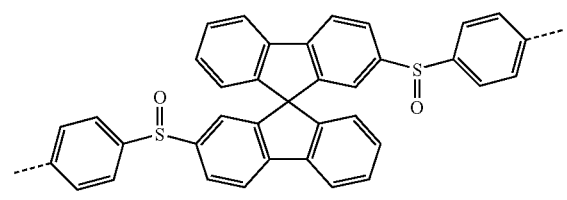
(109)
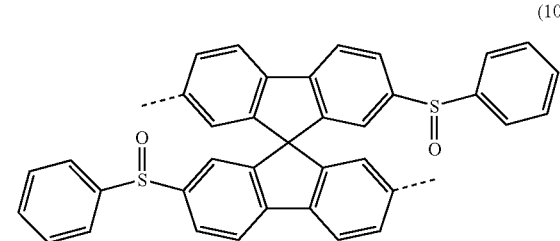
(110)
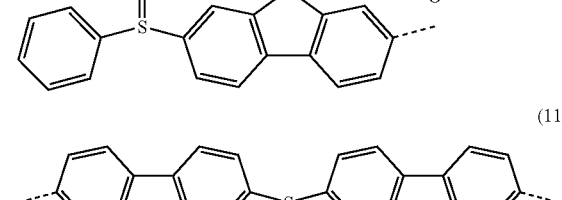
(111)
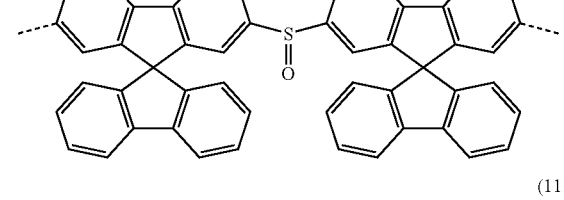
(112)
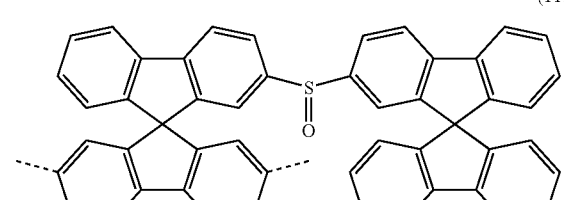
(113)
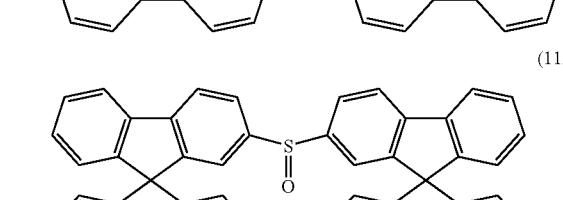
-continued
(114)
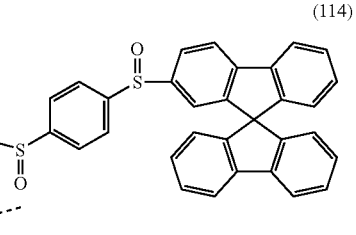
(115)
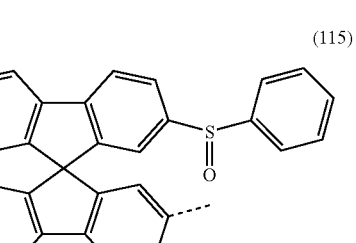
(116)
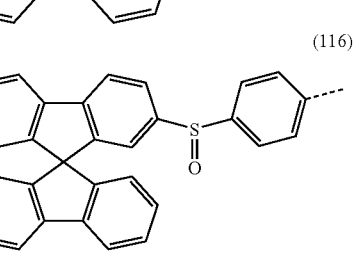
(117)
(118)
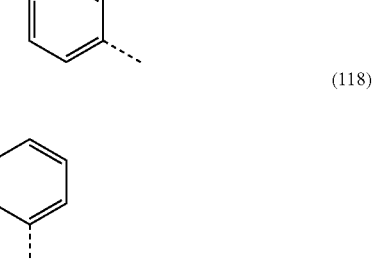
(119)
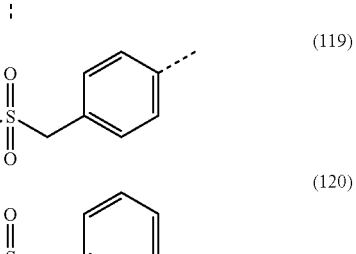
(120)
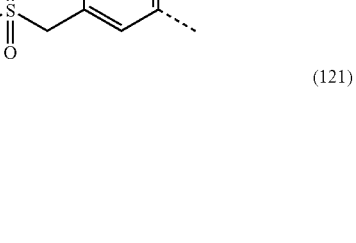
(121)
(122)

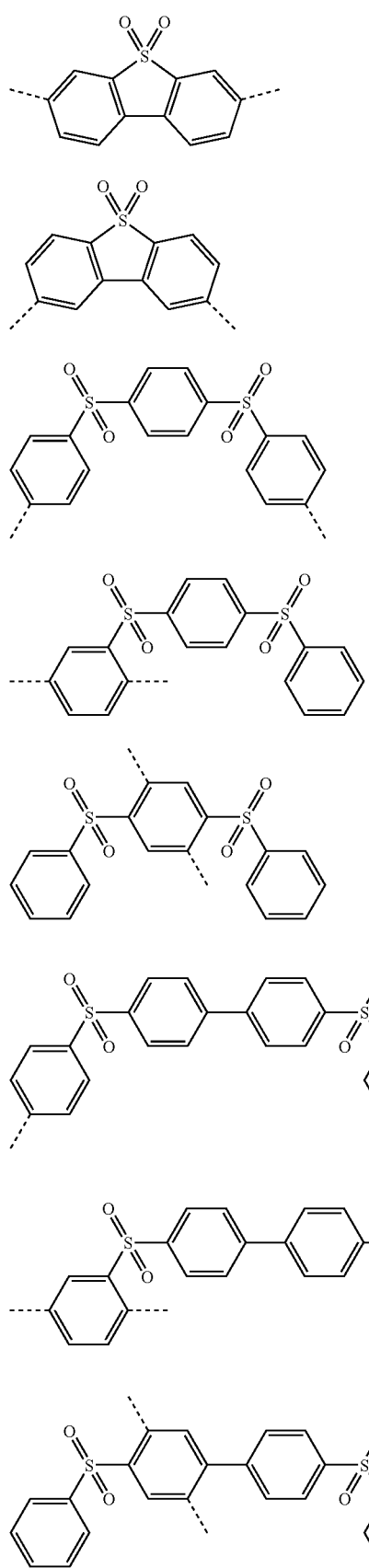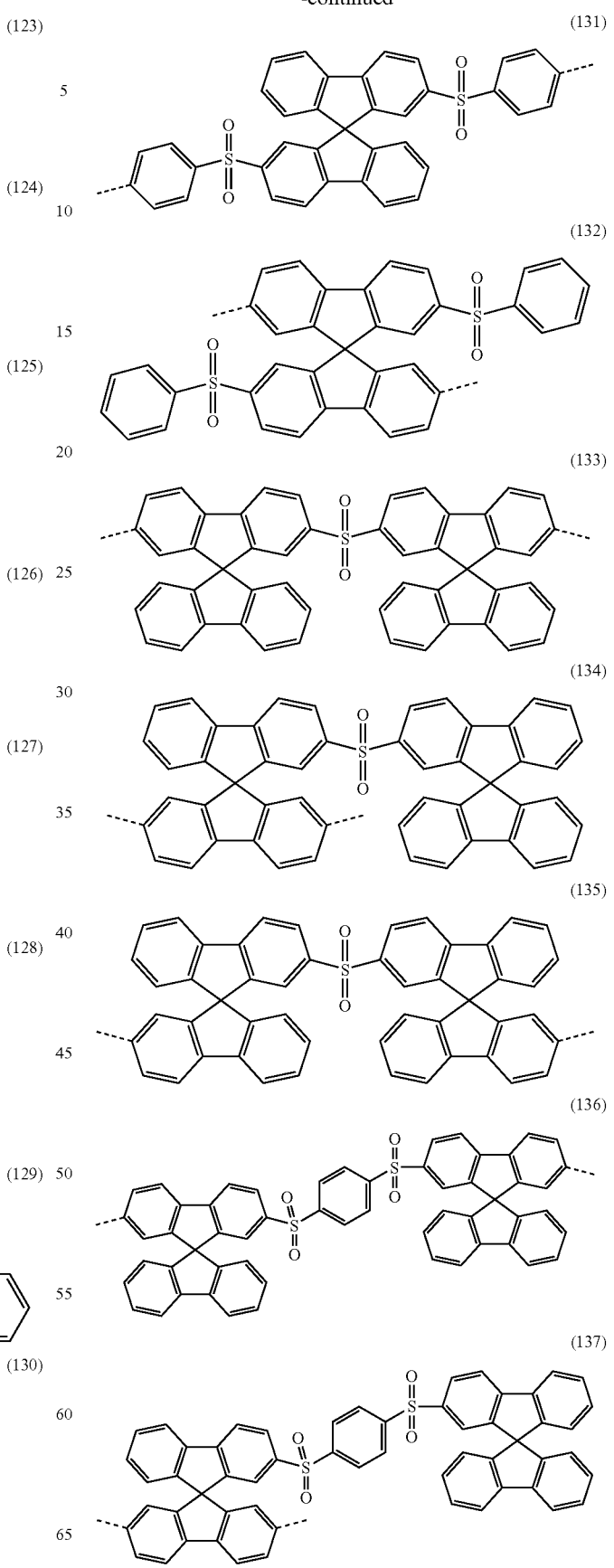

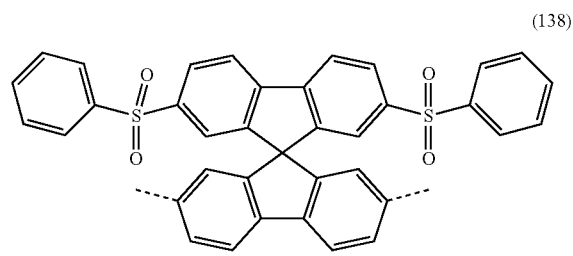

formula (138)

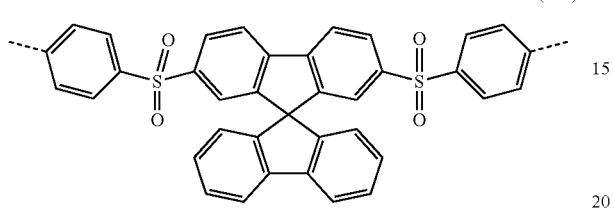

formula (139)

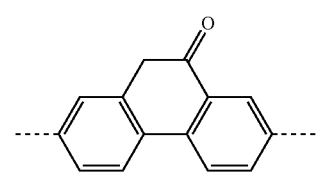

formula (140)

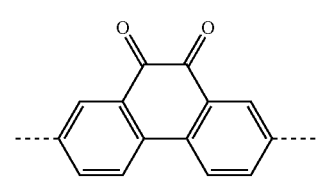

formula (141)

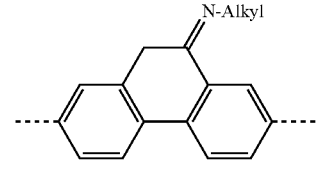

formula (142)

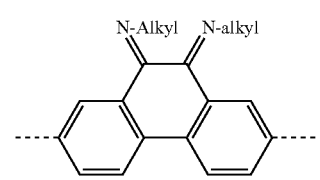

formula (143)

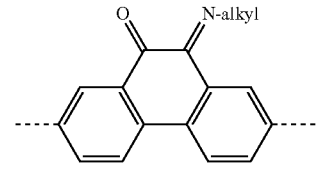

formula (144)

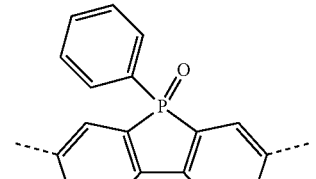

formula (145)

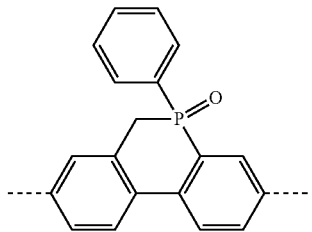

formula (146)

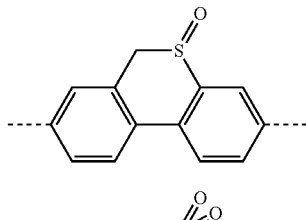

formula (147)

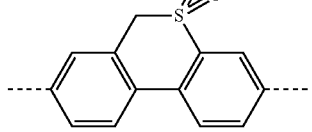

formula (148)

21. A mixture (BLEND2), comprising
(A) 0.5-99% by weight of at least one non-conjugated polymer (POLY2) which comprises 0.5-99.5 mol % of one or more triplet emitters (TRIP2) covalently bonded, and
(B) 1-99.5% by weight of at least one compound (COMP1) which contains at least one structural unit L=X or at least one structural unit of the formula (1) to (5)
wherein
L is on each occurrence, identically or differently, $(R^1)(R^2)$C, $(R^1)$P, $(R^1)$As, $(R^1)$Sb, $(R^1)$Bi, $(R^1)(R^2)(R^3)$P, $(R^1)(R^2)(R^3)$As, $(R^1)(R^2)(R^3)$Sb, $(R^1)(R^2)(R^3)$Bi, $(R^1)(R^2)$S, $(R^1)(R^2)$Se, $(R^1)(R^2)$Te, $(R^1)(R^2)$S(=O), $(R^1)(R^2)$Se(=O) or $(R^1)(R^2)$Te(=O);
X is on each occurrence, identically or differently, O, S, Se or N—$R^4$, with the proviso that X is not S or Se if L stands for S, Se or Te;
$R^1, R^2, R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent $CH_2$ groups may be replaced by —$R^6C$=$CR^6$—, —C≡C—, $Si(R^6)_2$, $Ge(R^6)_2$, $Sn(R^6)_2$, C=O, C=S, C=Se, C=$NR^6$, —O—, or —S— and where one or more H atoms are optionally replaced by F, Cl, Br, I, CN or $NO_2$, or an aromatic or heteroaromatic ring system having 1 to 40 C atoms, which is optionally substituted by one or more radicals $R^5$, where two or more substituents $R^1, R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;
$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6C$=$CR^6$—, —C≡C—, $Si(R^6)_2$, $Ge(R^6)_2$, $Sn(R^6)_2$, —$NR^6$—, —O—, —S—, —CO—O—, —O—CO—O—, where, in addition, one or more H atoms replaced by fluorine, an aryl, heteroaryl or aryloxy group having 1 to 40 C atoms, which is optionally substituted by one or more radicals $R^6$, or OH or $N(R^5)_2$;

$R^5$ is on each occurrence, identically or differently, $R^4$ or CN, $B(R^6)_2$ or $Si(R^6)_3$, $R^6$ is on each occurrence, identically or differently, H or an aliphatic or aromatic hydrocarbon radical having 1 to 20 C atoms; and wherein the formulae (1) to (5) are as follows:

formula (1)

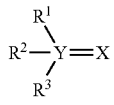

formula (2)

formula (3)

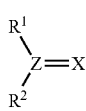

formula (4)

formula (5)

where the symbols used have the following meaning:
  X is on each occurrence, identically or differently, O, S, Se or N—$R^4$, with the proviso that X cannot be S or Se for formulae (4) and (5);
  Y is on each occurrence, identically or differently, P, As, Sb or Bi;
  Z is on each occurrence, identically or differently, S, Se or Te;
  $R^1$ to $R^6$ are defined above, and is capable of forming glass-like layers at room temperature.

22. A mixture (BLEND3), comprising
  (A) 0.5-98.9% by weight of at least one non-conjugated polymer (POLY3), and
  (B) 1-99% by weight of at least one compound (COMP1) which contains at least one structural unit L=X or at least one structural unit of the formula (1) to (5) and is capable of forming glass-like layers at room temperature, wherein
    L is on each occurrence, identically or differently, $(R^1)(R^2)$C, $(R^1)$P, $(R^1)$As, $(R^1)$Sb, $(R^1)$Bi, $(R^1)(R^2)(R^3)$P, $(R^1)(R^2)(R^3)$As, $(R^1)(R^2)(R^3)$Sb, $(R^1)(R^2)(R^3)$Bi, $(R^1)(R^2)$S, $(R^1)(R^2)$Se, $(R^1)(R^2)$Te, $(R^1)(R^2)$S(=O), $(R^1)(R^2)$Se(=O) or $(R^1)(R^2)$Te(=O);
    X is on each occurrence, identically or differently, O, S, Se or N—$R^4$, with the proviso that X is not S or Se if L stands for S, Se or Te;
    $R^1$, $R^2$, $R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent CH$_2$ groups may be replaced by —$R^6$C=CR$^6$—, —C≡C—, $Si(R^6)_2$, $Ge(R^6)_2$, $Sn(R^6)_2$, C=O, C=S, C=Se, C=NR$^6$, —O—, or —S— and where one or more H atoms are optionally replaced by F, Cl, Br, I, CN or NO$_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6$C=CR$^6$—, —C≡C—, $Si(R^6)_2$, $Ge(R^6)_2$, $Sn(R^6)_2$, —NR$^6$—, —O—, —S—, —CO—O—, —O—CO—O—, where, in addition, one or more H atoms replaced by fluorine, an aryl, heteroaryl or aryloxy group having 1 to 40 C atoms, which is optionally substituted by one or more radicals $R^6$, or OH or $N(R^5)_2$;

$R^5$ is on each occurrence, identically or differently, $R^4$ or CN, $B(R^6)_2$ or $Si(R^6)_3$, $R^6$ is on each occurrence, identically or differently, H or an aliphatic or aromatic hydrocarbon radical having 1 to 20 C atoms; and wherein the formulae (1) to (5) are as follows:

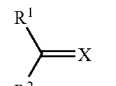

formula (1)

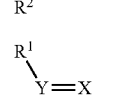

formula (2)

formula (3)

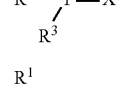

formula (4)

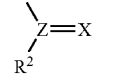

formula (5)

where the symbols used have the following meaning:
  X is on each occurrence, identically or differently, O, S, Se or N—$R^4$, with the proviso that X cannot be S or Se for formulae (4) and (5);
  Y is on each occurrence, identically or differently, P, As, Sb or Bi;
  Z is on each occurrence, identically or differently, S, Se or Te;
  $R^1$ to $R^6$ are defined above, and
  (C) 0.1-95% by weight of one or more triplet emitters (TRIP1).

23. An organic semiconductor which comprises the mixture according to claim 22, wherein the compound (COMP1) which contains structural elements L=X or structural elements of the formulae (1) to (5) is selected from the formulae (6) to (148), which is optionally substituted or unsubstituted and wherein

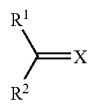
formula (1)

formula (2)

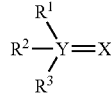
formula (3)

formula (4)

formula (5)

where the symbols used have the following meaning:

X is on each occurrence, identically or differently, O, S, Se or N—$R^4$, with the proviso that X cannot be S or Se for formulae (4) and (5);

Y is on each occurrence, identically or differently, P, As, Sb or Bi;

Z is on each occurrence, identically or differently, S, Se or Te;

$R^1$, $R^2$, $R^3$ is on each occurrence, identically or differently, H, F, CN, a straight-chain, branched or cyclic alkyl, alkoxy or thioalkoxy group having 1 to 40 C atoms, which may be substituted by $R^5$ or may also be unsubstituted, where one or more non-adjacent $CH_2$ groups may be replaced by —$R^6C$=$CR^6$—, —C≡C—, Si$(R^6)_2$, Ge$(R^6)_2$, Sn$(R^6)_2$, C=O, C=S, C=Se, C=$NR^6$, —O—, or —S—, and where one or more H atoms is optionally replaced by F, Cl, Br, I, CN or $NO_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms is optionally replaced by —$R^6C$=$CR^6$, —C≡C—, Si$(R^6)_2$, Ge$(R^6)_2$, Sn$(R^6)_2$, —$NR^6$—, —O—, —S—, —CO—O—, —O—CO—O—, where, in addition, one or more H atoms is optionally replaced by fluorine, an aryl, heteroaryl or aryloxy group having 1 to 40 C atoms, which may also be substituted by one or more radicals $R^6$, or OH or $N(R^5)_2$;

$R^5$ is on each occurrence, identically or differently, $R^4$ or CN, $B(R^6)_2$ or $Si(R^6)_3$, $R^6$ is on each occurrence, identically or differently, H or an aliphatic or aromatic hydrocarbon radical having 1 to 20 C atoms,

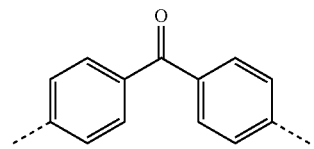
(6)

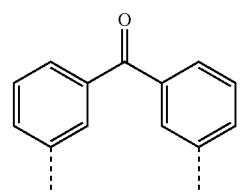
(7)

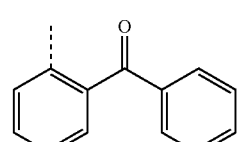
(8)

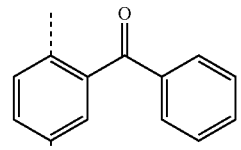
(9)

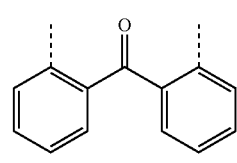
(10)

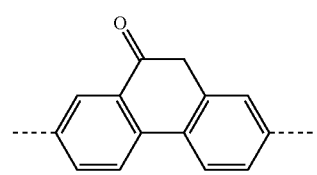
(11)

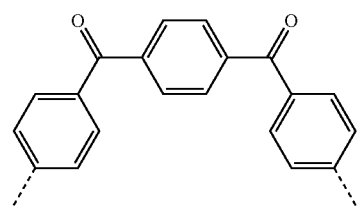
(12)

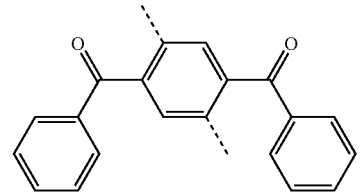
(13)

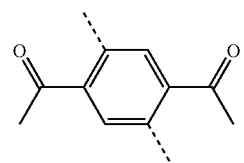
(14)

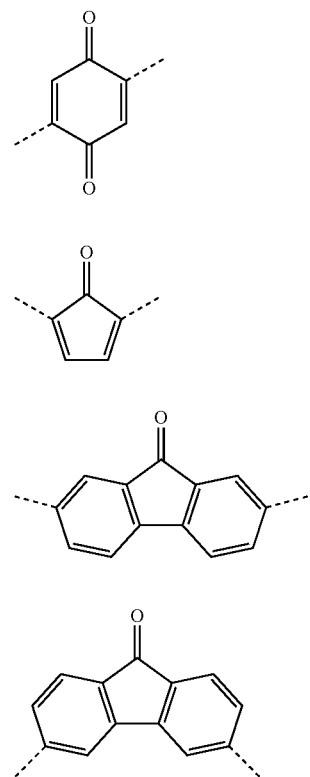
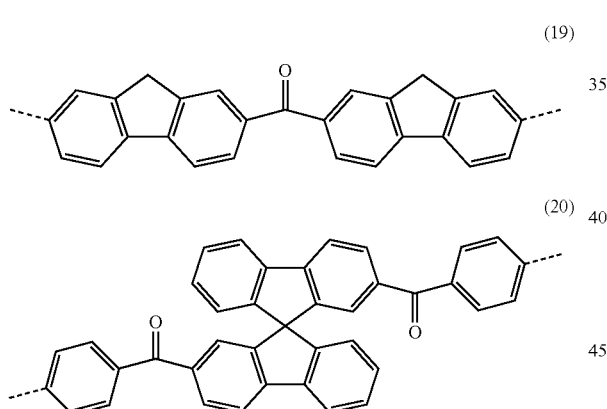
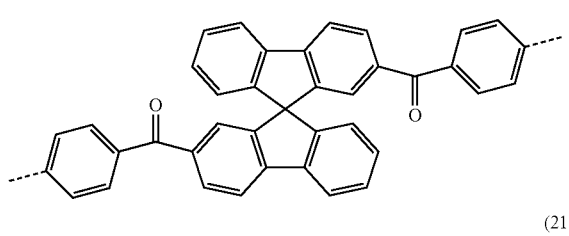
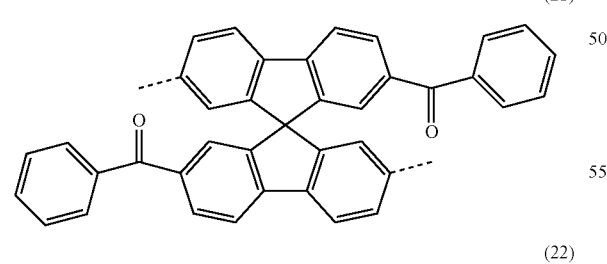
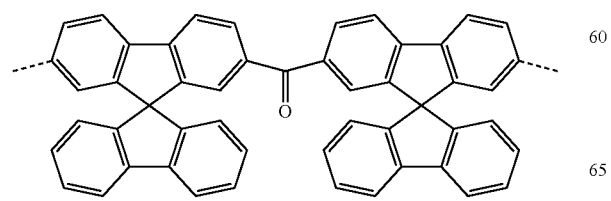
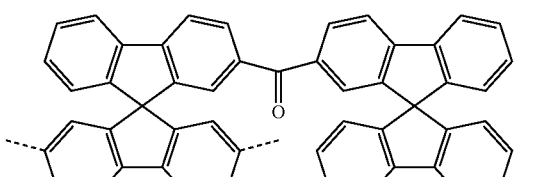
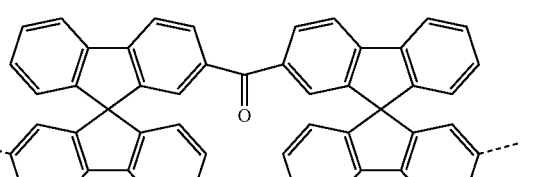
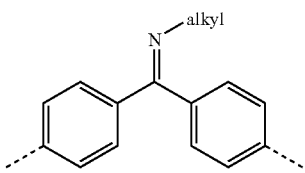

(30) 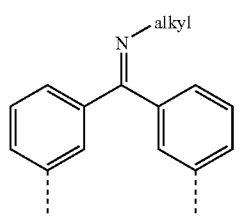
(31) 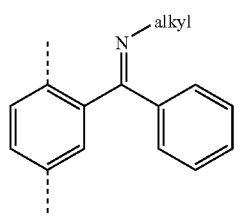
(32) 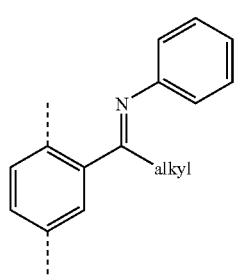
(33) 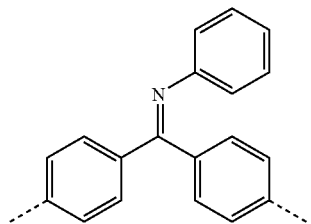
(34) 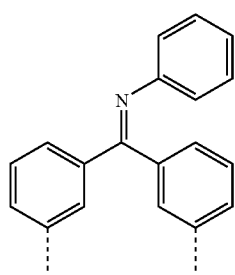
(35) 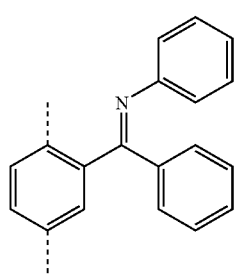
(36) 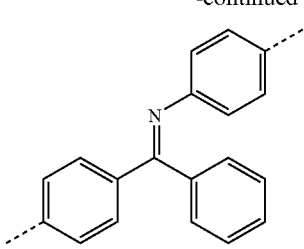
(37) 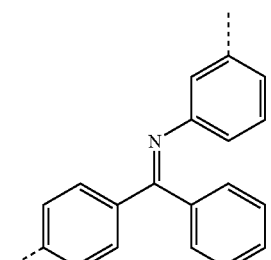
(38) 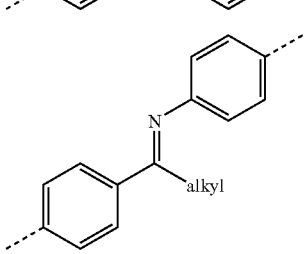
(39) 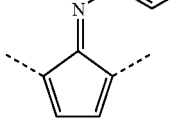
(40) 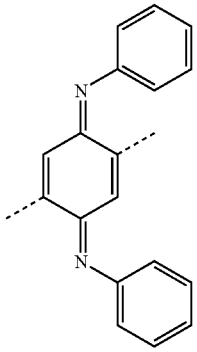
(41) 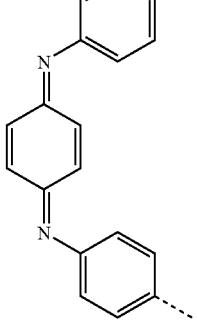

(42) 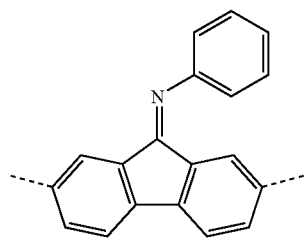
(43) 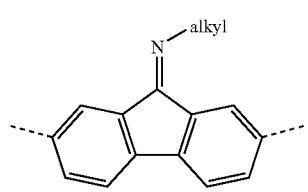
(44) 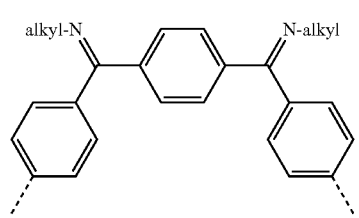
(45) 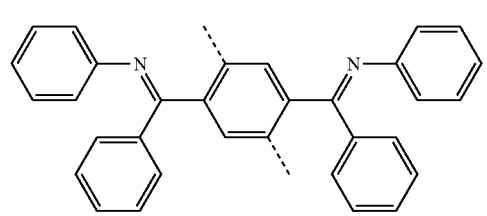
(46) 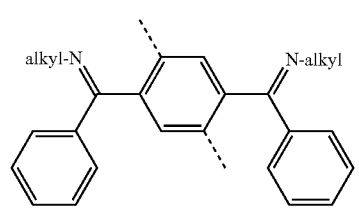
(47) 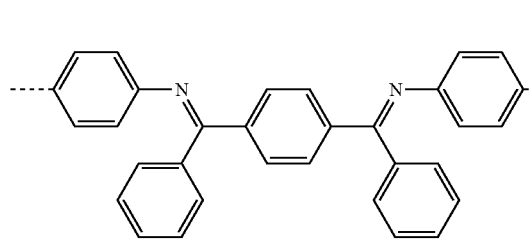
(48) 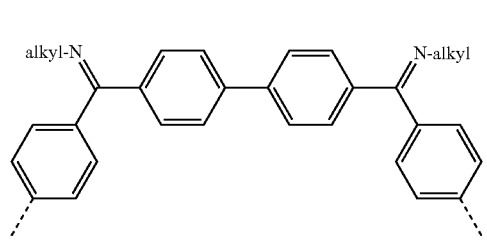
(49) 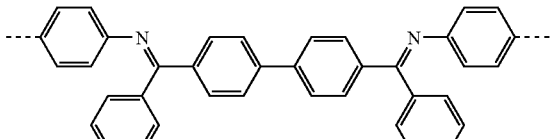
(50) 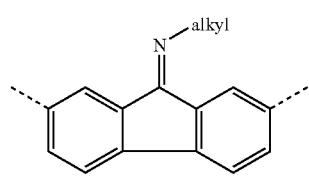
(51) 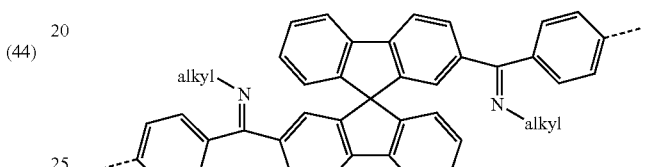
(52) 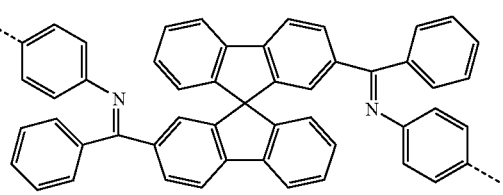
(53) 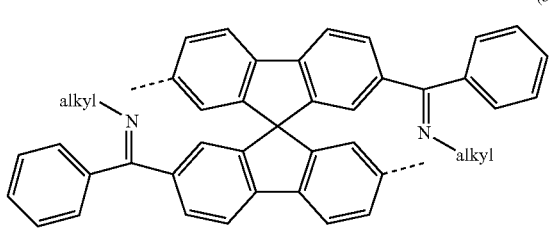
(54) 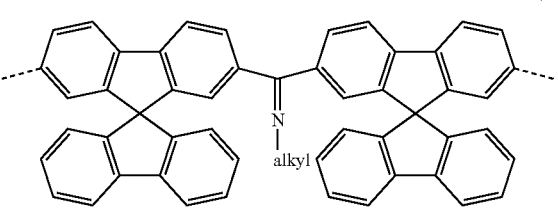
(55) 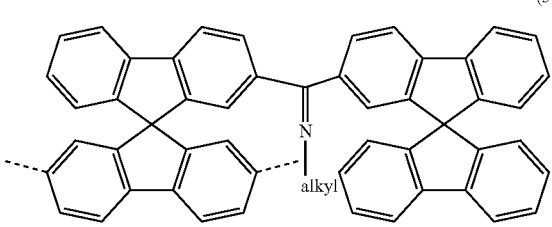

-continued

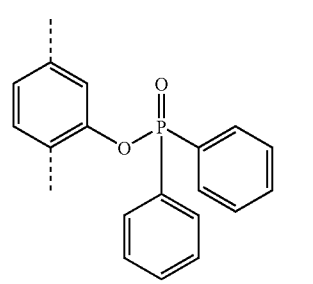
(69)
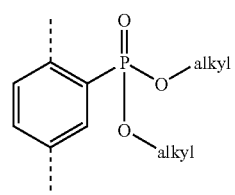
(70)
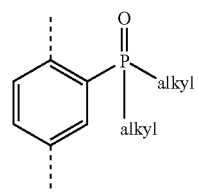
(71)
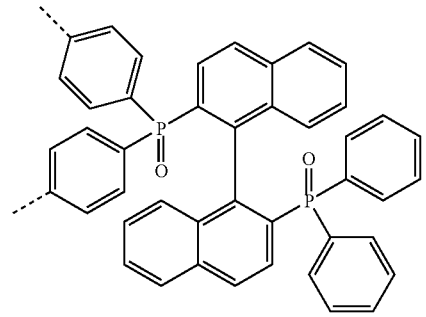
(72)
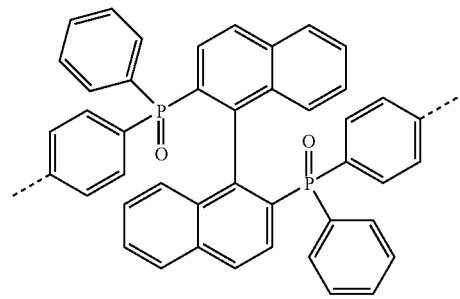
(73)
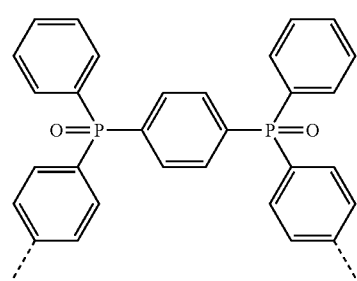
(74)
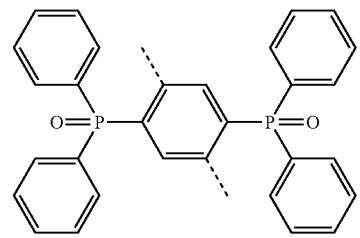
(75)
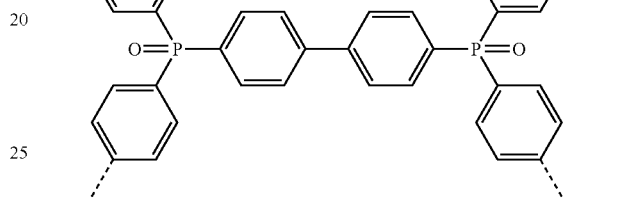
(76)
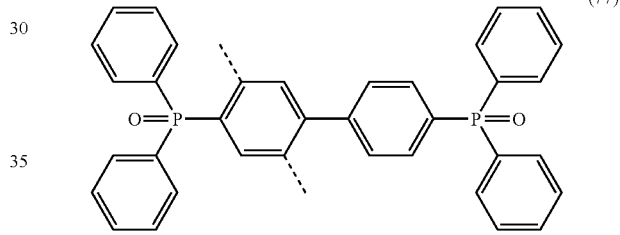
(77)
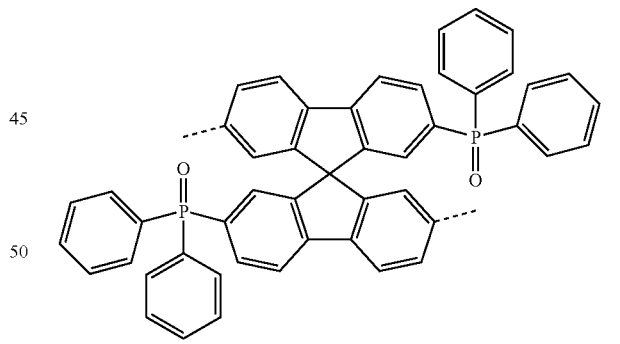
(78)
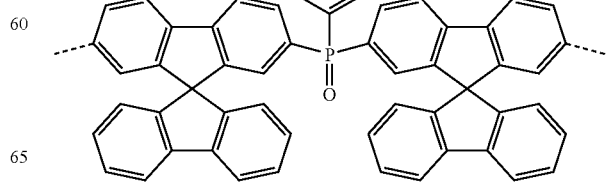
(79)

-continued
(80)
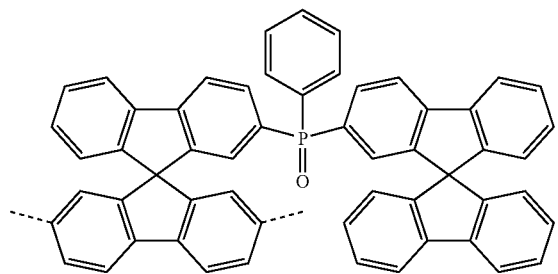
(81)
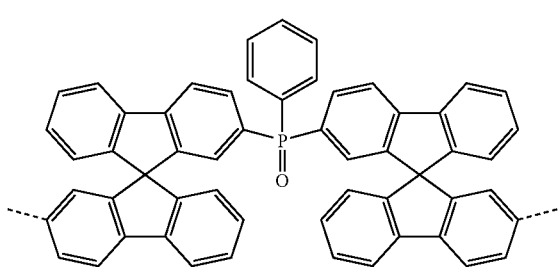
(82)
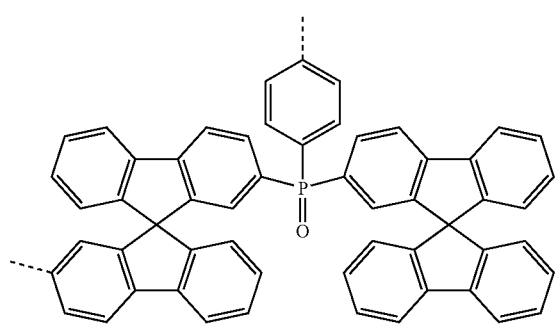
(83)
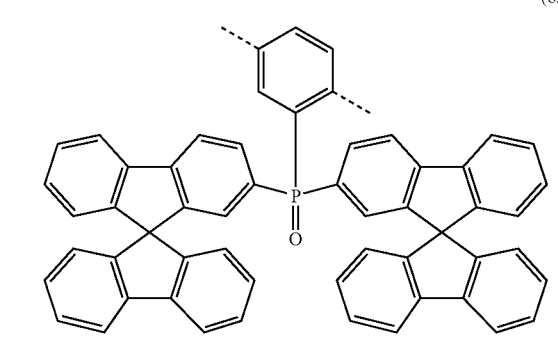
(84)
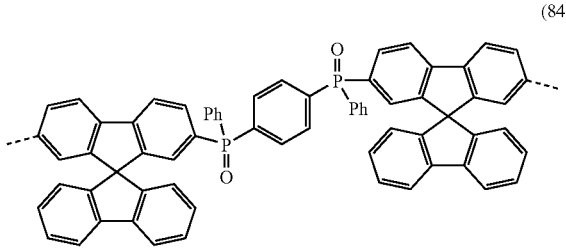
-continued
(85)
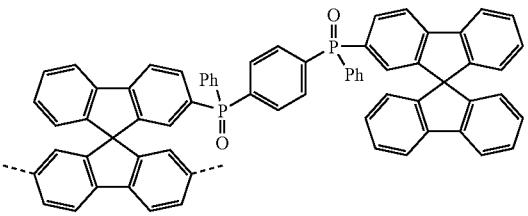
(86)
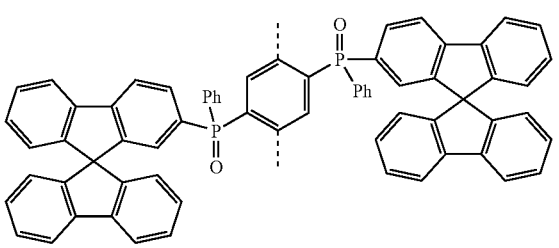
(87)
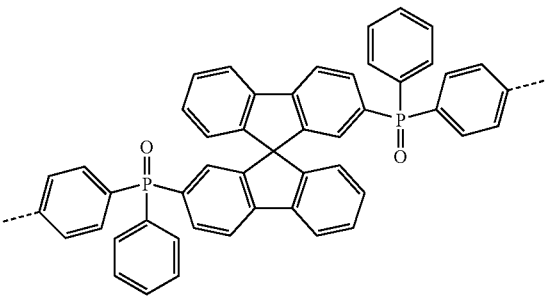
(88)
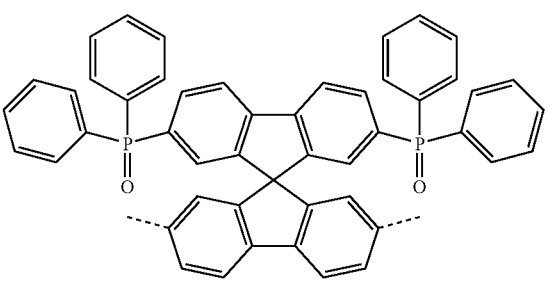
(89)
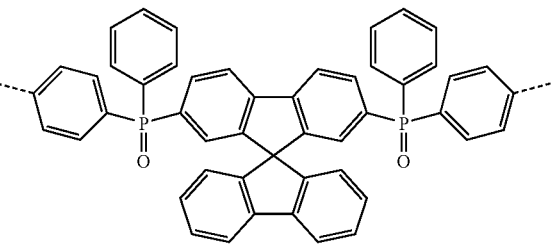
(90)
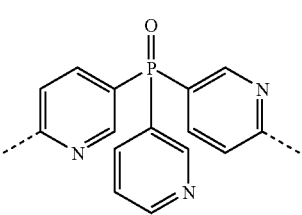

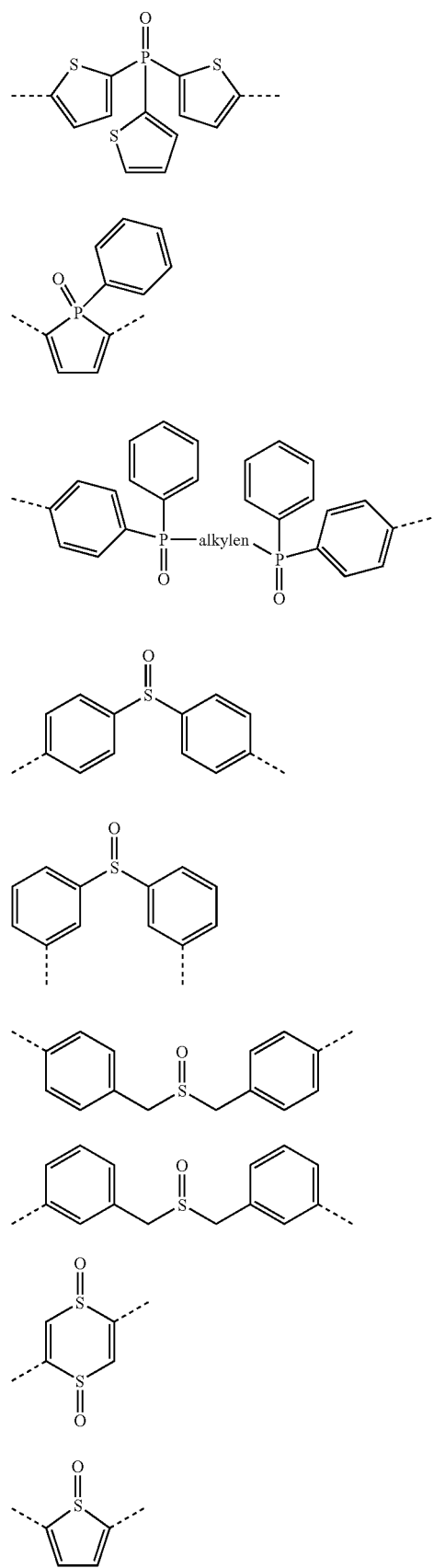
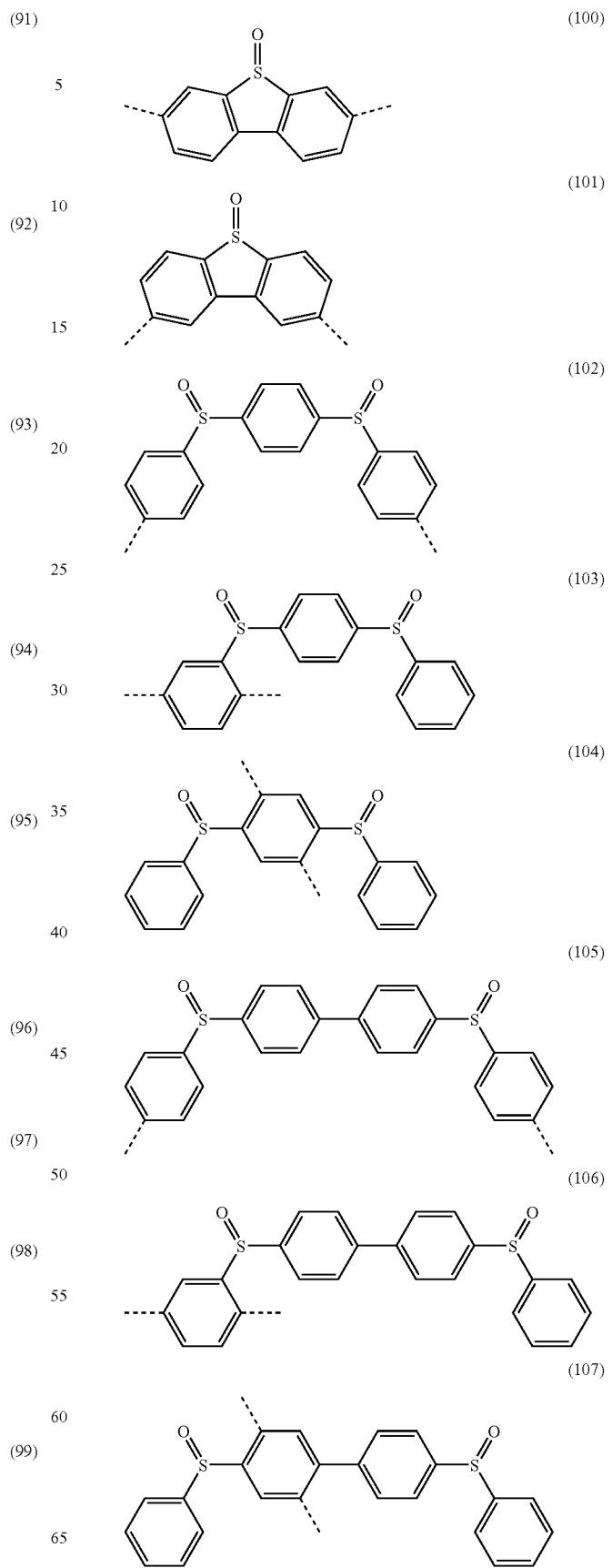

-continued
(108)
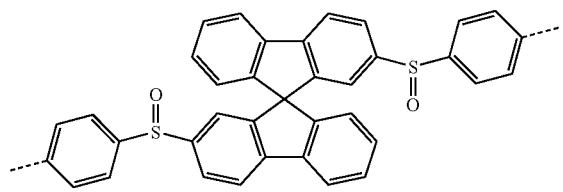
(109)
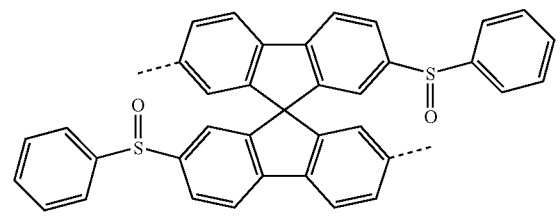
(110)
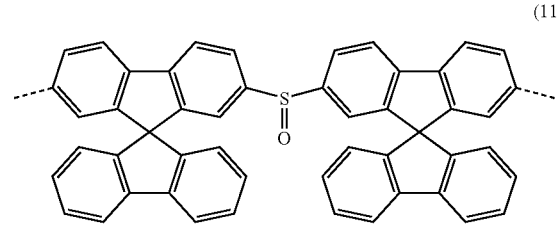
(111)
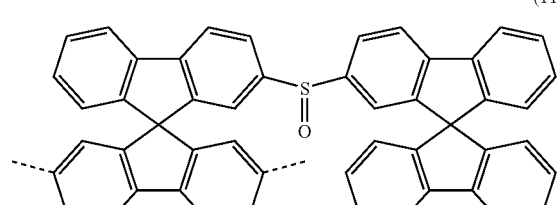
(112)
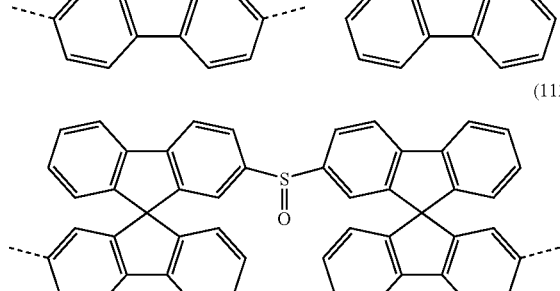
(113)
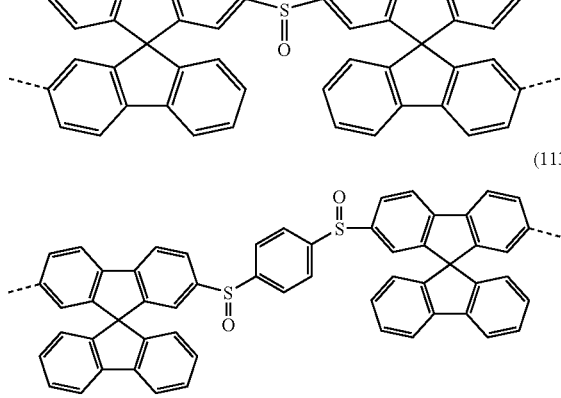
(114)
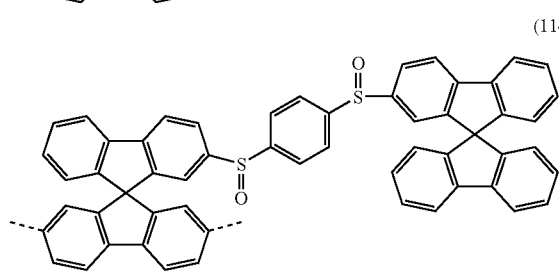
-continued
(115)
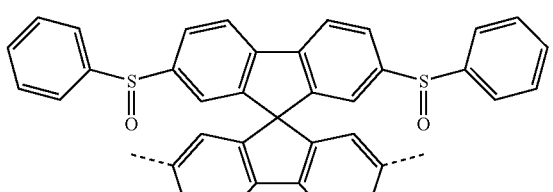
(116)
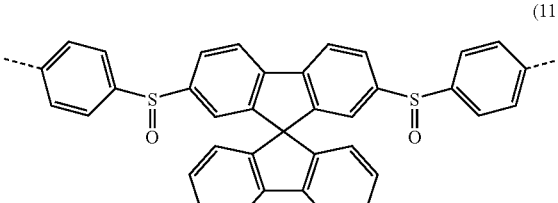
(117)
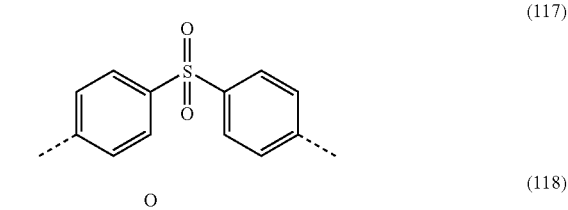
(118)
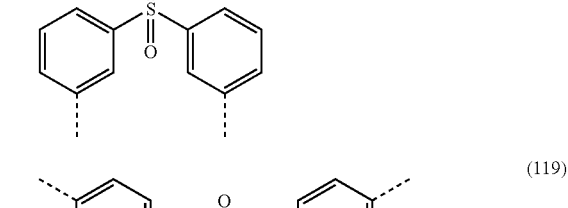
(119)
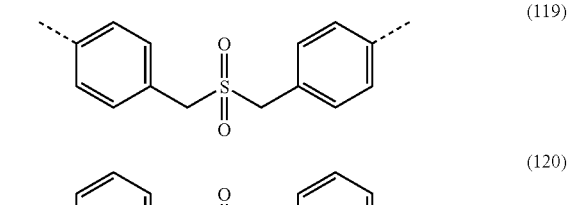
(120)
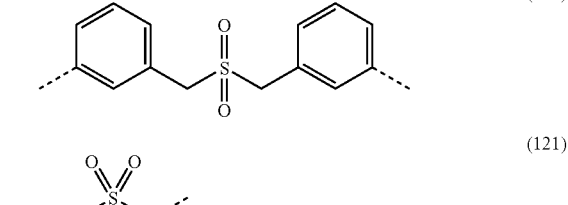
(121)
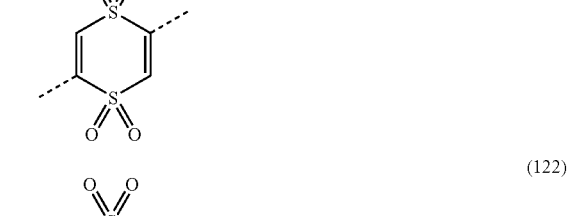
(122)
(123)
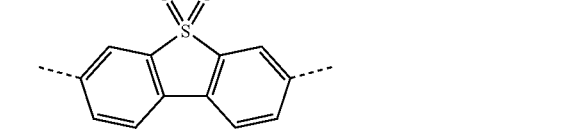

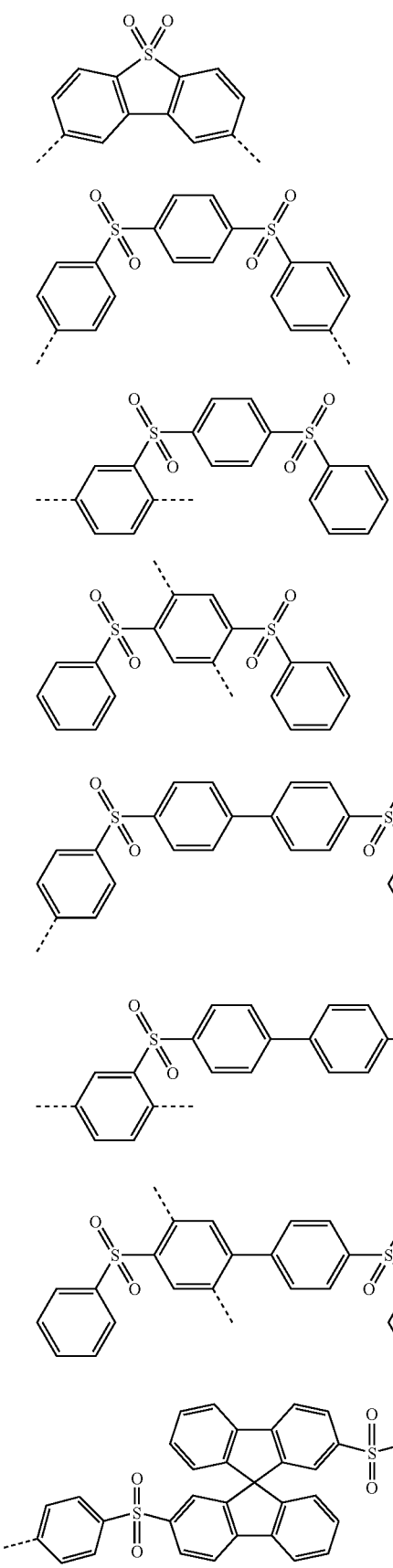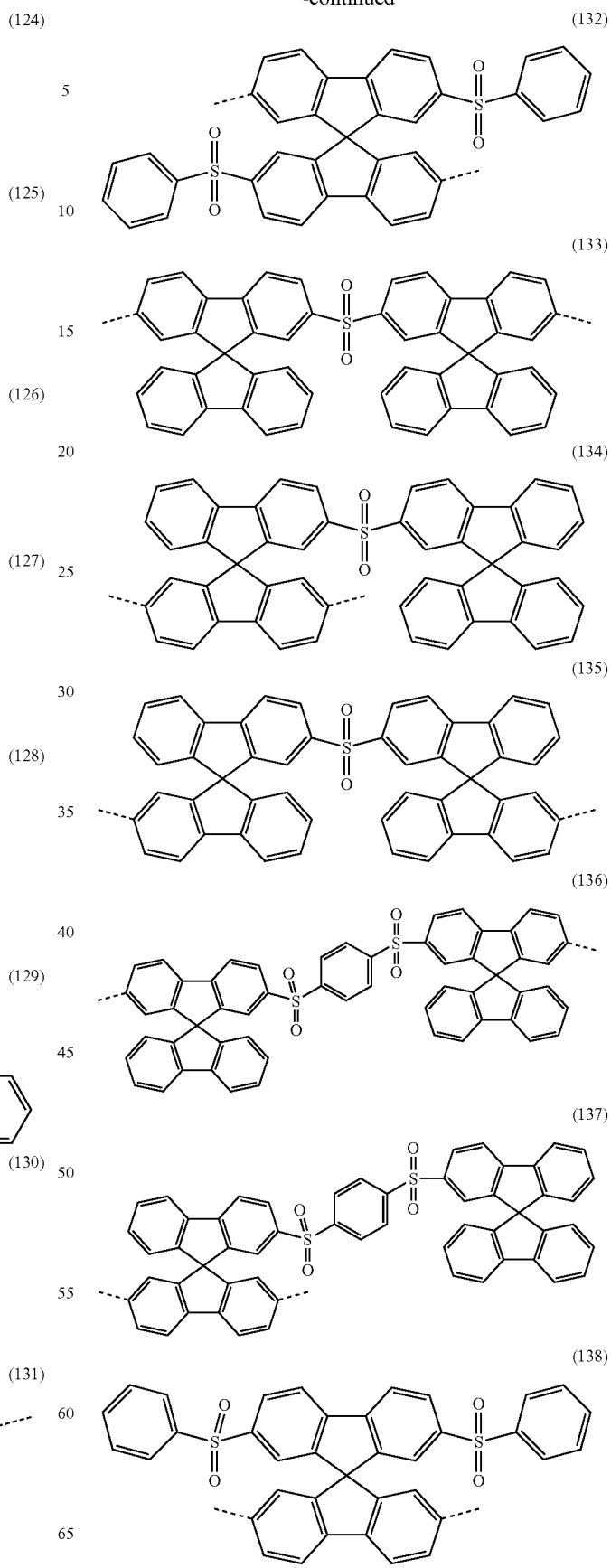

-continued

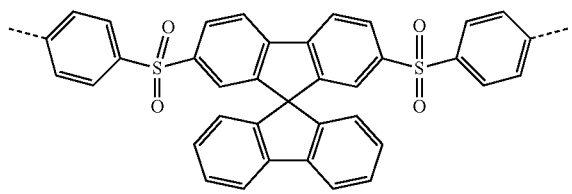
formula (139)

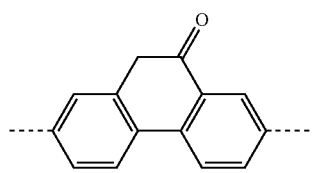
formula (140)

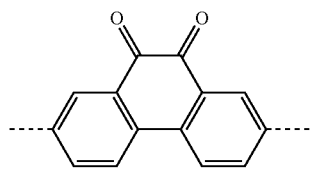
formula (141)

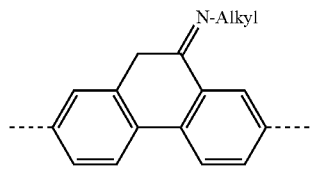
formula (142)

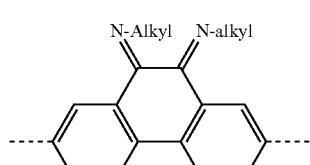
formula (143)

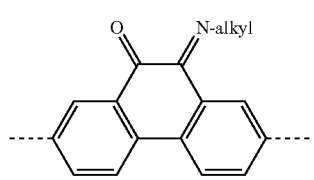
formula (144)

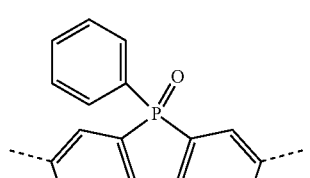
formula (145)

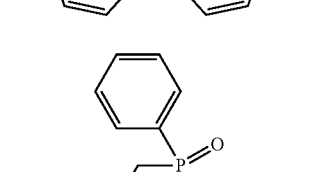
formula (146)

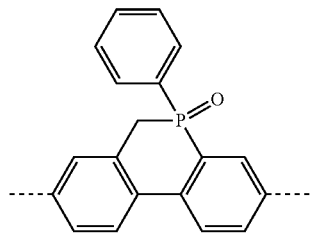

-continued

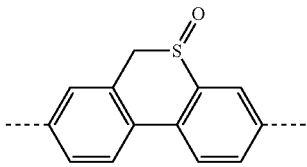
formula (147)

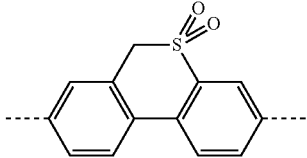
formula (148)

24. A mixture (BLEND4), comprising
(A) 0.5-99% by weight of at least one non-conjugated polymer (POLY3); and
(B) 1-99.5% by weight of a compound (TRIP3) which contains at least one structural unit L=X or at least one structural unit of the formula (1) to (5) covalently bonded to one or more triplet emitters, wherein L is on each occurrence, identically or differently, $(R^1)(R^2)$ C, $(R^1)$P, $(R^1)$As, $(R^1)$Sb, $(R^1)$Bi, $(R^1)(R^2)(R^3)$P, $(R^1)(R^2)(R^3)$As, $(R^1)(R^2)(R^3)$Sb, $(R^1)(R^2)(R^3)$Bi, $(R^1)(R^2)$S, $(R^1)(R^2)$Se, $(R^1)(R^2)$Te, $(R^1)(R^2)$S(=O), $(R^1)(R^2)$Se(=O) or $(R^1)(R^2)$Te(=O);

X is on each occurrence, identically or differently, O, S, Se or N—$R^4$, with the proviso that X is not S or Se if L stands for S, Se or Te;

$R^1$, $R^2$, $R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent CH$_2$ groups may be replaced by —$R^6$C=C$R^6$—, —C≡C—, Si$(R^6)_2$, Ge$(R^6)_2$, Sn$(R^6)_2$, C=O, C=S, C=Se, C=N$R^6$, —O—, or —S— and where one or more H atoms are optionally replaced by F, Cl, Br, I, CN or NO$_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6$C=C$R^6$—, —C≡C—, Si$(R^6)_2$, Ge$(R^6)_2$, Sn$(R^6)_2$, —N$R^6$—, —O—, —S—, —CO—O—, —O—CO—O—, where, in addition, one or more H atoms replaced by fluorine, an aryl, heteroaryl or aryloxy group having 1 to 40 C atoms, which is optionally substituted by one or more radicals $R^6$, or OH or N$(R^5)_2$;

$R^5$ is on each occurrence, identically or differently, $R^4$ or CN, B$(R^6)_2$ or Si$(R^6)_3$, $R^6$ is on each occurrence, identically or differently, H or an aliphatic or aromatic hydrocarbon radical having 1 to 20 C atoms; and wherein the formulae (1) to (5) are as follows:

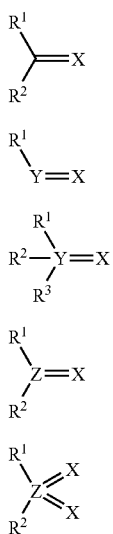

formula (1)

formula (2)

formula (3)

formula (4)

formula (5)

where the symbols used have the following meaning:
X is on each occurrence, identically or differently, O, S, Se or N—R$^4$, with the proviso that X cannot be S or Se for formulae (4) and (5);
Y is on each occurrence, identically or differently, P, As, Sb or Bi;
Z is on each occurrence, identically or differently, S, Se or Te;
R$^1$ to R$^6$ are defined above,
where the bonding between the triplet emitter and the structural unit L=X can take place in any desired positions of the two units, with the restriction that at least one group X in (TRIP3) must be in free form and not coordinated to a metal atom.

25. An organic semiconductor which comprises the mixture according to claim 24, wherein the compound (TRIP3) contains structural elements which are selected from the formulae (6) to (148), which may be substituted or unsubstituted

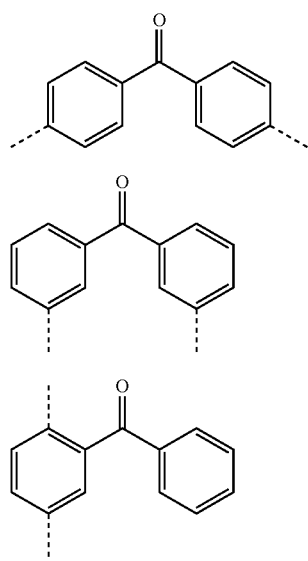

(6)

(7)

(8)

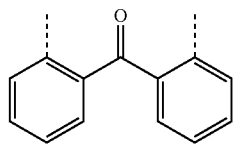

(9)

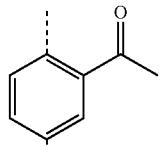

(10)

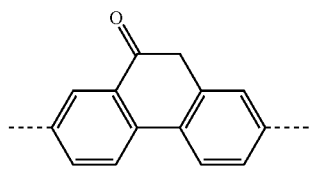

(11)

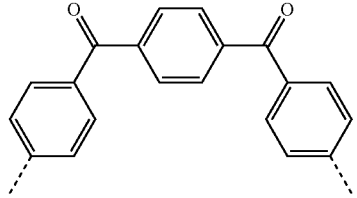

(12)

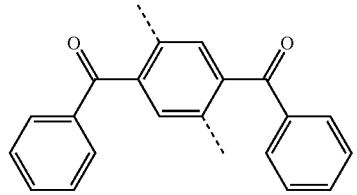

(13)

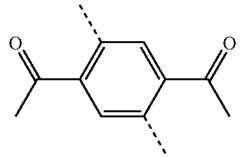

(14)

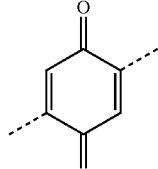

(15)

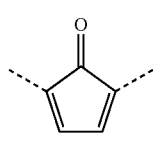

(16)

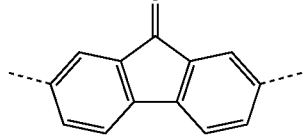

(17)

-continued
(18)
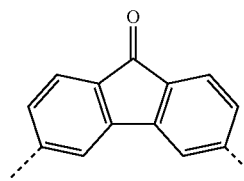
(19)
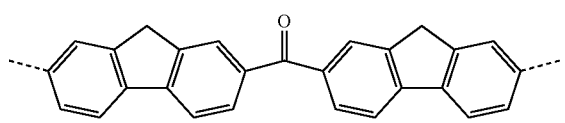
(20)
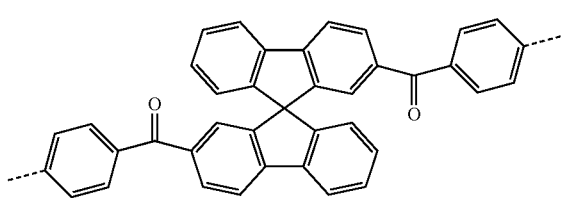
(21)
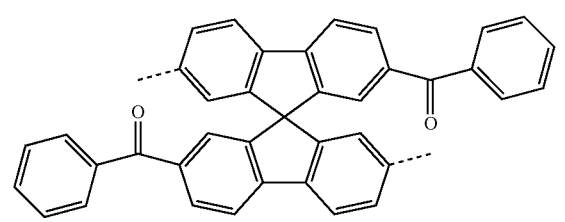
(22)
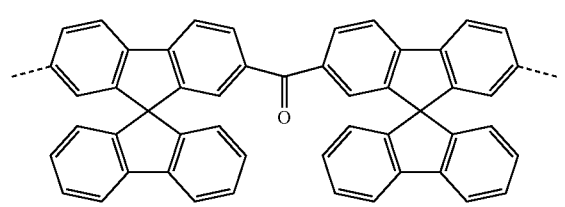
(23)
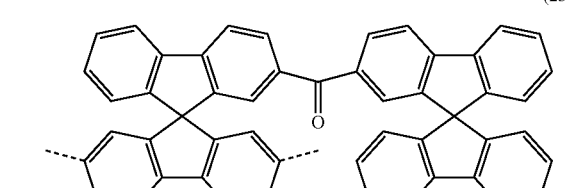
(24)
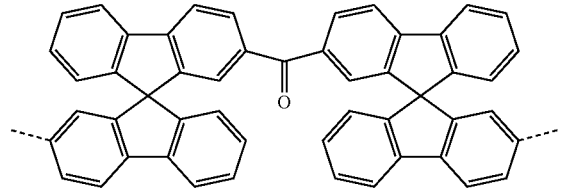
-continued
(25)
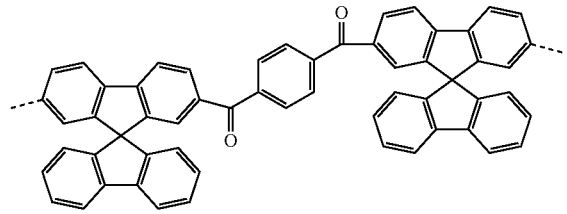
(26)
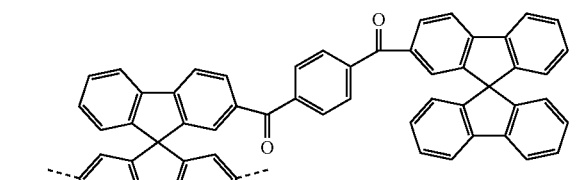
(27)
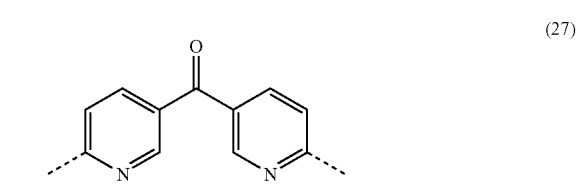
(28)
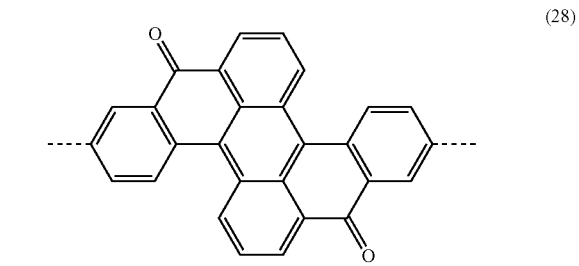
(29)
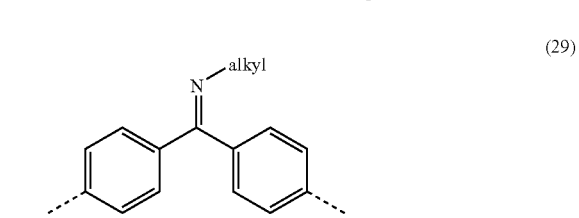
(30)
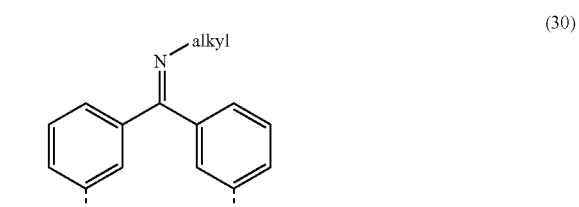
(31)
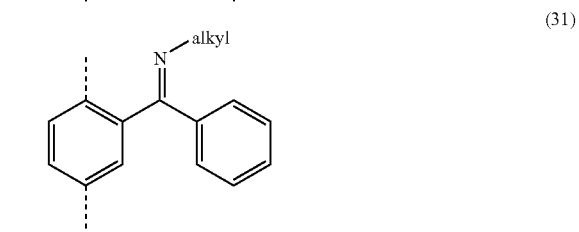

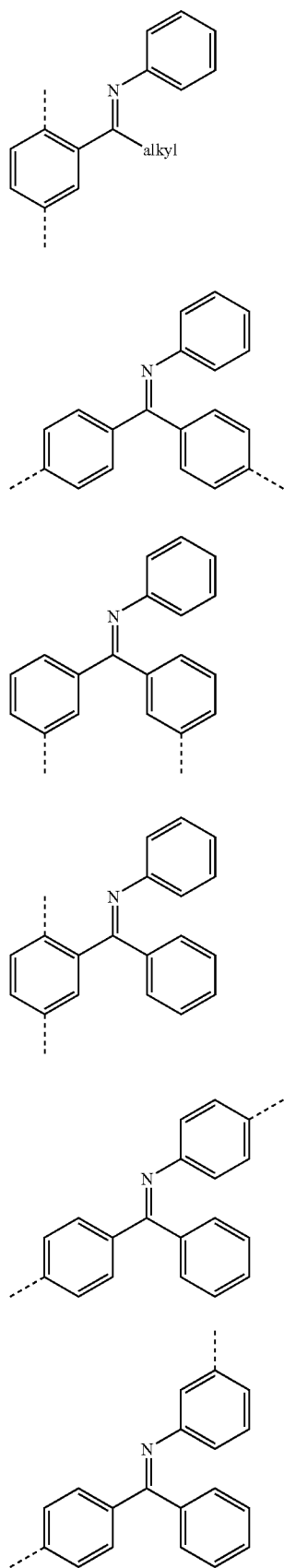
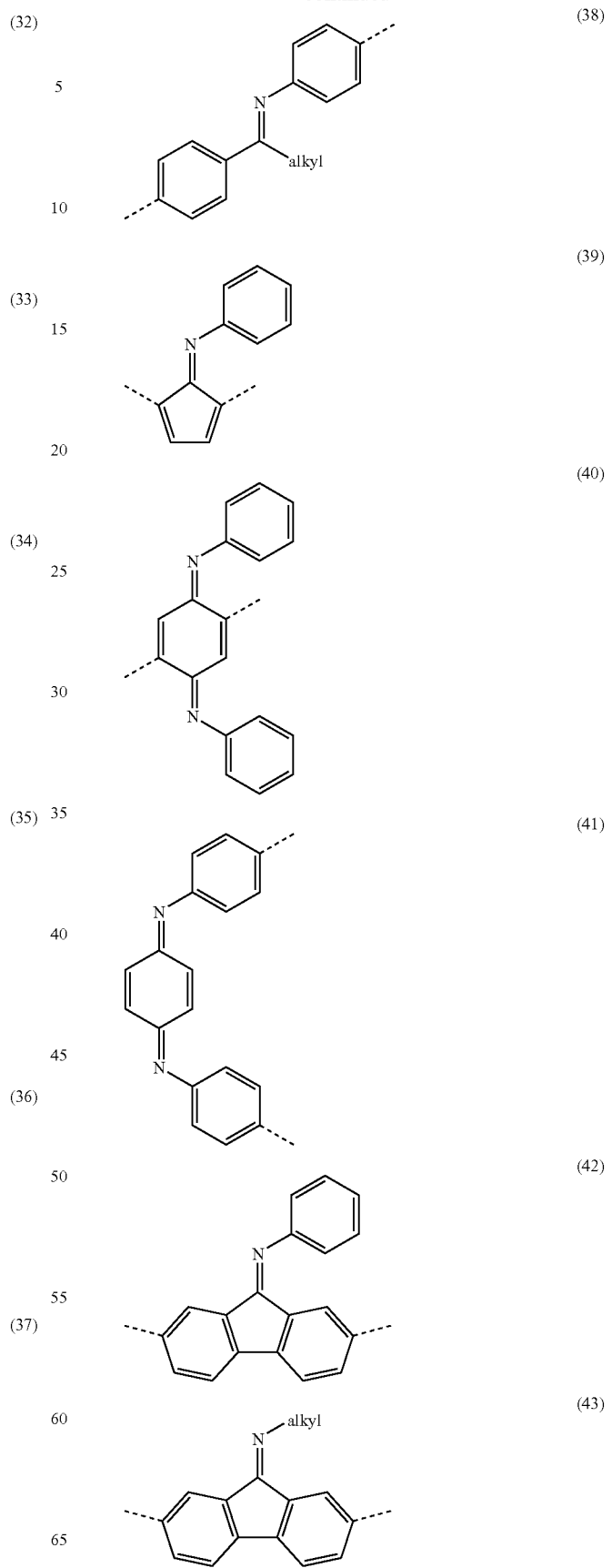

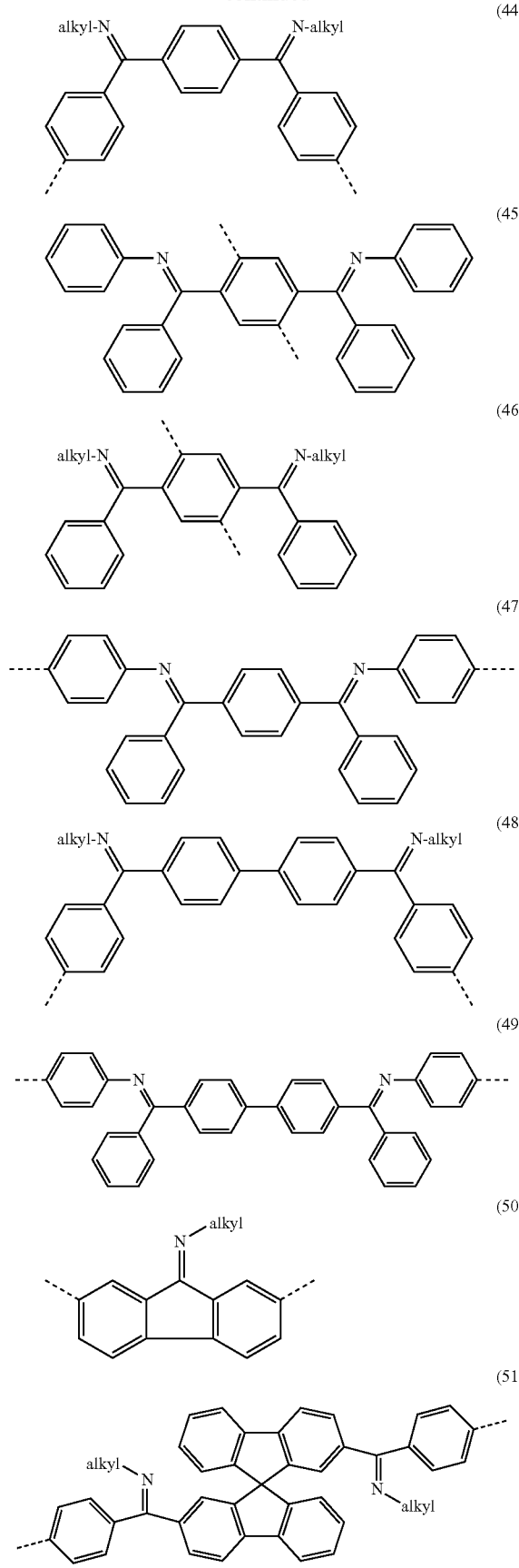
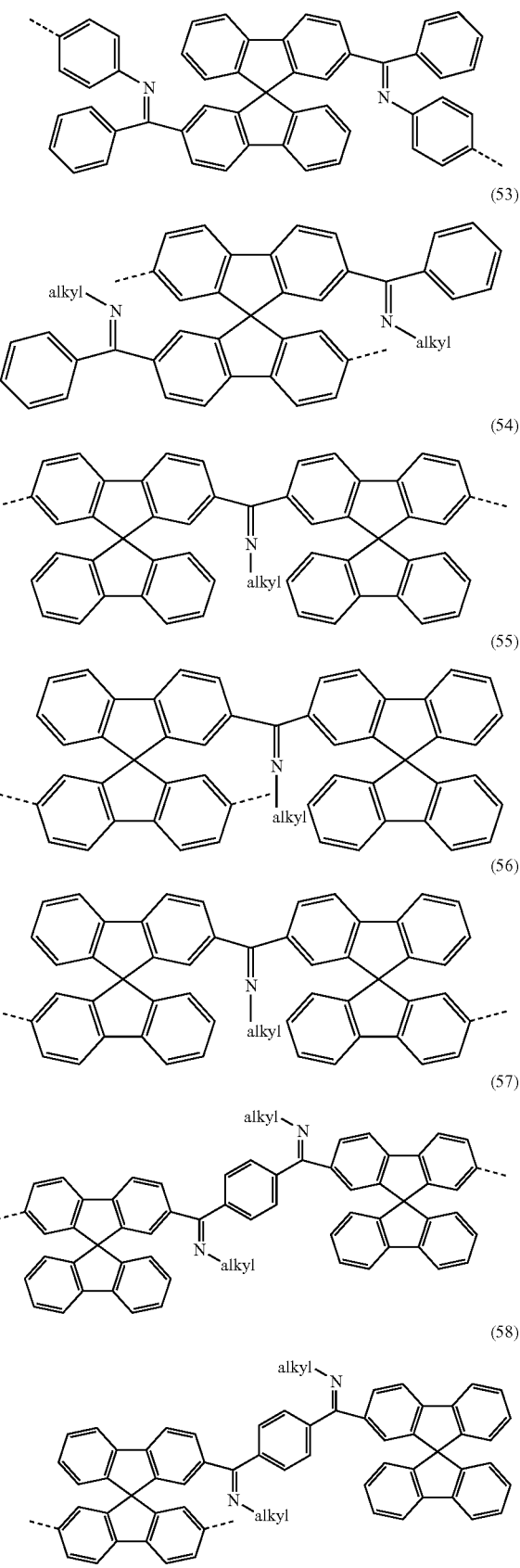

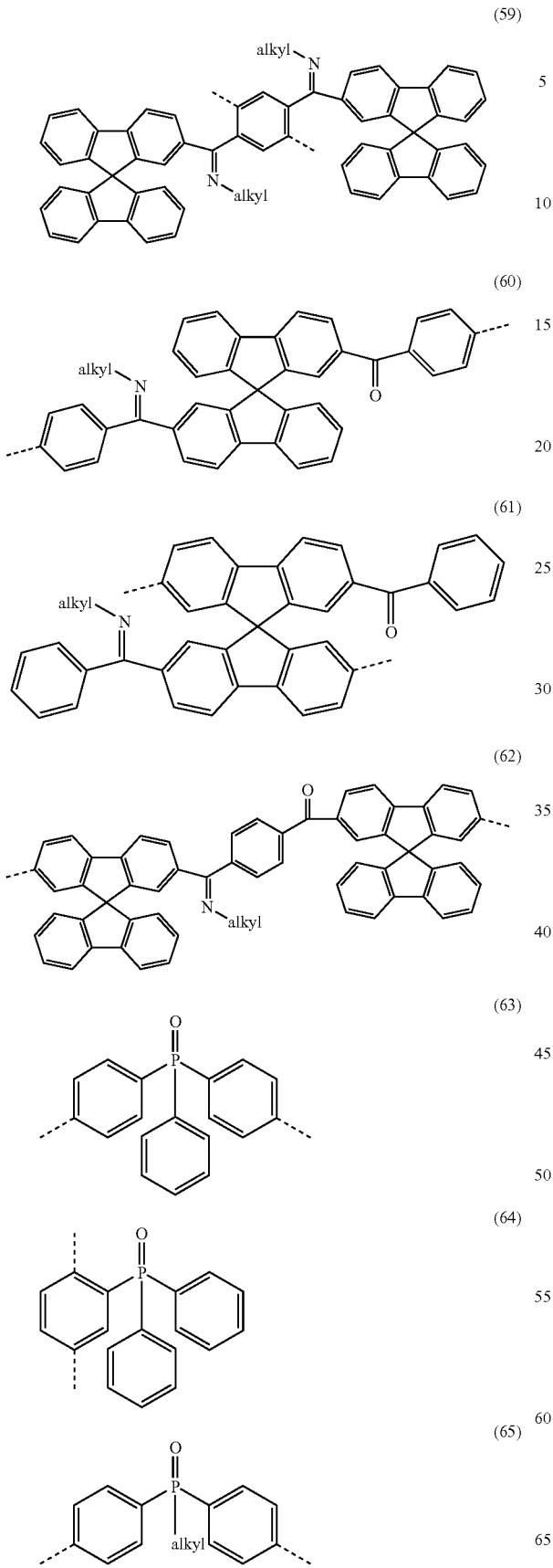
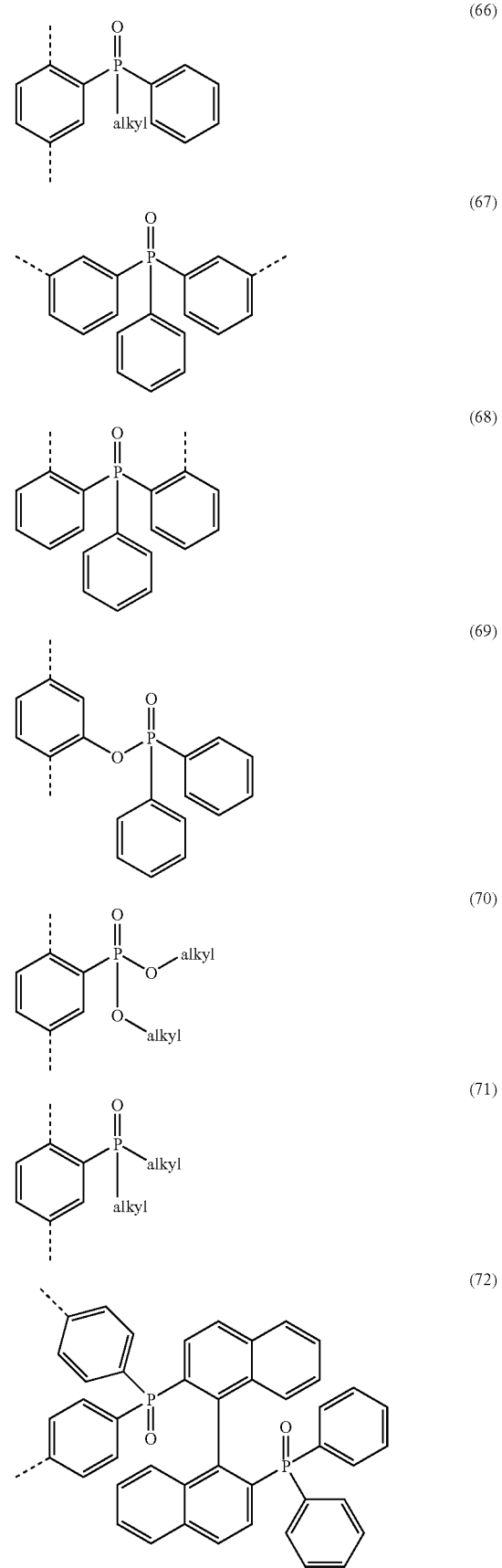

(73) 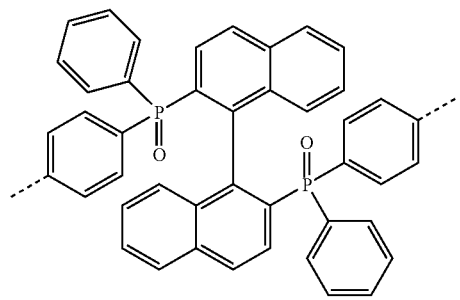
(74) 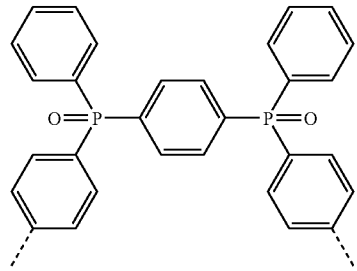
(75) 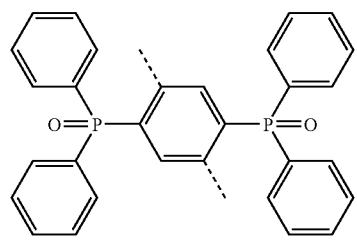
(76) 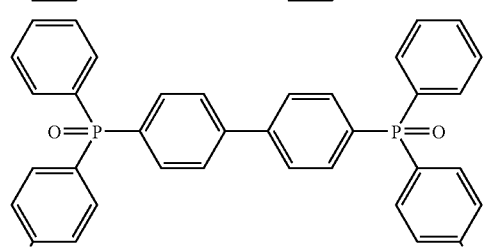
(77) 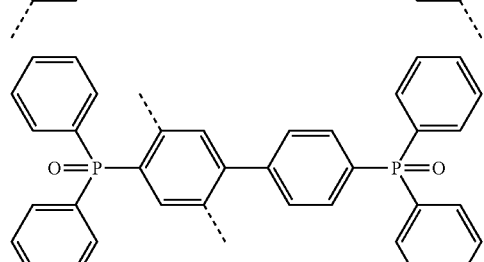
(78) 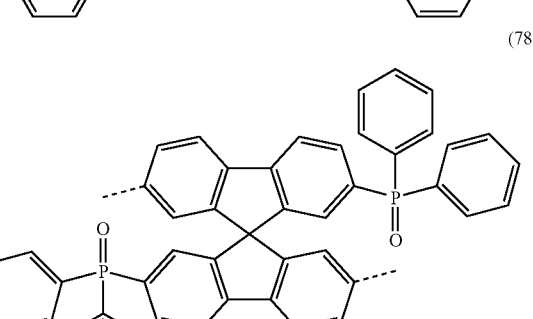
(79) 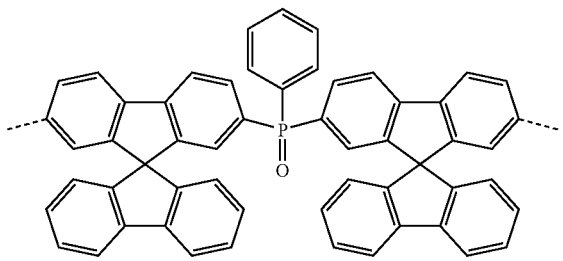
(80) 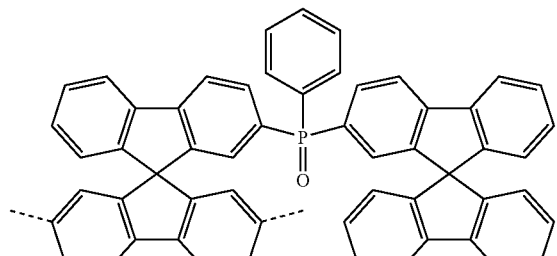
(81) 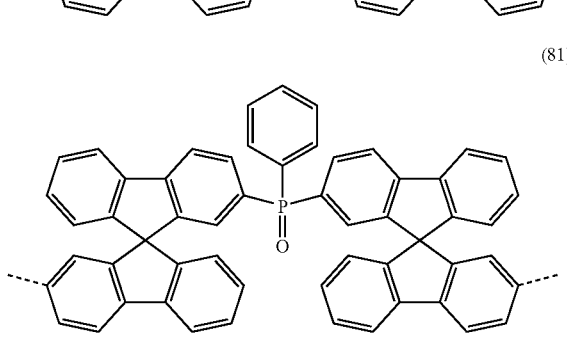
(82) 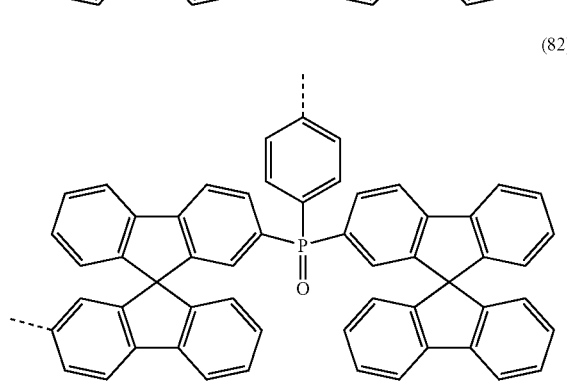
(83) 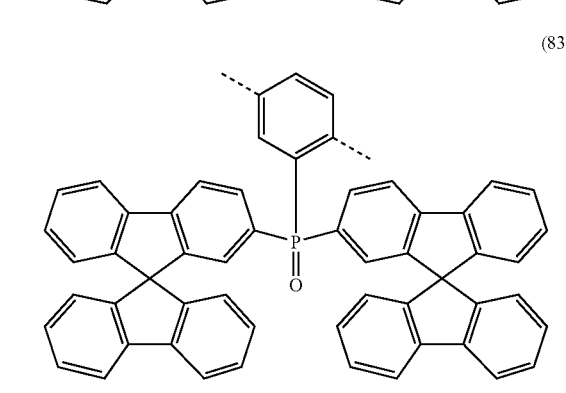

-continued
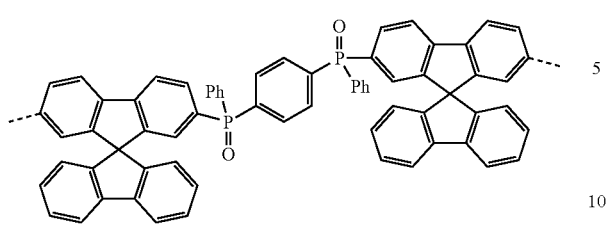
(84)
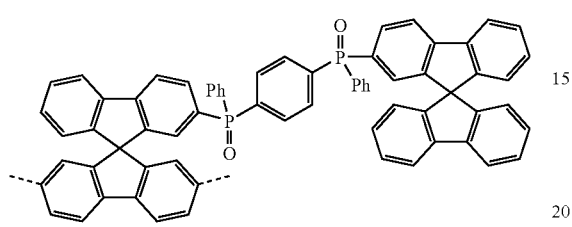
(85)
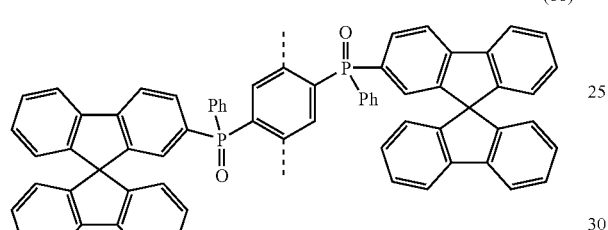
(86)
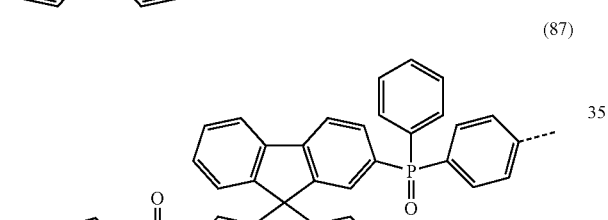
(87)
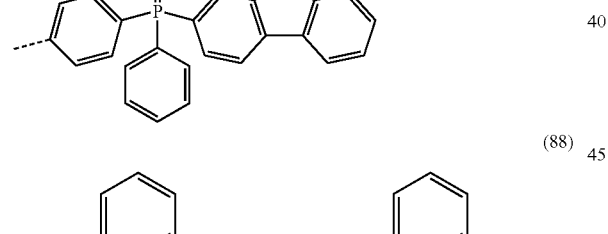
(88)
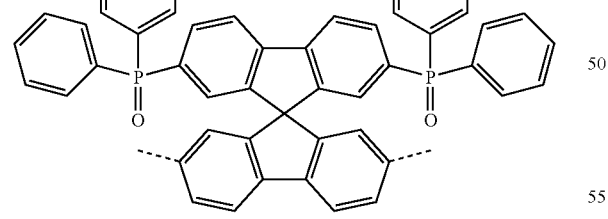
(89)
-continued
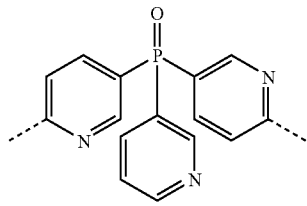
(90)
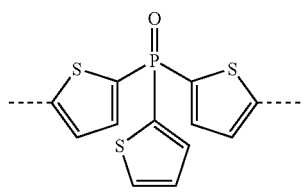
(91)
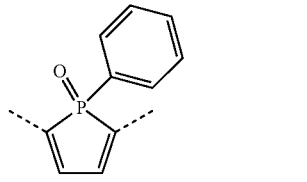
(92)
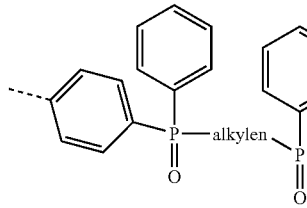
(93)
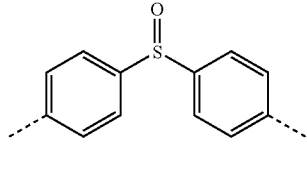
(94)
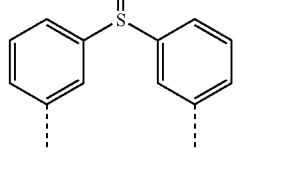
(95)
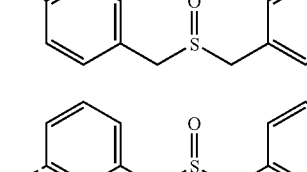
(96)
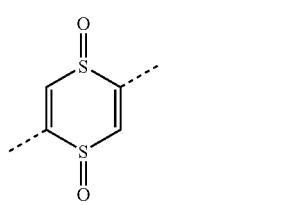
(97)
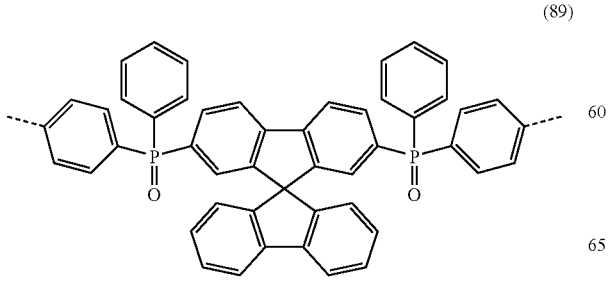
(98)

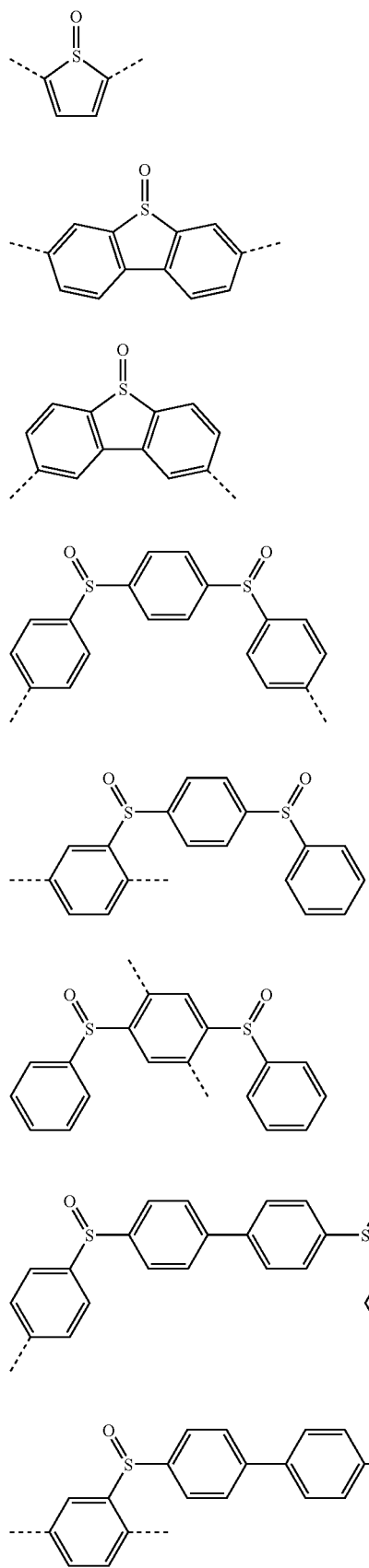
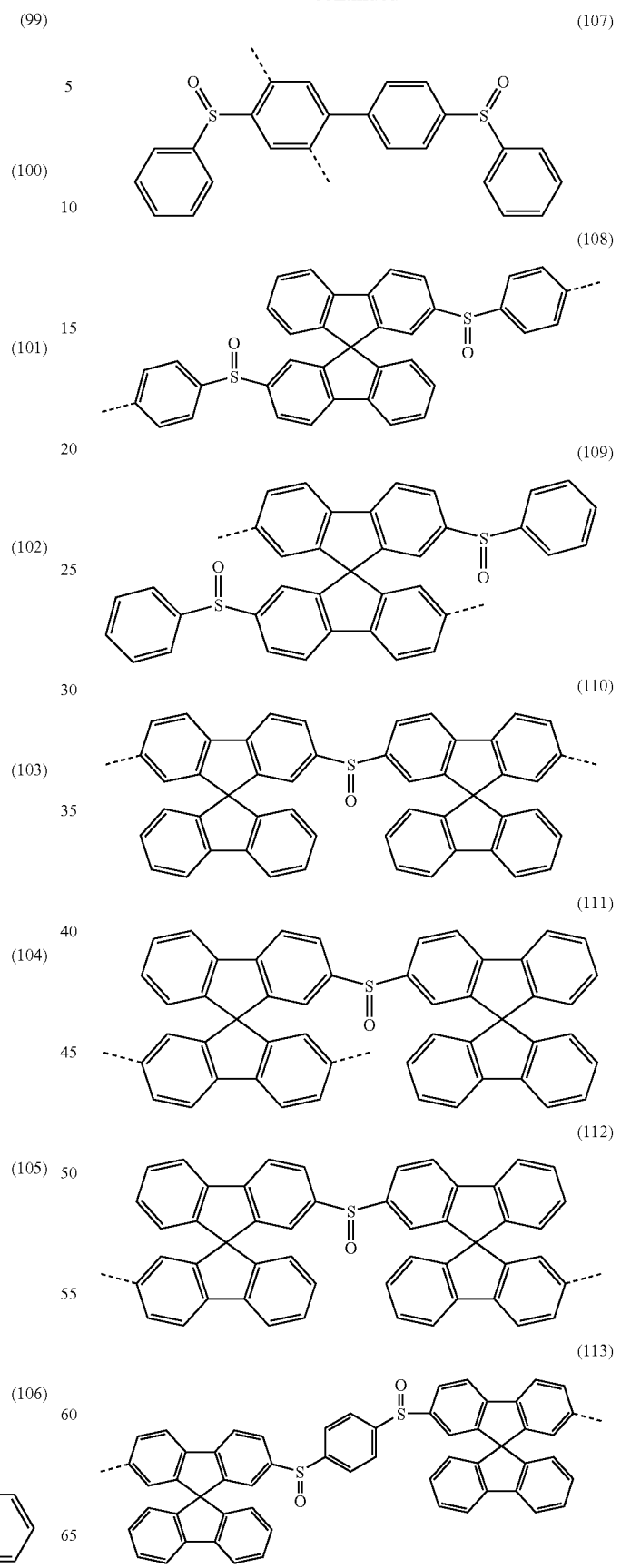

-continued
(114)
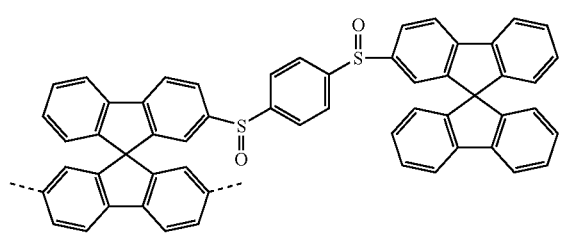
(115)
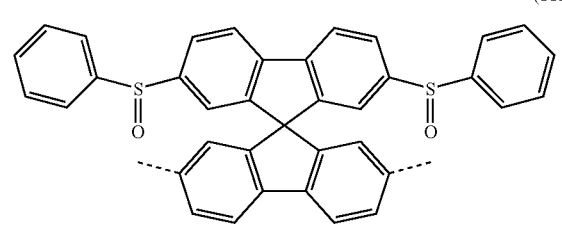
(116)
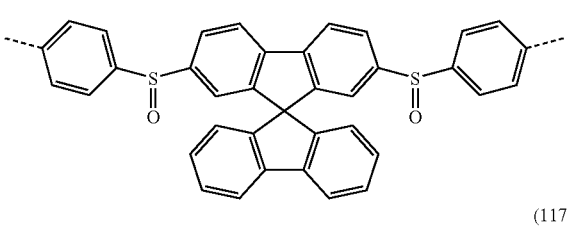
(117)
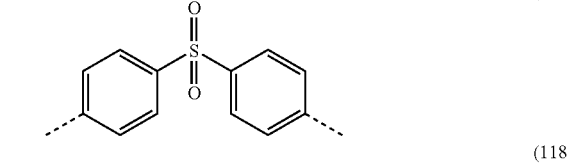
(118)
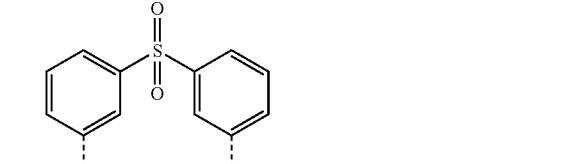
(119)
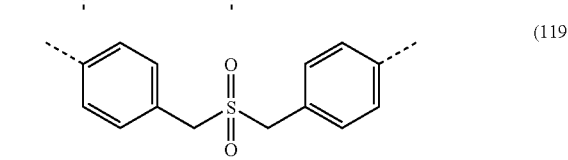
(120)
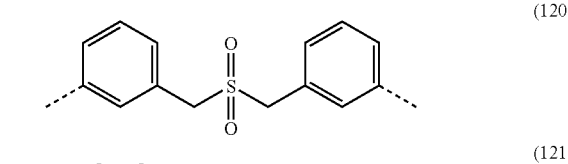
(121)
(122)
-continued
(123)
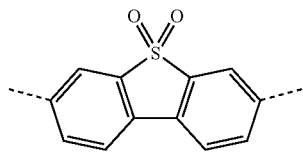
(124)
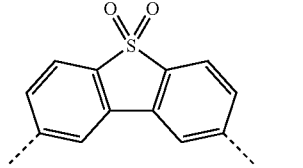
(125)
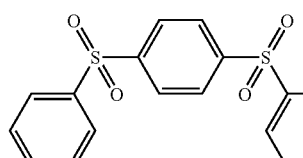
(126)
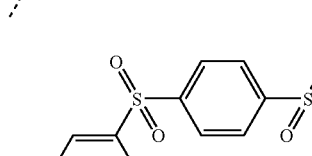
(127)
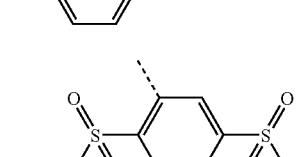
(128)
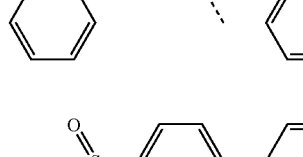
(129)
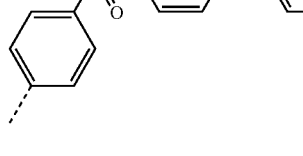
(130)
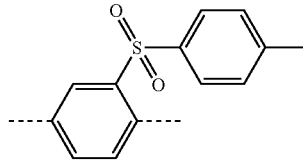

-continued
(131)
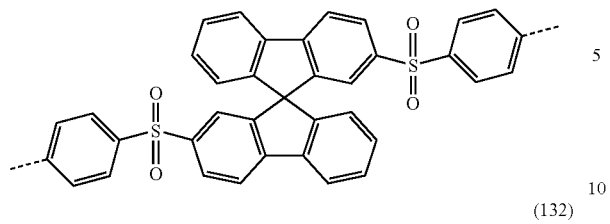
(132)
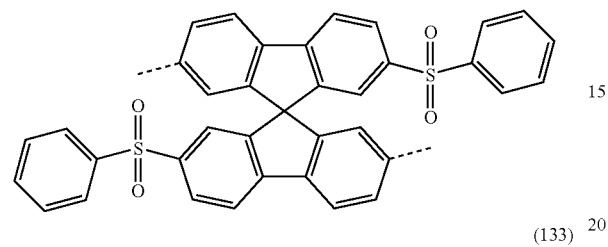
(133)
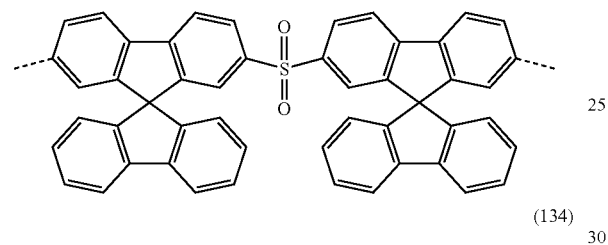
(134)
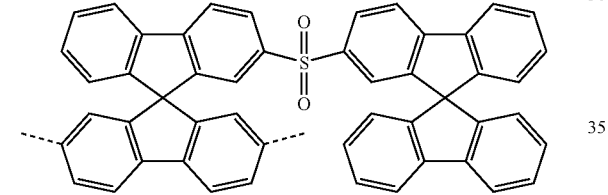
(135)
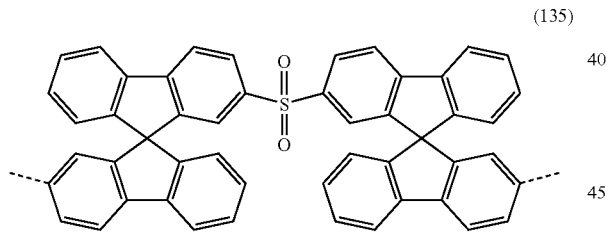
(136)
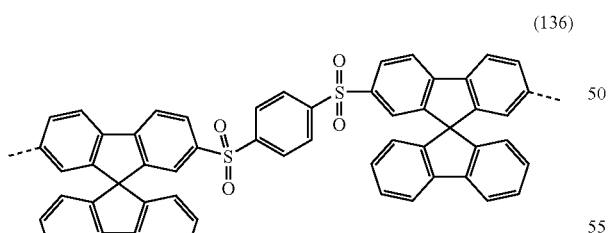
(137)
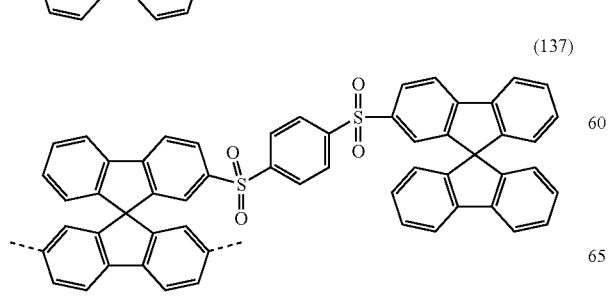
-continued
(138)
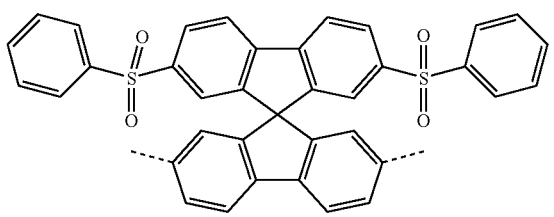
(139)
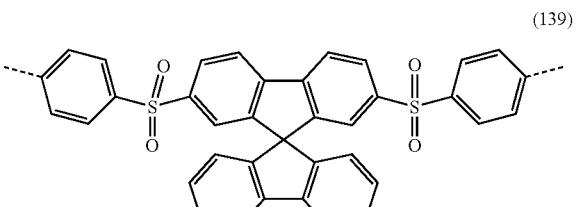
formula (140)
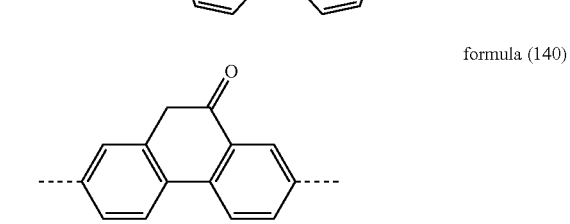
formula (141)
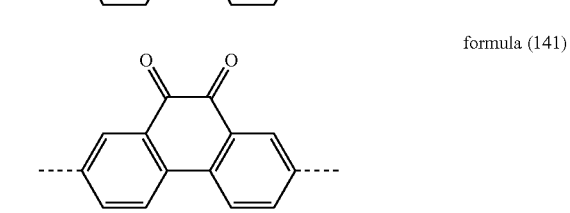
formula (142)
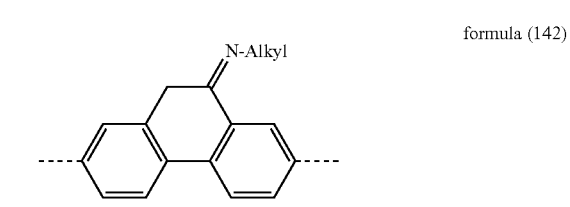
formula (143)
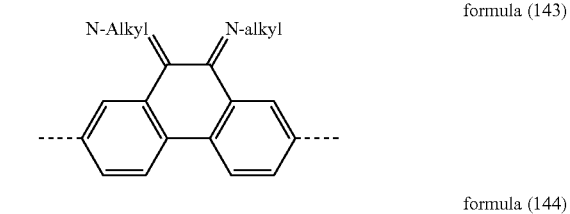
formula (144)
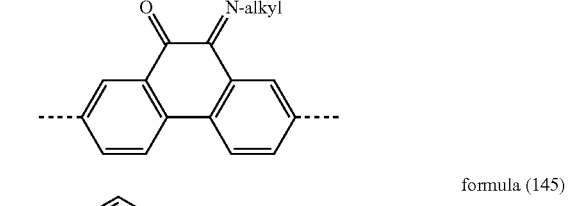
formula (145)

-continued formula (146)
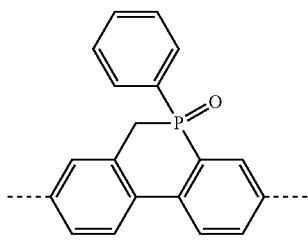

formula (147)
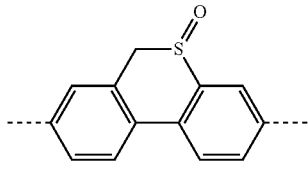

formula (148)
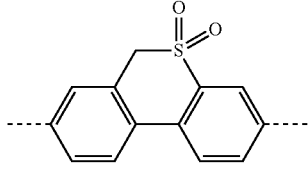

26. A polymer POLY4 comprising
(A) 1-99.9 mol % of one or more recurring units MONO1 containing at least one structural unit L=X
wherein
L is on each occurrence, identically or differently, $(R^1)(R^2)$C, $(R^1)$P, $(R^1)$As, $(R^1)$Sb, $(R^1)$Bi, $(R^1)(R^2)(R^3)$P, $(R^1)(R^2)(R^3)$As, $(R^1)(R^2)(R^3)$Sb, $(R^1)(R^2)(R^3)$Bi, $(R^1)(R^2)$S, $(R^1)(R^2)$Se, $(R^1)(R^2)$Te, $(R^1)(R^2)$S(=O), $(R^1)(R^2)$Se(=O) or $(R^1)(R^2)$Te(=O);

X is on each occurrence, identically or differently, O, S, Se or N—$R^4$, with the proviso that X is not S or Se if L stands for S, Se or Te;

$R^1$, $R^2$, $R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent $CH_2$ groups may be replaced by —$R^6$C=C$R^6$—, —C≡C—, Si$(R^6)_2$, Ge$(R^6)_2$, Sn$(R^6)_2$, C=O, C=S, C=Se, C=N$R^6$, —O—, or —S— and where one or more H atoms are optionally replaced by F, Cl, Br, I, CN or $NO_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6$C=C$R^6$—, —C≡C—, Si$(R^6)_2$, Ge$(R^6)_2$, Sn$(R^6)_2$, —N$R^6$—, —O—, —S—, —CO—O—, —O—CO—O—, where, in addition, one or more H atoms replaced by fluorine, an aryl, heteroaryl or aryloxy group having 1 to 40 C atoms, which is optionally substituted by one or more radicals $R^6$, or OH or $N(R^5)_2$;

$R^5$ is on each occurrence, identically or differently, $R^4$ or CN, $B(R^6)_2$ or $Si(R^6)_3$, $R^6$ is on each occurrence, identically or differently, H or an aliphatic or aromatic hydrocarbon radical having 1 to 20 C atoms;

(B) 0.1-95 mol % of one or more triplet emitters TRIP2.

27. A polymer containing one or more structural units of the formula (1) to (5) and 9,9'-spirobifluorene units formula (1)

formula (2)

formula (3)
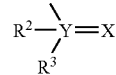

formula (4)

formula (5)

where the symbols used have the following meaning:
X is on each occurrence, identically or differently, O, S, Se or N—$R^4$, with the proviso that X cannot be S or Se for formulae (4) and (5);
Y is on each occurrence, identically or differently, P, As, Sb or Bi;
Z is on each occurrence, identically or differently, S, Se or Te;
$R^1$, $R^2$, $R^3$ is on each occurrence, identically or differently, H, F, CN, a straight-chain, branched or cyclic alkyl, alkoxy or thioalkoxy group having 1 to 40 C atoms, which is optionally substituted by $R^5$ or may also be unsubstituted, where one or more non-adjacent $CH_2$ groups may be replaced by —$R^6$C=C$R^6$—, —C≡C—, Si$(R^6)_2$, Ge$(R^6)_2$, Sn$(R^6)_2$, C=O, C=S, C=Se, C=N$R^6$, —O—, or —S— and where one or more H atoms are optionally replaced by F, Cl, Br, I, CN or $NO_2$, or an aromatic or heteroaromatic ring system having 1 to 40 C atoms, which is optionally substituted by one or more radicals $R^5$, where two or more substituents $R^1$, $R^2$ and/or $R^3$ may also with one another form a mono- or polycyclic, aliphatic or aromatic ring system; all substituents $R^1$ to $R^3$ on one structural unit here must not be H or F; the groups $R^1$ to $R^3$ may furthermore optionally have bonds to the polymer;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6$C=C$R^6$—, —C≡C—, Si$(R^6)_2$, Ge$(R^6)_2$, Sn$(R^6)_2$, —N$R^6$—, —O—, —S—, —CO—O—, —O—CO—O—, where, in addition, one or more H atoms replaced by fluorine, an aryl, heteroaryl or aryloxy group having 1 to 40 C atoms, which is optionally substituted by one or more radicals $R^6$, or OH or $N(R^5)_2$;

$R^5$ is on each occurrence, identically or differently, $R^4$ or CN, $B(R^6)_2$ or $Si(R^6)_3$, $R^6$ is on each occurrence, identically or differently, H or an aliphatic or aromatic hydrocarbon radical having 1 to 20 C atoms.

* * * * *